(12) United States Patent
Kang et al.

(10) Patent No.: US 12,289,940 B2
(45) Date of Patent: Apr. 29, 2025

(54) DISPLAY DEVICE, AND METHOD FOR MANUFACTURING SAME

(71) Applicant: SAMSUNG DISPLAY CO., LTD., Yongin-si (KR)

(72) Inventors: Sin Chul Kang, Yongin-si (KR); Su Mi Moon, Yongin-si (KR); Jae Woong Kang, Yongin-si (KR); Won Sik Oh, Yongin-si (KR); Hyun Min Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 607 days.

(21) Appl. No.: 17/621,479

(22) PCT Filed: Apr. 10, 2020

(86) PCT No.: PCT/KR2020/004944
§ 371 (c)(1),
(2) Date: Dec. 21, 2021

(87) PCT Pub. No.: WO2020/256265
PCT Pub. Date: Dec. 24, 2020

(65) Prior Publication Data
US 2022/0352244 A1     Nov. 3, 2022

(30) Foreign Application Priority Data
Jun. 21, 2019   (KR) .................. 10-2019-0074272

(51) Int. Cl.
*H01L 27/15*     (2006.01)
*H01L 33/00*     (2010.01)
(Continued)

(52) U.S. Cl.
CPC .......... *H10H 29/142* (2025.01); *H10H 20/01* (2025.01); *H10H 20/821* (2025.01); *H10H 20/831* (2025.01); *H10H 20/84* (2025.01)

(58) Field of Classification Search
CPC . H01L 27/156; H01L 27/124; H01L 27/1255; H01L 27/1259; H01L 33/005;
(Continued)

(56) References Cited

U.S. PATENT DOCUMENTS

| | | |
|---|---|---|
| 8,216,440 B2 | 7/2012 | Shibata et al. |
| 10,367,123 B2 | 7/2019 | Im et al. |

(Continued)

FOREIGN PATENT DOCUMENTS

| | | |
|---|---|---|
| CN | 108400149 | 8/2018 |
| CN | 109545130 | 3/2019 |

(Continued)

OTHER PUBLICATIONS

International Search Report, with English translation, corresponding to International Application No. PCT/KR2020/004944 dated Jul. 31, 2020.

(Continued)

*Primary Examiner* — Amar Movva
*Assistant Examiner* — Sandra Milena Rodriguez Villan
(74) *Attorney, Agent, or Firm* — KILE PARK REED & HOUTTEMAN PLLC

(57) ABSTRACT

A display device includes a pixel disposed in a display area; a first line electrically connected to the pixel; and a first control line disposed around the first line. The pixel includes a first electrode and a second electrode spaced apart from each other; at least one intermediate electrode including a first intermediate electrode disposed between the first electrode and the second electrode; light emitting elements electrically connected between a pair of adjacent electrodes (Continued)

among the first electrode, the second electrode, and the at least one intermediate electrode; and a first switching element electrically connected between the first intermediate electrode and the first line, the first switching element being controlled by a signal applied to the first control line.

21 Claims, 32 Drawing Sheets

(51) Int. Cl.
    *H01L 33/24*     (2010.01)
    *H01L 33/38*     (2010.01)
    *H01L 33/44*     (2010.01)
    *H10H 20/01*     (2025.01)
    *H10H 20/821*     (2025.01)
    *H10H 20/831*     (2025.01)
    *H10H 20/84*     (2025.01)
    *H10H 29/14*     (2025.01)

(58) Field of Classification Search
    CPC ......... H01L 33/24; H01L 33/38; H01L 33/44; H01L 33/62; H01L 33/36; H01L 2933/0066; H01L 25/0753; H01L 25/167
    See application file for complete search history.

(56) References Cited

U.S. PATENT DOCUMENTS

| | | | |
|---|---|---|---|
| 10,490,537 B2 | 11/2019 | Bae et al. | |
| 10,784,246 B2 | 9/2020 | Do et al. | |
| 10,803,283 B2 | 10/2020 | Han | |
| 10,879,223 B2 | 12/2020 | Do et al. | |
| 10,886,349 B2 | 1/2021 | Lee et al. | |
| 2011/0007067 A1 | 1/2011 | Ryu et al. | |
| 2011/0089850 A1 | 4/2011 | Shibata et al. | |
| 2015/0116295 A1 | 4/2015 | Pyon | |
| 2018/0019369 A1 | 1/2018 | Cho et al. | |
| 2018/0138157 A1 | 5/2018 | Im et al. | |
| 2019/0088731 A1 | 3/2019 | Lee et al. | |
| 2019/0156733 A1 | 5/2019 | Park et al. | |
| 2019/0355802 A1* | 11/2019 | Shim | H10K 59/131 |

FOREIGN PATENT DOCUMENTS

| | | |
|---|---|---|
| JP | 2008-260073 | 10/2008 |
| JP | 2015-11784 | 1/2015 |
| KR | 10-2011-0041401 | 4/2011 |
| KR | 10-1814104 | 1/2018 |
| KR | 10-1845907 | 4/2018 |
| KR | 10-2018-0055021 | 5/2018 |
| KR | 10-2018-0078813 | 7/2018 |
| KR | 10-2019-0067296 | 6/2019 |

OTHER PUBLICATIONS

Written Opinion, with English translation, corresponding to International Application No. PCT/KR2020/004944, dated Jul. 31, 2020.
Chinese Office Action dated Dec. 18, 2024, in Chinese Patent Application No. 202080045405.0.

* cited by examiner

FIG. 3A
FIG. 3B
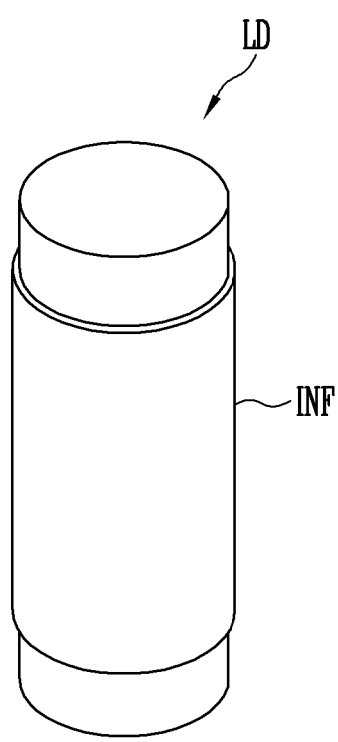
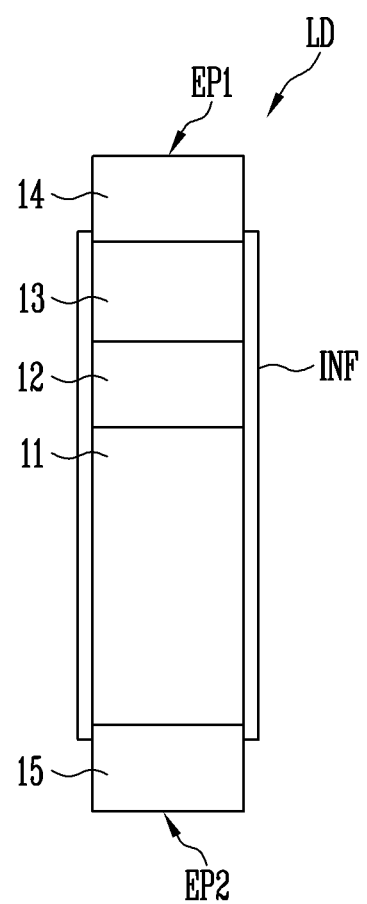

DISPLAY DEVICE, AND METHOD FOR MANUFACTURING SAME

CROSS-REFERENCE TO RELATED APPLICATION(S)

This application is a national entry of International Application No. PCT/KR2020/004944, filed on Apr. 10, 2020, which claims under 35 U.S.C. § 119(a) and 365(b) priority to and benefits of Korean Patent Application No. 10-2019-0074272, filed on Jun. 21, 2019 in the Korean Intellectual Property Office, the entire contents of which are incorporated herein by reference.

BACKGROUND

1. Technical Field

Embodiments relate to a display device and a method of fabricating the same.

2. Description of the Related Art

Recently, a technique of manufacturing a subminiature light emitting element using a material having a reliable inorganic crystal structure and manufacturing a light emitting device using the light emitting element has been developed. For example, a technique of fabricating subminiature light emitting elements each having a small size corresponding to a range from the nanometer scale to the micrometer scale, and forming light sources of various light emitting devices including pixels of display devices using the subminiature light emitting elements, has been developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure provides a display device including light emitting elements and a method of fabricating the same.

A display device may include a pixel disposed in a display area; a first line electrically connected to the pixel; and a first control line disposed around the first line. The pixel may include a first electrode and a second electrode spaced apart from each other; at least one intermediate electrode including a first intermediate electrode disposed between the first electrode and the second electrode; light emitting elements electrically connected between a pair of adjacent electrodes among the first electrode, the second electrode, and the at least one intermediate electrode; and a first switching element electrically connected between the first intermediate electrode and the first line, the first switching element being controlled by a signal applied to the first control line.

In an embodiment, the first switching element may include a first active layer overlapping the first control line and electrically connected between the first intermediate electrode and the first line.

In an embodiment, the display device may further include a second line spaced apart from the first line. The at least one intermediate electrode may include a second intermediate electrode disposed between the first electrode and the first intermediate electrode, and the pixel may include a second switching element electrically connected between the second intermediate electrode and the second line.

In an embodiment, the second line may be disposed around the first control line. The second switching element may include a second active layer overlapping the first control line and electrically connected between the second intermediate electrode and the second line.

In an embodiment, the display device may further include a second control line disposed around the second line. The second switching element may include a second active layer partially overlapping the second control line and electrically connected between the second intermediate electrode and the second line.

In an embodiment, the first line and the first control line may be adjacent to first ends of the first electrode, the second electrode, and the at least one intermediate electrode. The second line and the second control line may be adjacent to second ends of the first electrode, the second electrode, and the at least one intermediate electrode.

In an embodiment, the display device may further include a third line spaced apart from the first line and the second line. The pixel may include a third switching element electrically connected between the first electrode and the third line, the third switching element may be turned on simultaneously with the first switching element.

In an embodiment, the display device may further include a second line spaced apart from the first line. The pixel may include a second switching element electrically connected between the first electrode and the second line.

In an embodiment, the pixel may include a third switching element electrically connected between the first electrode, and the second electrode, to the third switching element may be turned on simultaneously with the first switching element.

In an embodiment, the first electrode, the at least one intermediate electrode, and the second electrode may be disposed successively in a direction in an emission area of the pixel.

In an embodiment, the first line and the first control line may be adjacent to first ends of the first electrode, the at least one intermediate electrode, and the second electrode, and the first line and the first control line each may extend in the direction and is commonly electrically connected to pixels in a horizontal line including the pixel.

In an embodiment, the display area may include pixels each disposed in horizontal lines. A first line and a first control line that may be electrically connected to pixels in any one horizontal line of the horizontal lines may be disposed opposite to a first line and a first control line that may be electrically connected to pixels in a subsequent horizontal line, with the pixels in the any one horizontal line of the horizontal lines and the pixels in the subsequent horizontal line of the horizontal lines interposed therebetween.

In an embodiment, first switching elements included in the pixels in the any one horizontal line of the horizontal lines and first switching elements included in the pixels in the subsequent horizontal line may have symmetrical shapes.

In an embodiment, first electrodes, second electrodes, and intermediate electrodes that are included in the pixels in the any one horizontal line of the horizontal lines, and first electrodes, second electrodes, and intermediate electrodes that are included in the pixels of the subsequent horizontal line of the horizontal lines may have symmetrical shapes.

In an embodiment, the first electrode and the second electrode may be electrically connected to a first power source and a second power source, respectively. The at least one intermediate electrode may be electrically connected between the first electrode and the second electrode through the light emitting elements.

In an embodiment, the pixel may include a pixel circuit electrically connected between the first power source and the first electrode. The display area may include a circuit layer including circuit elements of the pixel circuit; and a display layer that overlaps the circuit layer, and in which the first electrode, the second electrode, the at least one intermediate electrode, and the light emitting elements may be disposed.

In an embodiment, the circuit layer may include at least one of a first power line electrically connected to the first power source, a second power line electrically connected to the second power source, an active layer of the first switching element, the first line, and the first control line.

In an embodiment, the display layer may include at least one of the first line and the first control line.

In an embodiment, the pixel may include at least one of: bank patterns respectively disposed below the first electrode, the second electrode, and the at least one intermediate electrode; and contact electrodes respectively disposed over the first electrode, the second electrode, and the at least one intermediate electrode.

A method of fabricating a display device may include forming a switching element, an alignment line, and electrodes; supplying light emitting elements to an emission area of a pixel among pixels; aligning the light emitting elements between the electrodes by driving the switching element and supplying respective alignment signals to the electrodes; and electrically connecting the light emitting elements between the electrodes.

In accordance with various embodiments, a process of fabricating a display device including light emitting elements may be simplified.

BRIEF DESCRIPTION OF THE DRAWINGS

The above and other aspects and features of the disclosure will become more apparent by describing in detail embodiments thereof with reference to the attached drawings, in which:

FIGS. 3A and 3B are respectively a schematic perspective view and a schematic cross-sectional view illustrating a light emitting element in accordance with an embodiment.

DETAILED DESCRIPTION OF THE EMBODIMENTS

Figure 1A:
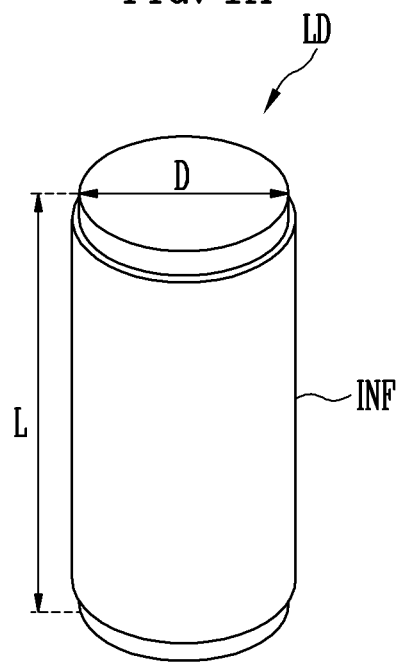
FIGS. 1A and 1B are respectively a schematic perspective view and a schematic cross-sectional view illustrating a light emitting element in accordance with an embodiment.

Reference will now be made in detail to various embodiments, examples of which are illustrated in the accompanying drawings and described below, since embodiments can be variously modified in many different forms. However, the disclosure is not limited to the following embodiments and may be modified into various forms.

Elements that may not directly relate to the features of the disclosure in the drawings may be omitted to clearly explain the disclosure. Furthermore, the sizes, ratios, etc. of some elements in the drawings may be slightly exaggerated. It should be noted that the same reference numerals are used to designate the same or similar elements throughout the drawings, and repetitive explanation may be omitted.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first", "second", etc. may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

It will be further understood that the terms "comprise", "include", "have", etc. and variations thereof when used in this specification, specify the presence of stated features, integers, steps, operations, elements, components, and/or combinations of them but do not preclude the presence or addition of one or more other features, integers, steps, operations, elements, components, and/or combinations thereof.

Furthermore, when a first component or part is disposed on a second component or part, the first component or part may be not only directly on the second component or part but a third component or part or other components or parts may also intervene between them. Furthermore, the term "position", "direction", etc. used in the following description are defined in relative terms, and it should be noted that they may be changed into a reverse position or direction depending on a view angle or direction. Furthermore, a singular form may include a plural form as long as it is not specifically mentioned in a sentence.

For example, the spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It will be understood that in case that an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

In case that an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A, 1B, 2A, 2B, 3A, and 3B are schematic perspective views and schematic cross-sectional views each illustrating a light emitting element LD in accordance with an embodiment. Although FIGS. 1A to 3B illustrate cylindrical rod-type light emitting elements LD, the type and/or shape of the light emitting elements LD in accordance with the disclosure is not limited thereto. For example, the shapes disclosed may also be substantial shapes.

Figure 1B:
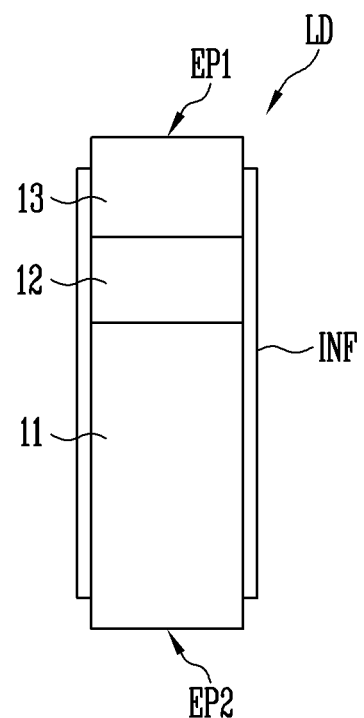

Referring to FIGS. 1A and 1B, a light emitting element LD in accordance with an embodiment may include a first semiconductor layer 11, a second semiconductor layer 13, and an active layer 12 interposed between the first and second semiconductor layers 11 and 13. For example, the light emitting element LD may include the first semiconductor layer 11, the active layer 12, and the second semiconductor layer 13 which may be successively stacked each other in a longitudinal direction.

In an embodiment, the light emitting element LD may be provided in the form of a rod extending in one direction or a direction. If the direction in which the light emitting element LD extends is defined as the longitudinal direction, the light emitting element LD may have a first end EP1 and a second end EP2 with respect to the longitudinal direction. The first and second ends EP1 and EP2 may be areas including surfaces disposed at opposite ends of the light emitting element LD with respect to the longitudinal direction, and may be areas including not only the surfaces of the opposite ends but also areas formed around the surfaces.

In an embodiment, one of the first and second semiconductor layers 11 and 13 may be disposed at the first end EP1 of the light emitting element LD. The other one of the first and second semiconductor layers 11 and 13 may be disposed at the second end EP2 of the light emitting element LD.

In an embodiment, the light emitting element LD may be a rod-type light emitting element (also referred to as "rod-type light emitting diode") fabricated in the form of a rod by an etching scheme or the like within the spirit and the scope of the disclosure. In the description of an embodiment, the term "rod-shape" embraces a rod-like shape and a bar-like shape such as a cylindrical shape and a prismatic shape extending in a longitudinal direction (for example, to have an aspect ratio greater than 1), and the cross-sectional shape thereof is not limited to a particular shape. For example, the length L of the light emitting element LD may be greater than a diameter D thereof (or a width of the cross-section thereof).

In an embodiment, the light emitting element LD may have a small size ranging from the nanometer scale to the micrometer scale. For example, each light emitting element LD may have a diameter D (or a width) and/or a length L ranging from the nanometer scale to the micrometer scale. However, in the disclosure, the size of the light emitting element LD is not limited thereto. For example, the size of the light emitting element LD may be changed in various ways depending on design conditions of various devices, for example, a display device, which employs, as a light source, a light emitting device using a light emitting element LD.

The first semiconductor layer 11 may be formed of a first conductive semiconductor layer. For example, the first semiconductor layer 11 may include at least one N-type semiconductor layer. For instance, the first semiconductor layer 11 may include an N-type semiconductor layer which may include any one semiconductor material of InAlGaN, GaN, AlGaN, InGaN, AlN, and InN and is doped with a first conductive dopant such as Si, Ge, or Sn. However, the constituent material of the first semiconductor layer 11 is not limited thereto, and the first semiconductor layer 11 may be formed of various other materials.

The active layer 12 may be disposed on the first semiconductor layer 11 and have a single or multi-quantum well (MQW) structure. In an embodiment, a cladding layer (not shown) doped with a conductive dopant may be formed over and/or under or below the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

The second semiconductor layer 13 may be disposed on the active layer 12 and be formed of a second conductive semiconductor layer having a type different from that of the first semiconductor layer 11. For example, the second semiconductor layer 13 may include at least one P-type semiconductor layer. For instance, the second semiconductor layer 13 may include a P-type semiconductor layer which may include any one semiconductor material of InAlGaN, GaN, AlGaN, InGaN, AlN, and InN, and is doped with a second conductive dopant such as Mg. However, the material for forming the second semiconductor layer 13 is not limited thereto, and the second semiconductor layer 13 may be formed of various other materials.

In case that a voltage having a voltage or more is applied between the opposite ends (for example, the first and second ends EP1 and EP2) of the light emitting element LD, the light emitting element LD emits light by combination of electron-hole pairs in the active layer 12. Since light emission of the light emitting element LD can be controlled based on the foregoing principle, the light emitting element LD may be used as a light source of various light emitting devices as well as a pixel of the display device.

In an embodiment, the light emitting element LD may further include an insulating film INF provided at the surface of the light emitting element LD. The insulating film INF may be formed at the surface of the light emitting element LD to enclose an outer circumferential surface of at least the active layer 12, and may further enclose areas of the first and second semiconductor layers 11 and 13. Here, the insulating film INF may allow the opposite ends of the light emitting element LD that have different polarities to be exposed to the outside. For example, the insulating film INF may expose the first and second ends EP1 and EP2 that are disposed at the respective opposite ends of the light emitting element LD with respect to the longitudinal direction (for example, may expose the top and bottom surfaces of the light emitting element LD that correspond to two base sides of the cylinder as shown in FIGS. 1A and 1B) rather than covering or overlapping the first and second ends EP1 and EP2.

In an embodiment, the insulating film INF may include at least one insulating material of silicon dioxide ($SiO_2$), silicon nitride ($Si_3N_4$), aluminum oxide ($Al_2O_3$), and titanium dioxide ($TiO_2$), but it is not limited thereto. In other words, the material that forms the insulating film INF is not limited to a particular material, and the insulating film INF may be formed of various insulating materials.

In an embodiment, the light emitting element LD may further include additional other components as well as the first semiconductor layer 11, the active layer 12, the second semiconductor layer 13, and/or the insulating film INF. For example, the light emitting element LD may further include at least one fluorescent layer, at least one active layer, at least one semiconductor layer and/or at least one electrode layer disposed on one end of the first semiconductor layer 11, the active layer 12, and/or the second semiconductor layer 13.

Figure 2A:
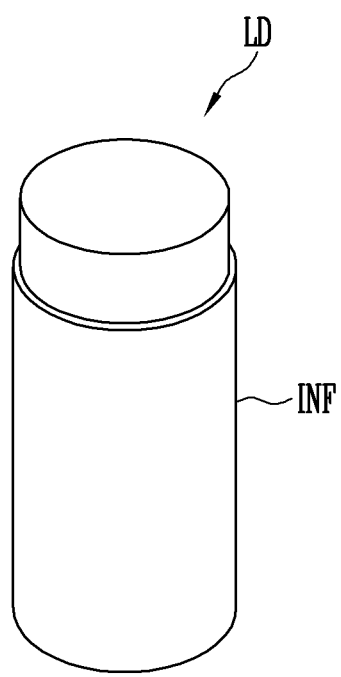
FIGS. 2A and 2B are respectively a schematic perspective view and a schematic cross-sectional view illustrating a light emitting element in accordance with an embodiment.
Figure 2B:
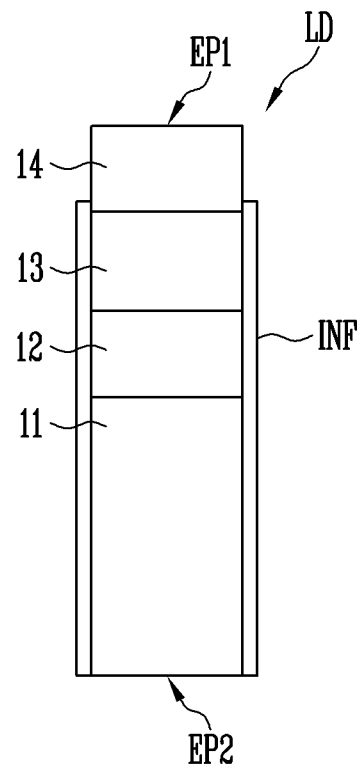

For example, as illustrated in FIGS. 2A and 2B, the light emitting element LD may further include at least one electrode layer 14 disposed on one end of the second semiconductor layer 13. For example, the light emitting element LD may further include an electrode layer 14 disposed at the first end EP1.

In an embodiment, as illustrated in FIGS. 3A and 3B, the light emitting element LD may further include at least one electrode layer 15 disposed on one end of the first semiconductor layer 11. For example, the light emitting element LD may include electrode layers 14 and 15 that are respectively disposed at the first and second ends EP1 and EP2.

Each of the electrode layers 14 and 15 may be a contact electrode to connect each light emitting element LD to other circuit elements, lines, and/or electrodes, etc., but the disclosure is not limited thereto. In an embodiment, each of the electrode layers 14 and 15 may include metal or metal oxide. For example, each of the electrode layers 14 and 15 may be formed of chromium (Cr), titanium (Ti), aluminum (Al), gold (Au), nickel (Ni), oxides or alloys thereof, and/or transparent electrode materials such as indium tin oxide (ITO), indium zinc oxide (IZO), zinc oxide (ZnO), or indium tin zinc oxide (ITZO) alone or in combination. In an embodiment, the electrode layers 14 and 15 may be substantially transparent or translucent. Thereby, light generated from the light emitting element LD may be emitted to the outside after passing through the electrode layers 14 and 15.

The insulating film INF may at least partially enclose the outer circumferential surfaces of the electrode layers 14 and 15, or may not enclose the outer circumferential surfaces thereof. In other words, the insulating film INF may be formed to cover or overlap the surfaces of the electrode layers 14 and 15. Furthermore, the insulating film INF may be formed to expose the opposite ends of the light emitting element LD that have different conductivity types (for example, P-type and N-type, respectively). For example, the insulating film INF may expose at least areas of the electrode layers 14 and 15 at the first and second ends EP1 and EP2 of the light emitting element LD. For example, in an embodiment, the insulating film INF may not be provided in the light emitting element LD.

If the insulating film INF is provided to cover or overlap a surface of the light emitting element LD, for example, an outer circumferential surface of the active layer 12, the active layer 12 may be prevented from short-circuiting with at least one electrode (for example, a first or second electrode of the pixel), which is not shown. Consequently, the electrical stability of the light emitting element LD may be secured. In the description of each embodiment, the term "connection (or coupling)" may comprehensively refer to physical and/or electrical connection (or coupling). Furthermore, the term "connection (or coupling)" may comprehensively refer to direct or indirect connection (or coupling) and integral or non-integral connection (or coupling).

Furthermore, thanks to the insulating film INF formed at the surface of the light emitting element LD, occurrence of a defect on the surface of the light emitting element LD may be minimized, whereby the lifetime and efficiency of the light emitting element LD may be improved. If the insulating film INF is formed at the surface of each light emitting element LD, even in case that light emitting elements LD are disposed adjacent to each other, the light emitting elements LD may be prevented from undesirably short-circuiting.

In an embodiment, a surface treatment process may be performed to fabricate the light emitting element LD. For example, each light emitting element LD may be surface-treated so that, in case that light emitting elements LD are mixed with a fluidic solution (or solvent) and supplied to each emission area (for example, an emission area of each pixel), the light emitting elements LD can be evenly dispersed rather than unevenly aggregating in the solution.

In an unlimited embodiment pertaining to this, the insulating film INF itself may be formed of a hydrophobic film using hydrophobic material, or an additional hydrophobic film formed of the hydrophobic material may be formed on the insulating film INF. In an embodiment, the hydrophobic material may be a material containing fluorine to exhibit hydrophobicity. In an embodiment, the hydrophobic material may be applied to the light emitting elements LD in the form of a self-assembled monolayer (SAM). The hydrophobic material may include octadecyl trichlorosilane, fluoroalkyl trichlorosilane, perfluoroalkyl triethoxysilane, etc. within the spirit and the scope of the disclosure. Furthermore, the hydrophobic material may be a commercially available fluorine containing material such as Teflon™ or Cytop™, or a corresponding material.

The above-described light emitting element LD may be used as a light source in different types of light emitting devices including a pixel of a display device. For instance, at least one subminiature light emitting element LD, for example, subminiature light emitting elements LD each having a size ranging from the nanometer scale to the micrometer scale, may be disposed in each pixel area of the display panel for forming a screen of the display device, and form a light source (or, a light source unit) of the corresponding pixel using the subminiature light emitting elements LD. Furthermore, the field of application of the light emitting element LD according to the disclosure is not limited to a display device. For example, the light emitting element LD may also be used in other types of devices such as a lighting device, which requires a light source.

Figure 4A:
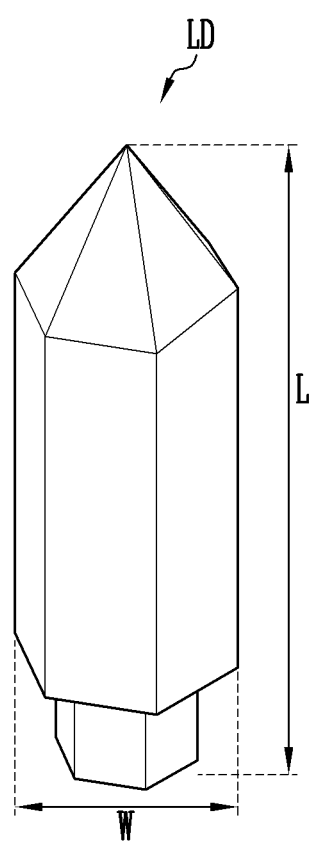
FIGS. 4A and 4B are respectively a schematic perspective view and a schematic cross-sectional view illustrating a light emitting element in accordance with an embodiment.
Figure 4B:
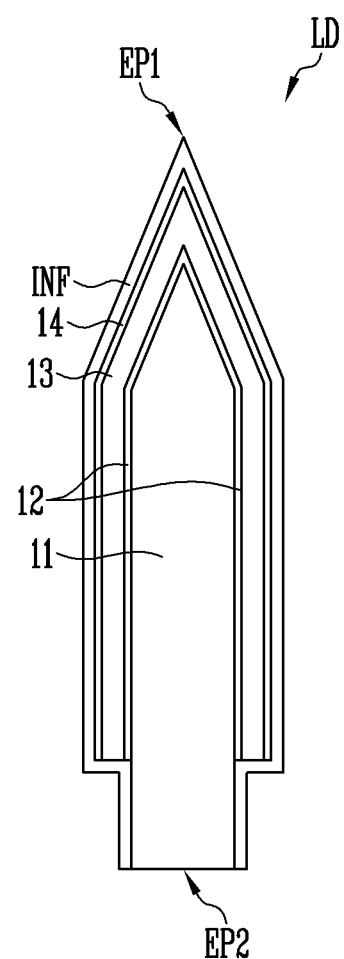

FIGS. 4A and 4B are respectively a schematic perspective view and a schematic cross-sectional view illustrating a light emitting element LD in accordance with an embodiment. According to an embodiment, FIGS. 4A and 4B illustrate a light emitting element LD having a different structure from that of the light emitting element LD shown in FIGS. 1A to 3B, for example, a light emitting element having a core-shell structure. In other words, the type, the structure, and/or the shape of the light emitting element LD in accordance with an embodiment may be changed in various ways. In descriptions of an embodiment of FIGS. 4A and 4B, like reference numerals are used to designate components similar or equal (or corresponding) to those of the embodiments of FIGS. 1A to 3B, and detailed descriptions thereof will be omitted.

Referring to FIGS. 4A and 4B, the light emitting element LD in accordance with an embodiment may include a first semiconductor layer 11, a second semiconductor layer 13, and an active layer 12 interposed between the first and second semiconductor layers 11 and 13. In an embodiment, the first semiconductor layer 11 may be disposed in a central area of the light emitting element LD, and the active layer 12 may be disposed on a surface of the first semiconductor layer 11 to enclose at least one area of the first semiconductor layer 11. The second semiconductor layer 13 may be disposed on a surface of the active layer 12 to enclose at least one area of the active layer 12.

The light emitting element LD may further include an electrode layer 14 to enclose at least one area of the second semiconductor layer 13, and/or an insulating film INF disposed at an outermost surface of the light emitting element LD. For example, the light emitting element LD may further include the electrode layer 14 disposed on a surface of the second semiconductor layer 13 to enclose at least one area of the second semiconductor layer 13, and the insulating film INF disposed on a surface of the electrode layer 14 to enclose at least one area of the electrode layer 14.

In an embodiment, the insulating film INF may be provided at the surface of the light emitting element LD to cover or overlap a portion of the outer circumferential surface of the first semiconductor layer 11 and an outer circumferential surface of the electrode layer 14. The insulating film INF may include transparent insulating material.

In an embodiment, after the insulating film INF is formed to cover or overlap the entirety of the outer circumferential surface of the electrode layer 14 included in the light emitting element LD, the insulating film INF may be partially removed to expose one area of the electrode layer 14 for electrical connection with an electrode, which is not shown, (for example, a first electrode of a pixel).

The light emitting element LD in accordance with the foregoing embodiment may be a core-shell light emitting element (also referred to as "core-shell light emitting diode") fabricated by a growth scheme or the like within the spirit and the scope of the disclosure. For example, the light emitting element LD may have a core-shell structure including the first semiconductor layer 11, the active layer 12, the second semiconductor layer 13, the electrode layer 14, and the insulating film INF that are successively disposed in a direction from the center to the periphery. In an embodiment, the light emitting element LD may not include at least one of the electrode layer 14 and the insulating film INF.

In an embodiment, the light emitting element LD may have a polypyramid shape extending in one direction or a direction. For example, at least one area of the light emitting element LD may have a hexagonal pyramid shape. However, the shape of the light emitting element LD may be changed in various ways.

If the direction in which the light emitting element LD extends is defined as the longitudinal direction, the light emitting element LD may have a first end EP1 and a second end EP2 with respect to the longitudinal direction. In an embodiment, one of the first and second semiconductor layers 11 and 13 (or an electrode layer to enclose any one of the first and second semiconductor layers 11 and 13) is disposed at the first end EP1 of the light emitting element LD. The other one of the first and second semiconductor layers 11 and 13 (or an electrode layer to enclose the other one of the first and second semiconductor layers 11 and 13) may be disposed at the second end EP2 of the light emitting element LD.

In an embodiment, the light emitting element LD may be a light emitting diode, which have a core-shell structure with the first end EP1 protruding in a polypyramid shape (for example, a hexagonal pyramid shape), and have a subminiature size. For example, the light emitting element LD may have a shape corresponding to a combination of a hexagonal pyramid and a hexagonal prism, a small size ranging from the nanometer scale to the micrometer scale, for example, a width W and/or a length L corresponding to the nanometer scale or the micrometer scale. Here, the size and the shape of the light emitting element LD may be changed depending on design conditions of various devices, for example, a display device, which employs the light emitting element LD as a light source.

In an embodiment, the opposite ends of the first semiconductor layer 11 may have shapes protruding in the longitudinal direction of the light emitting element LD. The protruding shapes of the opposite ends of the first semiconductor layer 11 may differ from each other. For example, disposed at an upper position, a first end of the opposite ends of the first semiconductor layer 11 may have a pyramid shape (for example, a hexagonal pyramid shape) the width of which is reduced upward to converge to one apex. Furthermore, disposed at a lower position, a second end of the opposite ends of the first semiconductor layer 11 may have a prismatic shape (for example, a hexagonal prism shape) having a constant width, but the disclosure is not limited thereto. For example, in an embodiment, the first semiconductor layer 11 may have a polygonal or stepped cross-section, the width of which is gradually reduced downward. The shapes of the opposite ends of the first semiconductor layer 11 may be changed in various ways depending on embodiments.

The first semiconductor layer 11 may be disposed in a core of the light emitting element LD, for example, a central (or middle) portion thereof. Furthermore, the light emitting element LD may have a shape corresponding to the shape of the first semiconductor layer 11. For instance, if the first semiconductor layer 11 has a hexagonal pyramid shape at the upper one end thereof, the light emitting element LD may have a hexagonal pyramid shape at an upper one end thereof (for example, the first end EP1).

The active layer 12 may be provided and/or formed in a shape enclosing an outer circumferential surface of the first semiconductor layer 11. For example, the active layer 12 may be provided and/or formed in a shape enclosing an area of the first semiconductor layer 11, other than one end (for example, the lower one end) of the first semiconductor layer 11 with respect to the longitudinal direction of the light emitting element LD.

The second semiconductor layer 13 may be provided and/or formed in a shape enclosing an outer circumferential surface of the active layer 12, and include a semiconductor layer having a type different from that of the first semiconductor layer 11. For example, in the case where the first semiconductor layer 11 may include an N-type semiconductor layer, the second semiconductor layer 13 may include a P-type semiconductor layer.

In an embodiment, the light emitting element LD may further include an electrode layer 14 that encloses an outer circumferential surface of the second semiconductor layer 13. The electrode layer 14 may be a contact electrode electrically connected to the second semiconductor layer 13, but the disclosure is not limited thereto.

As described above, the light emitting element LD may have a core-shell structure with the opposite ends protruding outward, and may include the first semiconductor layer 11 provided in the central portion thereof, the active layer 12 which encloses the first semiconductor layer 11, and the second semiconductor layer 13 which encloses the active layer 12. Furthermore, the light emitting element LD may further include the electrode layer 14 that encloses the second semiconductor layer 13. One end of the electrode layer 14 may be disposed at the first end EP1 of the light emitting element LD, and one end of the first semiconductor layer 11 may be disposed at the second end EP2 of the light emitting element LD.

The above-described light emitting element LD may be used as a light source in different types of light emitting devices including a pixel. For instance, at least one subminiature light emitting element LD, for example, subminiature light emitting elements LD each having a size ranging from the nanometer scale to the micrometer scale, may be disposed in each pixel area of the display panel to form a light source (or, a light source unit) of the corresponding pixel using the subminiature light emitting elements LD.

In an embodiment, each pixel may include at least one rod-type light emitting element LD or at least one core-shell light emitting element LD, or include a combination of the rod-type light emitting element LD and the core-shell light emitting element LD. In an embodiment, each pixel may include other light emitting elements having a type and/or shape different from that of the rod-type light emitting element LD or the core-shell light emitting element LD.

Figure 5:
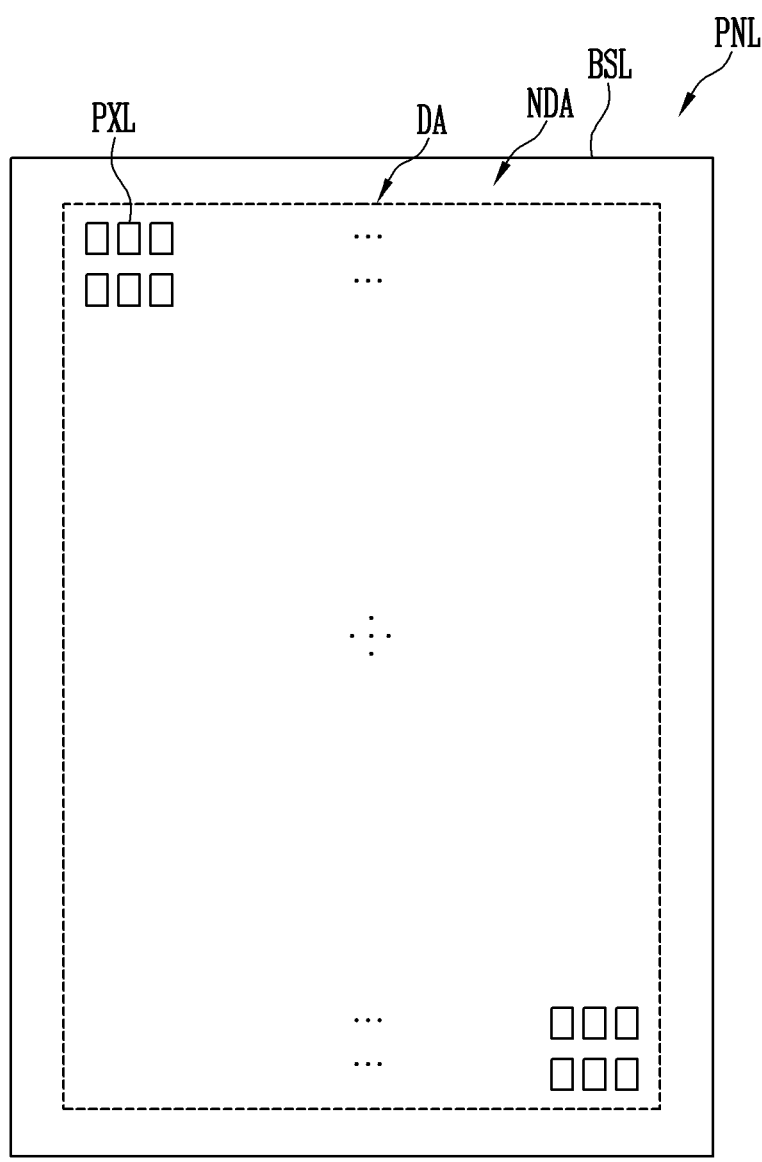
FIG. 5 is a schematic plan view illustrating a display device in accordance with an embodiment.

FIG. 5 is a plan view illustrating a display device in accordance with an embodiment. In an embodiment, FIG. 5 illustrates a display device, for example, a display panel PNL provided in the display device, as an example of an electronic device which may use, as a light source, the light emitting element LD described in the embodiments of FIGS. 1A to 4B. For example, each of the pixels PXL of the display panel PNL may have at least one light emitting element LD.

For the sake of explanation, FIG. 5 simply illustrates the structure of the display panel PNL in accordance with an embodiment, focused on a display area DA. In an embodiment, although not illustrated, at least one driving circuit (for example, at least one of a scan driver and a data driver) and/or lines may be further provided in the display panel PNL.

Referring to FIG. 5, the display panel PNL in accordance with an embodiment may include a base layer BSL, and pixels PXL disposed on the base layer BSL. In an embodiment, each pixel PXL may be a first color pixel to emit light having a first color (for example, red), a second color pixel to emit light having a second color (for example, green), and a third color pixel to emit light having a third color (for example, blue). The type and/or arrangement structure of the pixels PXL may be changed in various ways depending on embodiments.

The display panel PNL and the base layer BSL for forming the display panel PNL may include a display area DA for displaying an image, and a non-display area NDA other than the display area DA. The pixels PXL may be disposed in the display area DA on the base layer BSL.

In an embodiment, the display area DA may be disposed in a central area of the display panel PNL, and the non-display area NDA may be disposed in a peripheral area of the display panel PNL in such a way as to enclose the display area DA. The locations of the display area DA and the non-display area NDA are not limited thereto, and the locations thereof may be changed. The display area DA may form a screen on which an image is displayed.

The base layer BSL may form a base of the display panel PNL. In an embodiment, the base layer BSL may be a rigid or flexible substrate or film, and the material or properties thereof are not particularly limited. For example, the base layer BSL may be a rigid substrate made of glass or reinforced glass, a flexible substrate (or a thin film) formed of plastic or metal, or at least one insulating layer, and the material and/or properties thereof are not particularly limited.

Furthermore, the base layer BSL may be transparent, but the disclosure is not limited thereto. For instance, the base layer BSL may be a transparent, translucent, opaque, or reflective base.

One area on the base layer BSL may be defined as the display area DA in which the pixels PXL are disposed, and the other area thereof may be defined as the non-display area NDA. For example, the base layer BSL may include the display area DA including pixel areas in which the respective pixels PXL are formed, and the non-display area NDA disposed around the display area DA. Various lines and/or internal circuits which are connected to the pixels PXL of the display area DA may be disposed in the non-display area NDA.

Pixels PXL may be dispersed and disposed in the display area DA. For example, the pixels PXL may be regularly arranged or disposed in the display area DA in a stripe or PENTILE™ arrangement manner or the like within the spirit and the scope of the disclosure. The arrangement structure of the pixels PXL is not limited thereto, and the pixels PXL may be arranged or disposed in the display area DA in various structures and/or schemes.

Each pixel PXL may include at least one light source which is driven by a control signal (for example, a scan signal and a data signal) and/or a power source (for example, a first power source and a second power source). In an embodiment, each pixel PXL may include at least one light emitting element LD in accordance with any one of the embodiments of FIGS. 1A to 3B, for example, at least one subminiature rod-type light emitting element LD fabricated through an etching scheme to have a small size corresponding to the nanometer scale or the micrometer scale. In an embodiment, each pixel PXL may include at least one light emitting element LD in accordance with the embodiment of FIGS. 4A and 4B, for example, at least one subminiature core-shell light emitting element LD fabricated through a growth scheme to have a small size corresponding to the nanometer scale or the micrometer scale. Different types of light emitting elements LD may be used as a light source of the pixel PXL.

In an embodiment, each pixel PXL may be formed of an active pixel. However, the types, structures, and/or driving schemes of the pixels PXL capable of being applied to the display device according to the disclosure are not particularly limited. For example, each pixel PXL may have a same structure as that of a pixel for passive or active light emitting display devices which have various structures and/or may be operated in various driving schemes.

FIGS. 6A to 6G are schematic diagrams of equivalent circuits each illustrating a pixel PXL in accordance with an embodiment. For example, FIGS. 6A to 6G illustrate different embodiments of the pixel PXL which can be applied to an active display device. However, the types of pixels PXL and display devices to which embodiments may be applied are not limited thereto. In an embodiment, each pixel PXL illustrated in FIGS. 6A to 6G may be any one of the pixels PXL provided in the display panel PNL of FIG. 5. The pixels PXL may have substantially a same or similar structure.

Figure 6A:
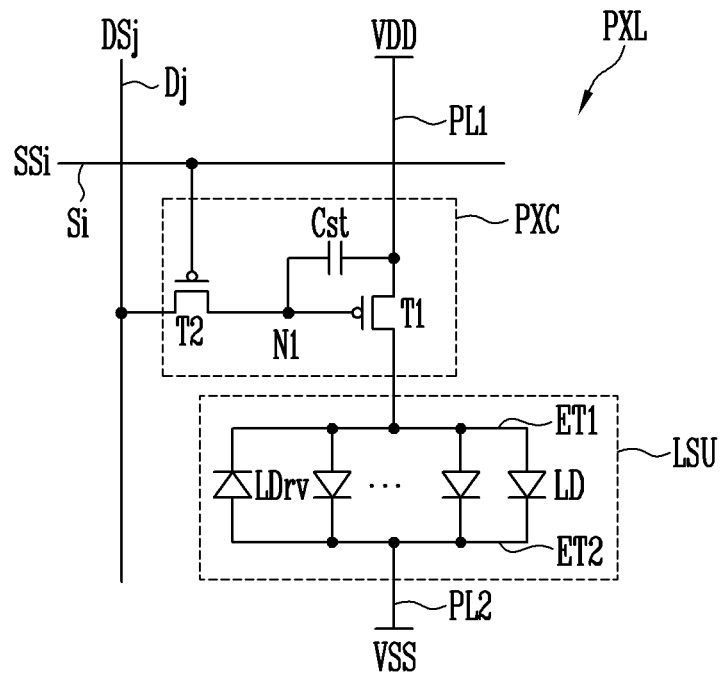
FIGS. 6A to 6G are schematic diagrams of equivalent circuits each illustrating a pixel in accordance with an embodiment.

Referring to FIG. 6A, the pixel PXL in accordance with an embodiment may include a light source unit LSU to generate light having a luminance corresponding to a data signal. The pixel PXL may further include a pixel circuit PXC to drive the light source unit LSU.

In an embodiment, the light source unit LSU may include at least one light emitting element LD, for example, light emitting elements LD, connected between the first power source (or first power supply) VDD and the second power source (or second power supply) VSS. For example, the light source unit LSU may include a first electrode ET (also referred to as "first pixel electrode") connected to the first power source VDD via the pixel circuit PXC and the first power line PL1, a second electrode ET2 connected to the second power source VSS through the second power line PL2, and light emitting elements LD connected in parallel to each other in an identical direction between the first and second electrodes ET1 and ET2. In an embodiment, the first electrode ET1 may be an anode electrode, and the second electrode ET2 may be a cathode electrode.

In an embodiment, each of the light emitting elements LD may include a first end (for example, a P-type end) connected to the first power source VDD through the first electrode ET1 and/or the pixel circuit PXC, and a second end (for example, an N-type end) connected to the second power source VSS through the second electrode ET2. In an embodiment, the light emitting elements LD may be connected in parallel between the first electrode ET1 and the second electrode ET2 in a forward direction. As such, each of the light emitting elements LD connected in the forward direction between the first power source VDD and the second power source VSS may form a valid light source. A group of valid light sources may form the light source unit LSU of the pixel PXL.

In an embodiment, the first and second power sources VDD and VSS may have different potentials to make it possible for the light emitting elements LD to emit light. For example, the first power source VDD may be set as a high-potential power source, and the second power source VSS may be set as a low-potential power source. Here, a difference in potential between the first and second power sources VDD and VSS may be set to a threshold voltage of the light emitting elements LD or more during at least an emission period of the pixel PXL.

In an embodiment, one ends (for example, the first ends) of the light emitting elements LD that form each light source unit LSU may be connected in common to the pixel circuit PXC through one electrode of the light source unit LSU (for example, the first electrode ET1 (referred also as to "first pixel electrode" or "first alignment electrode") of each pixel PXL), and be connected to the first power source VDD through the pixel circuit PXC and the first power line PL1. The other ends (for example, the second ends) of the light emitting elements LD may be connected in common to the second power source VSS through another electrode of the light source unit LSU (for example, a second electrode ET2 (referred also as to "second pixel electrode" or "second alignment electrode") of each pixel PXL) and the second power line PL2.

The light emitting elements LD of the light source unit LSU may emit light having a luminance corresponding to driving current supplied thereto through the pixel circuit PXC. For example, during each frame period, the pixel circuit PXC may supply, to the light source unit LSU, driving current corresponding to a gray scale value of data of the corresponding frame. The driving current supplied to the light source unit LSU may be divided into parts that flow to the light emitting elements LD connected in the forward direction. Hence, each of the light emitting elements LD may emit light having a luminance corresponding to current applied thereto, so that the light source unit LSU may emit light having a luminance corresponding to the driving current.

In an embodiment, the light source unit LSU may further include at least one invalid light source, as well as including the light emitting elements LD that form each valid light source. For example, at least one reverse light emitting element LDrv may be further connected between the first and second electrodes ET1 and ET2 of the light source unit LSU.

Each reverse light emitting element LDrv, along with the light emitting elements LD that form the valid light sources, may be connected in parallel to each other between the first and second electrodes ET1 and ET2, and may be connected between the first and second electrodes ET1 and ET2 in a direction opposite to that of the light emitting elements LD. For example, a second end (for example, an N-type end) of the reverse light emitting element LDrv may be connected to the first power source VDD via the first electrode ET1 and the pixel circuit PXC. A first end (for example, a P-type end) of the reverse light emitting element LDrv may be connected to the second power source VSS via the second electrode ET2. Even in case that a driving voltage (for example, a forward directional driving voltage) is applied between the first and second electrodes ET1 and ET2, the reverse light emitting element LDrv remains deactivated. Hence, current substantially does not flow through the reverse light emitting element LDrv.

The pixel circuit PXC may be connected to a scan line Si and a data line Dj of the corresponding pixel PXL. For example, if the pixel PXL is disposed on an i-th (i is a natural number) horizontal line (row) and a j-th (j is a natural number) vertical line (column) of the display area DA, the pixel circuit PXC of the pixel PXL may be connected to an i-th scan line Si and a j-th data line Dj of the display area DA. In an embodiment, the pixel circuit PXC may include first and second transistors T1 and T2, and a storage capacitor Cst.

The first transistor T1 (also referred to as "the driving transistor of the pixel PXL") may be connected between the first power source VDD and the light source unit LSU. A gate electrode of the first transistor T1 may be connected to a first node N1. The first transistor T1 may control driving current to be supplied to the light source unit LSU in response to the voltage of the first node N1.

The second transistor T2 may be connected between the data line Dj and the first node N1. A gate electrode of the second transistor T2 may be connected to the scan line Si. In case that a scan signal having a gate-on voltage (for example, a low level voltage) is supplied from the scan line Si, the second transistor T2 may be turned on to electrically connect the first node N1 to the data line Dj.

During each frame period, a data signal DSj of a corresponding frame is supplied to the data line Dj, and the data signal DSj is transmitted to the first node N1 through the second transistor T2 that is turned on during a period in which the scan signal SSi having the gate-on voltage is supplied. Thereby, a voltage corresponding to the data signal DSj is charged to the storage capacitor Cst.

One electrode of the storage capacitor Cst may be connected to the first power source VDD, and the other electrode thereof may be connected to the first node N1. The storage capacitor Cst may be charged with a voltage corresponding to a data signal DSj to be supplied to the first node N1 during each frame period.

Although in FIG. 6A the transistors, for example, the first and second transistors T1 and T2, included in the pixel circuit PXC have been illustrated as being formed of P-type transistors, the disclosure is not limited thereto. In other words, at least one of the first and second transistors T1 and T2 may be changed to an N-type transistor.

Figure 6B:
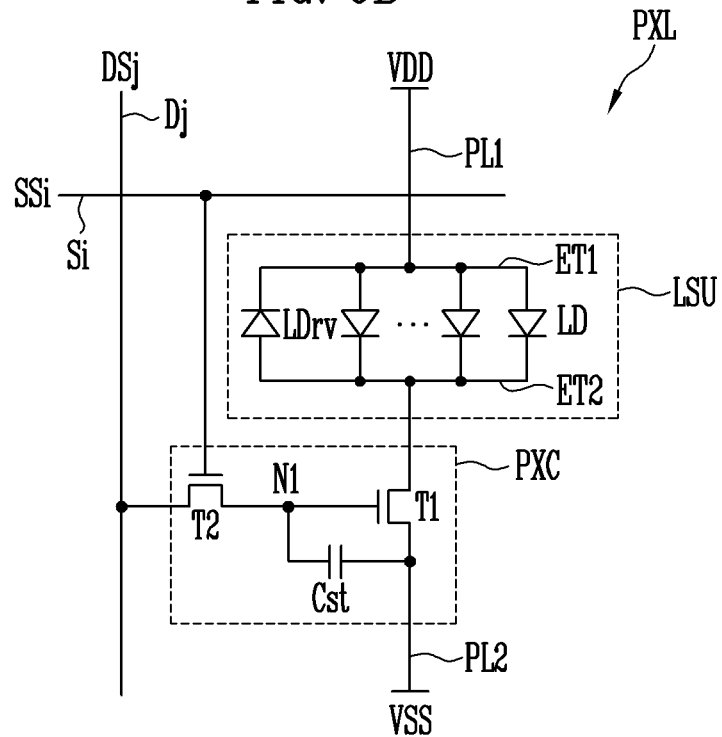

For example, as shown in FIG. 6B, both the first and second transistors T1 and T2 may be formed of N-type transistors. The gate-on voltage of the scan signal SSi for writing the data signal DSj supplied to the data line Dj in each frame period to the pixel PXL may be a high level voltage (also referred to as "gate-high voltage"). Likewise, the voltage of the data signal DSj for turning on the first transistor T1 may be a voltage having a level opposite to that of the embodiment of FIG. 6A. For example, in the embodiment of FIG. 6B, as a gray scale value that is to be expressed increases, a data signal DSj having a higher voltage may be supplied. In an embodiment, the first and second transistors T1 and T2 may be different conductive transistors. For example, one of the first and second transistors T1 and T2 may be a P-type transistor, and the other one may be an N-type transistor.

In an embodiment, an interconnection position between the pixel circuit PXC and the light source unit LSU may be changed. For example, as illustrated in FIG. 6B, in case that both the first and second transistors T1 and T2 that form the pixel circuit PXC are N-type transistors, the pixel circuit PXC may be connected between the light source unit LSU and the second power source VSS, and the storage capacitor Cst may be connected between the first node N1 and the second power source VSS. However, the disclosure is not limited thereto. For example, in an embodiment, even in case that the pixel circuit PXC is formed of N-type transistors, the pixel circuit PXC may be connected between the first power source VDD and the light source unit LSU. Likewise, even in case that the pixel circuit PXC is formed of N-type transistors, the storage capacitor Cst may be connected between the first node N1 and the first power source VDD.

The pixel PXL shown in FIG. 6B is substantially similar in configuration and operation to the pixel PXL of FIG. 6A, except that the connection positions of some or a number of circuit elements and the voltage levels of control signals (for example, a scan signal SSi and a data signal DSj) are changed depending on a change in type of the first and second transistors T1 and T2. Therefore, detailed description of the pixel PXL of FIG. 6B will be omitted.

The structure of the pixel circuit PXC is not limited to the embodiments shown in FIGS. 6A and 6B. For example, the configuration of the pixel circuit PXC may be similar to that of embodiments illustrated in FIGS. 6C and 6D. In other words, the pixel circuit PXC may be formed of a pixel circuit which may have various structures and/or be operated by various driving schemes.

Figure 6C:
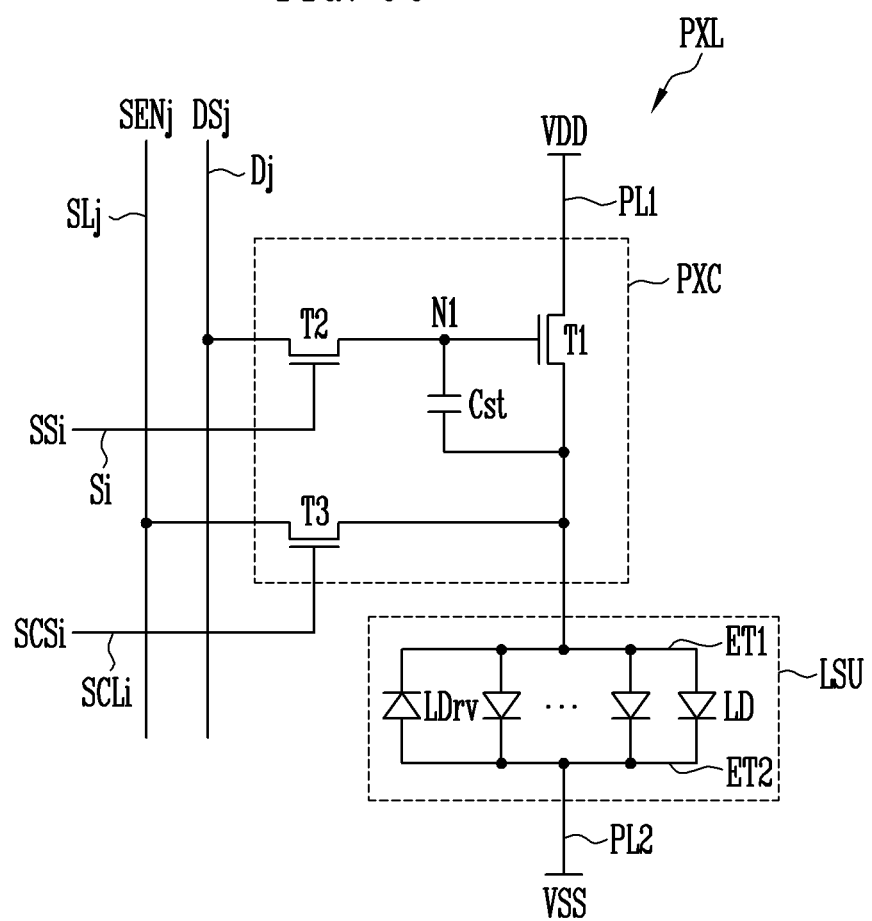

Referring to FIG. 6C, the pixel circuit PXC may be further connected to a sensing control line SCLi and a sensing line SLj. For example, the pixel circuit PXC of the pixel PXL disposed on the i-th horizontal line and the j-th vertical line of the display area DA may be connected to an i-th sensing control line SCLi and a j-th sensing line SLj of the display area DA. The pixel circuit PXC may further include a third transistor T3. In an embodiment, the sensing line SLj may be omitted, and characteristics of the pixel PXL may be detected by detecting a sensing signal SENj through the data line Dj. The third transistor T3 may be connected to the data line Dj.

The third transistor T3 may be connected between the first transistor T1 and the sensing line SLj. For example, a first electrode of the third transistor T3 may be connected to one electrode (for example, a source electrode) of the first transistor T1 connected to the first electrode ET1, and a second electrode of the third transistor T3 may be connected to the sensing line SLj. In the case where the sensing line SLj is omitted, the second electrode of the third transistor T3 may be connected to the data line Dj.

In an embodiment, a gate electrode of the third transistor T3 may be connected to the sensing control line SCLi. In the case where the sensing control line SCLi is omitted, the gate electrode of the third transistor T3 may be connected to the scan line Si. The third transistor T3 may be turned on by a sensing control signal SCSi having a gate-on voltage (for example, a high level voltage) supplied to the sensing control line SCLi during a sensing period, and thus electrically connect the sensing line SLj with the first transistor T1.

In an embodiment, the sensing period may be a period in which characteristics of each of the pixels PXL disposed in the display area DA (for example, a threshold voltage, etc. of the first transistor T1) are extracted. During the sensing period, the first transistor T1 may be turned on by supplying a reference voltage capable of turning on the first transistor T1 to the first node N1 through the data line Dj and the second transistor T2, or connecting each pixel PXL to a current source or the like within the spirit and the scope of the disclosure. Furthermore, the third transistor T3 may be turned on by supplying a sensing control signal SCSi having a gate-on voltage to the third transistor T3, so that the first transistor T1 can be connected to the sensing line SLj. Thereafter, a sensing signal SENj may be obtained through the sensing line SLj, and characteristics of each pixel PXL including the threshold voltage, etc. of the first transistor T1 may be detected using the sensing signal SENj. Information about the characteristics of each pixel PXL may be used to convert image data such that a deviation in characteristic between pixels PXL disposed in the display area DA can be compensated for.

Although FIG. 6C illustrates an embodiment where all of the first, second, and third transistors T1, T2, and T3 are N-type transistors, the disclosure is not limited thereto. For example, at least one of the first, second, and third transistors T1, T2, and T3 may be changed to a P-type transistor. Furthermore, although FIG. 6C illustrates an embodiment in which the light source unit LSU may be connected between the pixel circuit PXC and the second power source VSS, the disclosure is not limited thereto. For example, in an embodiment, the light source unit LSU may be connected between the first power source VDD and the pixel circuit PXC.

Figure 6D:
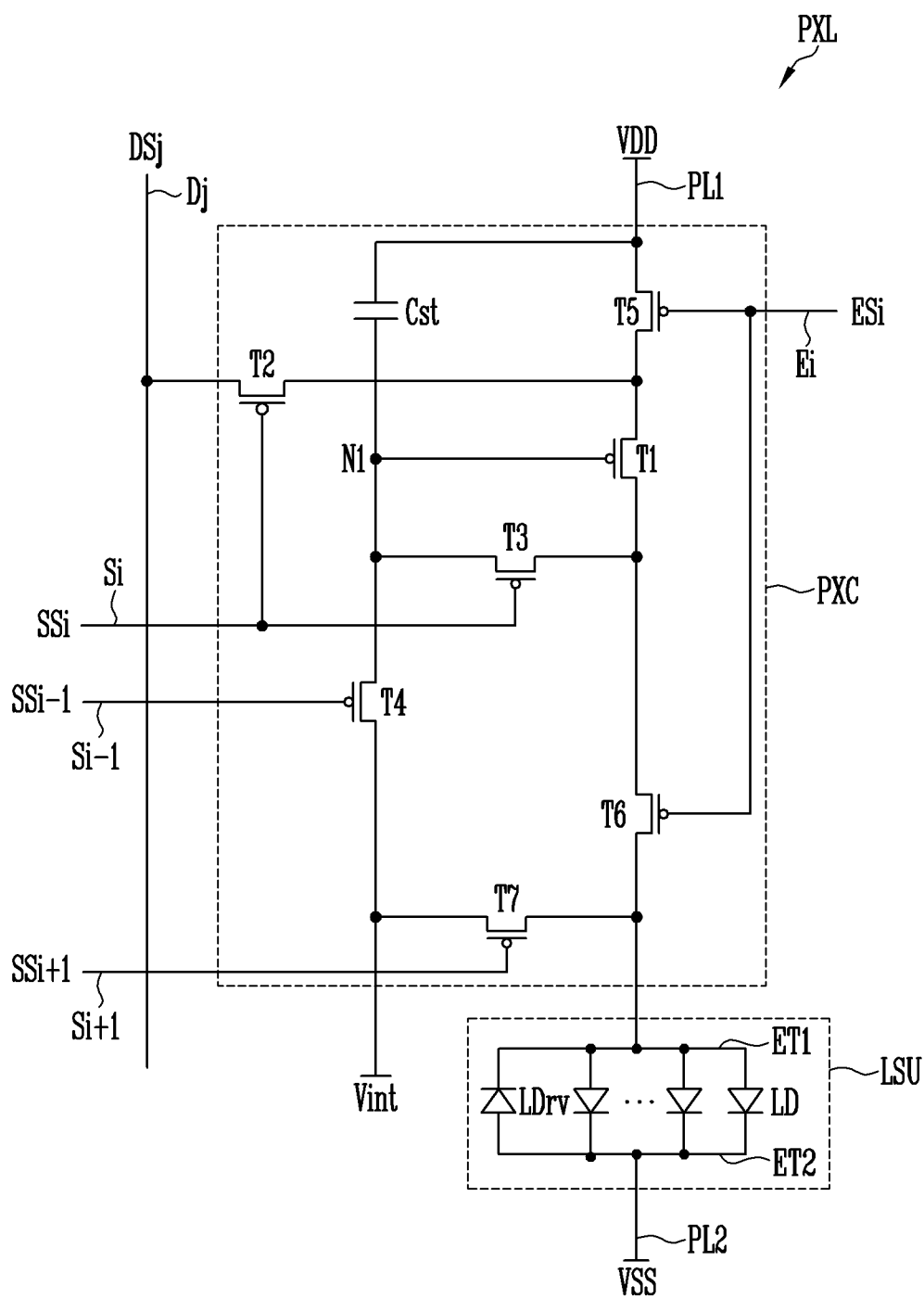

Referring to FIG. 6D, the pixel circuit PXC may be connected not only to a scan line Si of a corresponding horizontal line but also to at least one another scan line (or a control line). For example, the pixel circuit PXC of the pixel PXL disposed on the i-th horizontal line of the display area DA may be further connected to an i−1-th scan line Si−1 and/or an i+1-th scan line Si+1. In an embodiment, the pixel circuit PXC may be connected not only to the first and second power sources VDD and VSS but also to a third power source. For instance, the pixel circuit PXC may also be connected to an initialization power source Vint. In an embodiment, the pixel circuit PXC may include first to seventh transistors T1 to T7 and a storage capacitor Cst.

The first transistor T1 may be connected between the first power source VDD and the light source unit LSU. For example, a first electrode (for example, a source electrode) of the first transistor T1 may be connected to the first power source VDD through the fifth transistor T5 and the first power line PL1, and a second electrode (for example, a drain electrode) of the first transistor T1 may be connected via the sixth transistor T6 to the first electrode (for example, the first pixel electrode of the corresponding pixel PXL) of the light source unit LSU. A gate electrode of the first transistor T1 may be connected to a first node N1. The first transistor T1 may control driving current to be supplied to the light source unit LSU in response to the voltage of the first node N1.

The second transistor T2 may be connected between the data line Dj and the first electrode (for example, the source electrode) of the first transistor T1. A gate electrode of the second transistor T2 may be connected to the corresponding scan line Si. In case that a scan signal SSi having a gate-on voltage is supplied from the scan line Si, the second transistor T2 may be turned on to electrically connect the data line Dj to the first electrode of the first transistor T1. Hence, if the second transistor T2 is turned on, a data signal DSj supplied from the data line Dj may be transmitted to the first transistor T1.

The third transistor T3 may be connected between the second electrode (for example, the drain electrode) of the first transistor T1 and the first node N1. A gate electrode of the third transistor T3 may be connected to the corresponding scan line Si. In case that a scan signal SSi having a gate-on voltage is supplied from the scan line Si, the third transistor T3 may be turned on to connect the first transistor T1 in the form of a diode.

The fourth transistor T4 may be connected between the first node N1 and the initialization power source Vint. A gate electrode of the fourth transistor T4 may be connected to a preceding scan line, for example, an i−1-th scan line Si−1. In case that a scan signal SSi−1 having a gate-on voltage is supplied to the i−1-th scan line Si−1, the fourth transistor T4 may be turned on so that the voltage of the initialization power source Vint may be transmitted to the first node N1. In an embodiment, in case that the first transistor T1 is a P-type transistor, the voltage of the initialization power source Vint for initializing the gate voltage of the first transistor T1 may be the lowest voltage of the data signal DSj or less.

The fifth transistor T5 may be connected between the first power source VDD and the first transistor T1. A gate electrode of the fifth transistor T5 may be connected to a corresponding emission control line, for example, an i-th emission control line Ei. The fifth transistor T5 may be turned off in case that an emission control signal ESi having a gate-off voltage (for example, a high level voltage) is supplied to the emission control line Ei, and may be turned on in other cases.

The sixth transistor T6 may be connected between the first transistor T1 and the light source unit LSU. A gate electrode of the sixth transistor T6 may be connected to a corresponding emission control line, for example, the i-th emission control line Ei. The sixth transistor T6 is turned off in case that an emission control signal ESi having a gate-off voltage is supplied to the emission control line Ei, and is turned on in other cases.

The seventh transistor T7 may be connected between the first electrode of the light source unit LSU (for example, the first pixel electrode ET1 of the corresponding pixel PXL) and the initialization power source Vint. A gate electrode of the seventh transistor T7 may be connected to a scan line, for example, the i+1-th scan line Si+1, for selecting the pixels PXL of a subsequent horizontal line. In case that a scan signal SSi+1 having a gate-on voltage is supplied to the i+1-th scan line Si+1, the seventh transistor T7 is turned on so that the voltage of the initialization power source Vint may be supplied to the first electrode (for example, the first pixel electrode ET1) of the light source unit LSU. During each initialization period in which the voltage of the initialization power source Vint is transmitted to the light source unit LSU, the voltage of the first electrode of the light source unit LSU may be initialized.

The control signal for controlling the operation of the seventh transistor T7 may be changed in various ways. For example, in an embodiment, the gate electrode of the seventh transistor T7 may be connected to a scan line of a corresponding horizontal line, for example, an i-th scan line Si. In case that a scan signal SSi having a gate-on voltage is supplied to the i-th scan line Si, the seventh transistor T7 may be turned on so that the voltage of the initialization power source Vint may be supplied to the first electrode of the light source unit LSU.

The storage capacitor Cst may be connected between the first power source VDD and the first node N1. The storage capacitor Cst may store a voltage corresponding both to the data signal DSj applied to the first node N1 during each frame period and to the threshold voltage of the first transistor T1.

Although in FIG. 6D all of the transistors included in the pixel circuit PXC, for example, the first to seventh transistors T1 to T7, have been illustrated as being formed of P-type transistors, the disclosure is not limited thereto. For example, at least one of the first to seventh transistors T1 to T7 may be changed to an N-type transistor.

Figure 6E:
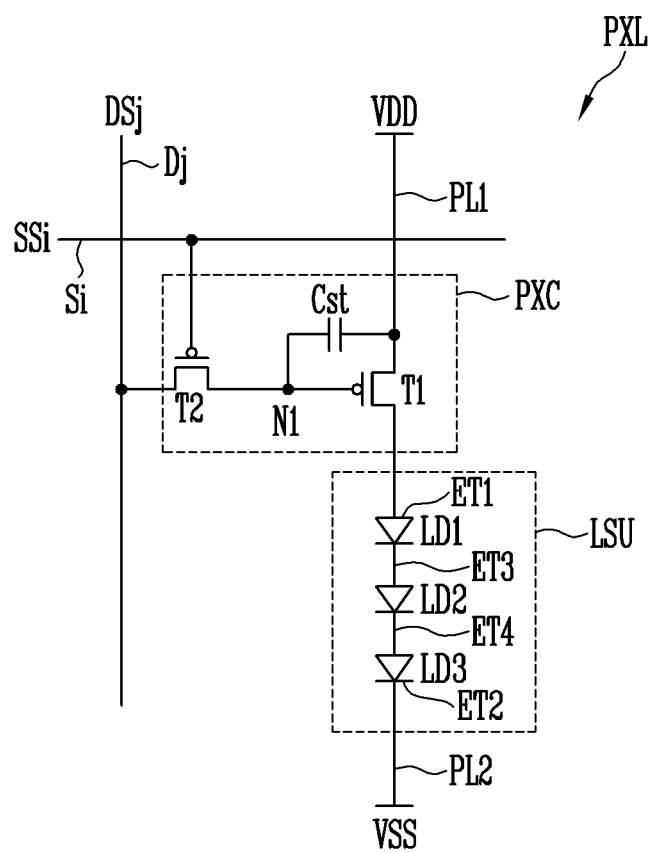
Figure 6F:
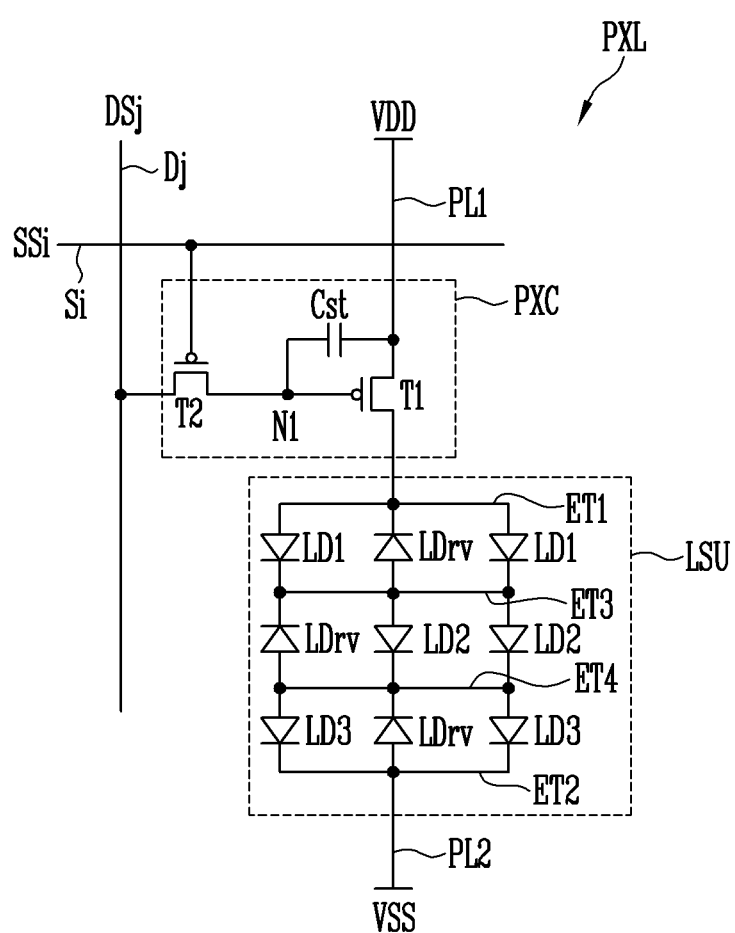
Figure 6G:
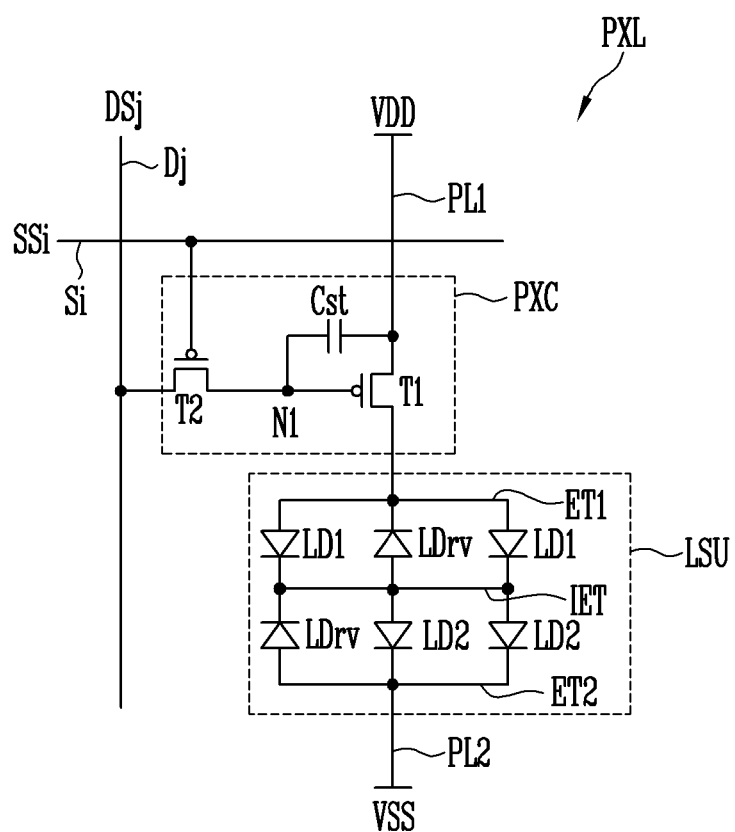

Although FIGS. 6A to 6D illustrate embodiments in which all valid light sources, for example, light emitting elements LD, constituting each light source unit LSU are connected in parallel to each other, the disclosure is not limited thereto. For example, in an embodiment, as illustrated in FIGS. 6E to 6G, the light source unit LSU of each pixel PXL may include at least two-stage serial structure. In the following descriptions of embodiments of FIGS. 6E to 6G, detailed explanations of components (for example, the pixel circuit PXC) similar or equal to that of the embodiments of FIGS. 6A to 6D will be omitted.

Referring to FIG. 6E, the light source unit LSU may include at least two light emitting elements connected in series to each other. For example, the light source unit LSU may include a first light emitting element LD1, a second light emitting element LD2, and a third light emitting element LD3 which are connected in series in the forward direction between the first power source VDD and the second power source VSS and thus form each valid light source. Hereinafter, in case that a specific or given light emitting element among the first, second, and third light emitting elements LD1, LD2, and LD3 is designated, the corresponding light emitting element will be referred to as "first light emitting element LD1", "second light emitting element LD2", or "third light emitting element LD3". The term "light emitting element LD" or "light emitting elements LD" will be used to arbitrarily designate at least one light emitting element of the first, second, and third light emitting elements LD1, LD2, and LD3 or collectively designate the first, second, and third light emitting elements LD1, LD2, and LD3.

A first end (for example, a P-type end) of the first light emitting element LD1 may be connected to the first power source VDD via the first electrode (for example, the first pixel electrode) ET1 of the light source unit LSU, etc. within the spirit and the scope of the disclosure. A second end (for example, an N-type end) of the first light emitting element LD1 may be connected to a first end (for example, a P-type end) of the second light emitting element LD2 through a third electrode (also referred to as "third pixel electrode") ET3. The first end of the second light emitting element LD2 may be connected to the second end of the first light emitting element LD1. A second end (for example, an N-type end) of the second light emitting element LD2 may be connected to a first end (for example, a P-type end) of the third light emitting element LD3 through a fourth electrode (also referred to as "fourth pixel electrode") ET4. Each of the third and fourth electrodes ET3 and ET4 may form each intermediate electrode connected between two successive serial stages. The first end of the third light emitting element LD3 may be connected to the second end of the second light emitting element LD2. A second end (for example, an N-type end) of the third light emitting element LD3 may be connected to the second power source VSS through the second electrode (for example, the second pixel electrode) ET2 of the light source unit LSU, etc. within the spirit and the scope of the disclosure. In this way, the first, second, and the third light emitting elements LD1, LD2, and LD3 may be successively connected in series between the first and second electrodes ET1 and ET2 of the light source unit LSU.

Although in FIG. 6E there is illustrated an embodiment where the light emitting elements LD are connected to have a three-stage serial structure, the disclosure is not limited thereto. For example, in an embodiment, two light emitting elements LD may be connected to have a two-stage serial structure, or four or more light emitting elements LD may be connected to have a four- or more-stage serial structure.

In case that it is assumed that a same luminance is expressed using light emitting elements LD having the same conditions (for example, a same size and/or number), in a light source unit LSU having a structure in which light emitting elements LD are connected in series, the voltage to be applied between the first and second electrodes ET1 and ET2 may be increased, and the amount of driving current flowing to the light source unit LSU may be reduced, compared to a light source unit LSU having a structure in which light emitting elements LD are connected in parallel. Therefore, in the case where the light source unit LSU of each pixel PXL is formed using a serial structure, panel current flowing through the display panel PNL may be reduced.

In an embodiment, at least one serial stage may include light emitting elements LD connected in parallel to each other. The light source unit LSU may be formed of a serial/parallel combination structure. For example, the light source unit LSU may be as illustrated in the embodiments of FIGS. 6F to 6G.

Referring to FIG. 6F, at least one serial stage that forms the light source unit LSU may include light emitting elements LD connected in parallel to each other in the forward direction. For example, the light source unit LSU may include at least one first light emitting element LD1 disposed in a first serial stage (also referred to as "first stage" or "first row"), at least one second light emitting element LD2 disposed in a second serial stage (also referred to as "second stage" or "second row") subsequent to the first serial stage, and at least one third light emitting element LD3 disposed in a third serial stage (also referred to as "third stage" or "third row") subsequent to the second serial stage. At least one of the first, second, and third serial stages may include light emitting elements LD connected in the forward direction.

Although in FIG. 6F there has been illustrated the light source unit LSU formed of light emitting elements LD disposed in three serial stages, the disclosure is not limited thereto. For example, as illustrated in FIG. 6G, the light source unit LSU may include light emitting elements LD disposed in only two serial stages (for example, the first serial stage and the second serial stage). For example, the light source unit LSU may include at least one first light emitting element LD1 which is disposed in the first serial stage and may include a first end and a second end which are respectively connected to the first electrode ET1 and an intermediate electrode IET, and at least one second light emitting element LD2 which is disposed in the second serial stage and may include a first end and a second end which are respectively connected to the intermediate electrode IET and the second electrode ET2. At least one of the first and second serial stages may include light emitting elements LD which are connected in the forward direction.

The number of serial stages that form the light source unit LSU may be changed in various ways. For example, the light source unit LSU may include light emitting elements LD distributed in four or more serial stages. Furthermore, the number of light emitting elements LD connected in the forward direction in each serial stage may be changed in various ways. In an embodiment, the numbers of light emitting elements LD included in the pixels PXL disposed in the display area (DA of FIG. 5) may be identical or similar to each other. For example, at the step of supplying the light emitting elements LD to each pixel PXL, the light emitting elements LD may be aligned in such a way that light emitting element ink (also referred to as "light emitting element solution") including the light emitting elements LD is controlled to be uniformly applied to an emission area of each pixel PXL, and a uniform electric field is controlled to be applied to each pixel PXL. In this way, the light emitting elements LD may be relatively uniformly supplied to and aligned in each pixel PXL.

In an embodiment, as illustrated in FIGS. 6F and 6G, each pixel PXL may further include at least one reverse light emitting element LDrv disposed in at least one serial stage. For example, at least one of serial stages may further include at least one reverse light emitting element LDrv connected in a direction opposite to that of the light emitting elements LD.

Even in case that the reverse light emitting element LDrv may be connected to at least one serial stage, the driving current of the pixel PXL may flow successively via the serial stages if at least one valid light source (for example, the first, second, and/or third light emitting elements LD1, LD2, and LD3) connected in the forward direction to the serial stage is disposed. Hence, the light source unit LSU may emit light at a luminance corresponding to the driving current.

As described in the foregoing embodiments, each light source unit LSU may include light emitting elements LD which are connected in the forward direction between the first and second power sources VDD and VSS and form respective valid light sources. Furthermore, the connection structure between the light emitting elements LD may be changed in various ways depending on embodiments. For example, the light emitting elements LD may be connected only in series or parallel to each other, or in a series/parallel combination structure.

As described above, the pixel PXL may include a pixel circuit PXC and/or a light source unit LSU which may have various structures. The structure of the pixel PXL which may be applied to the disclosure is not limited to the embodiments illustrated in FIGS. 6A to 6G, and each pixel PXL may have various structures. For instance, each pixel circuit PXC may be formed of a pixel circuit which may have various structures and/or be operated in various driving manners. In an embodiment, each pixel PXL may be a passive light emitting display device, or the like within the spirit and the scope of the disclosure. The pixel circuit PXC may be omitted, and each of the first and second electrodes ET1 and ET2 of the light source unit LSU may be connected to or directly connected to the scan line Si, the data line Dj, the first power line PL1, the second power line PL2, or other signal lines or power lines, etc. within the spirit and the scope of the disclosure.

Figure 7A:
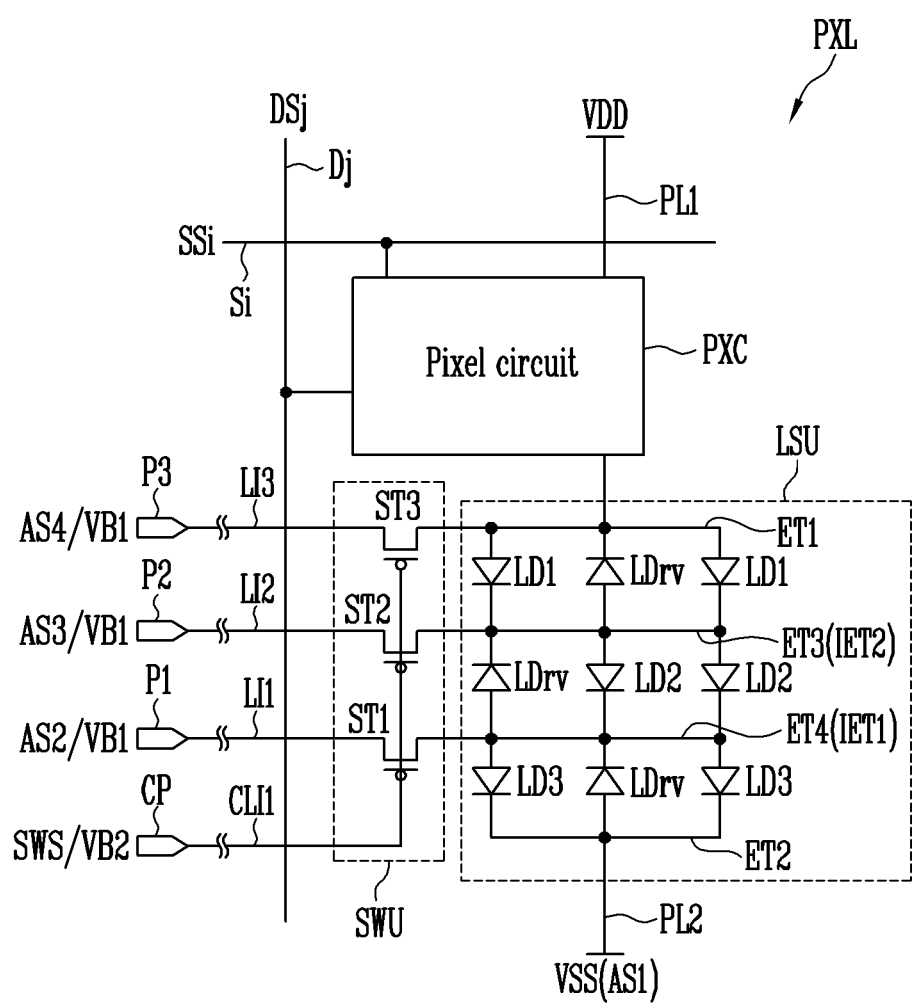
FIGS. 7A to 7F are schematic diagrams of equivalent circuits each illustrating a pixel in accordance with an embodiment, and for example illustrate different embodiments of a pixel including a switch unit.
Figure 7B:
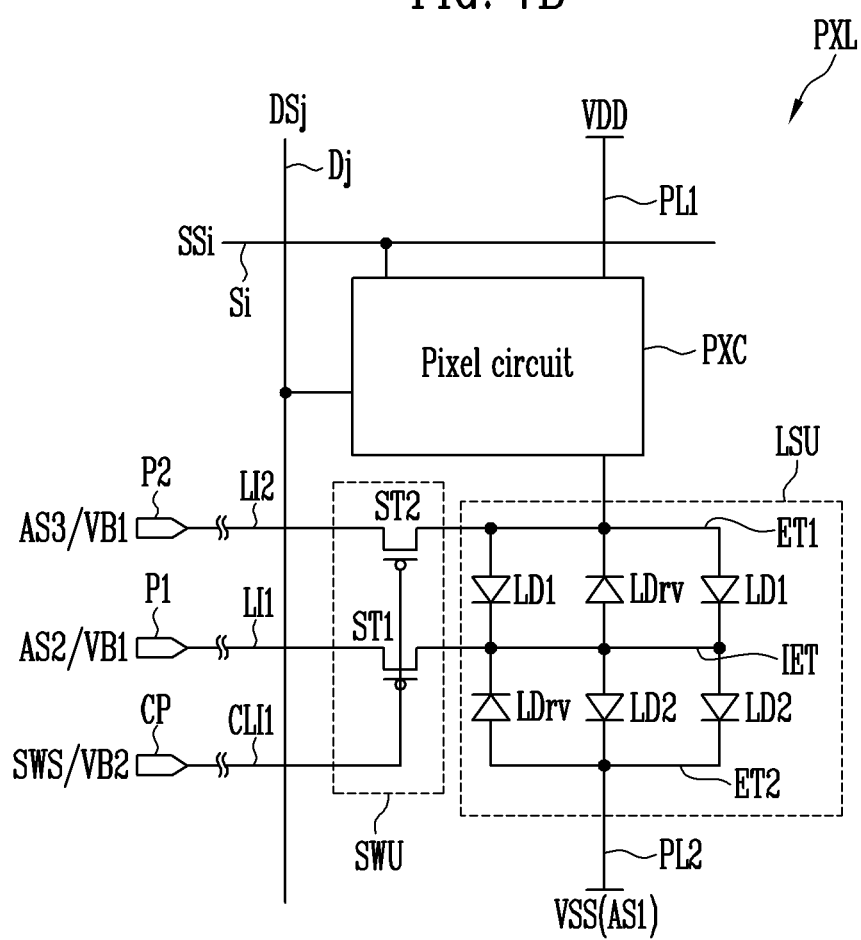
Figure 7C:
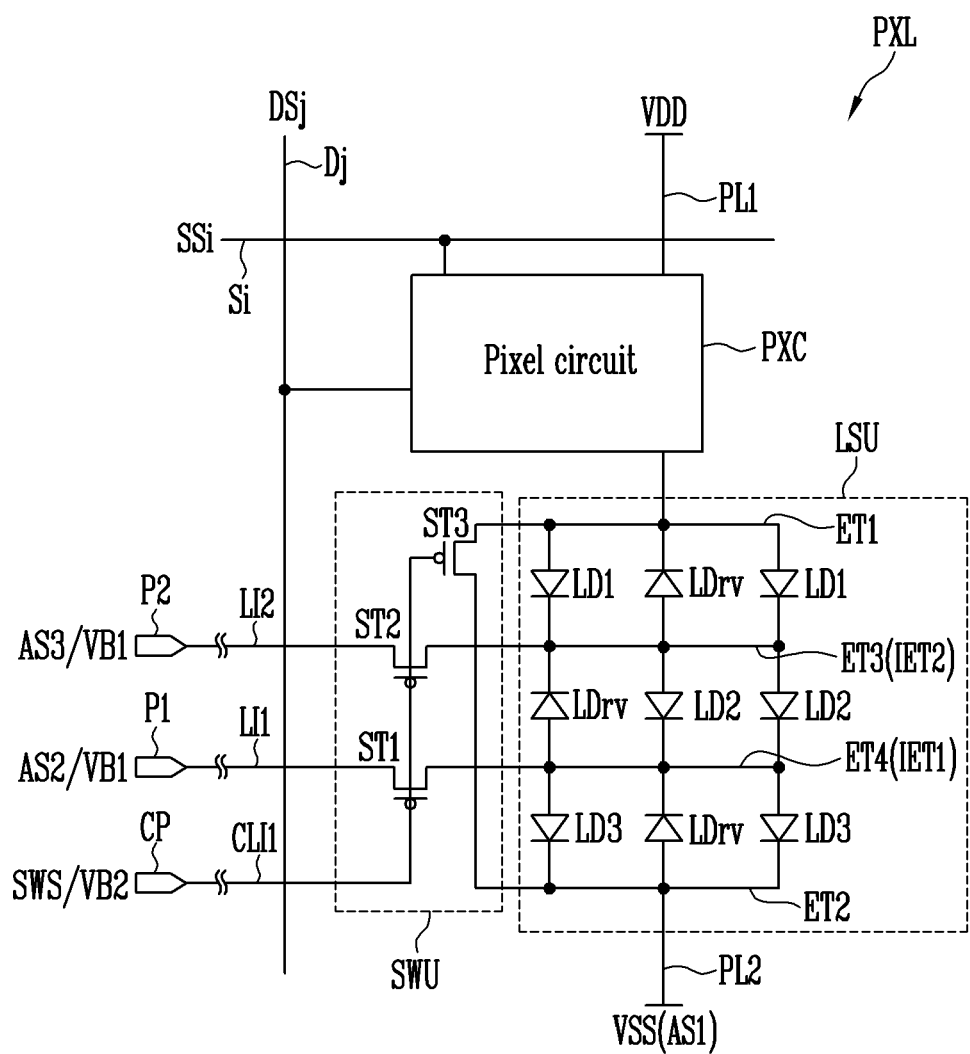
Figure 7D:
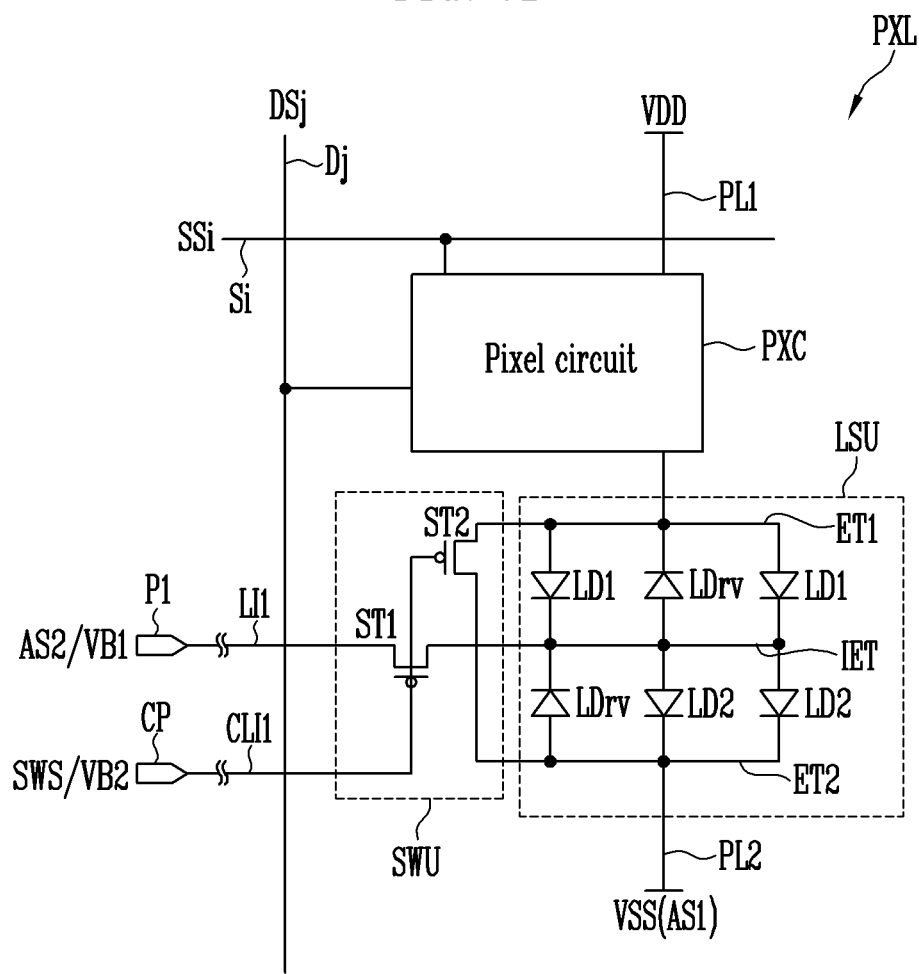
Figure 7E:
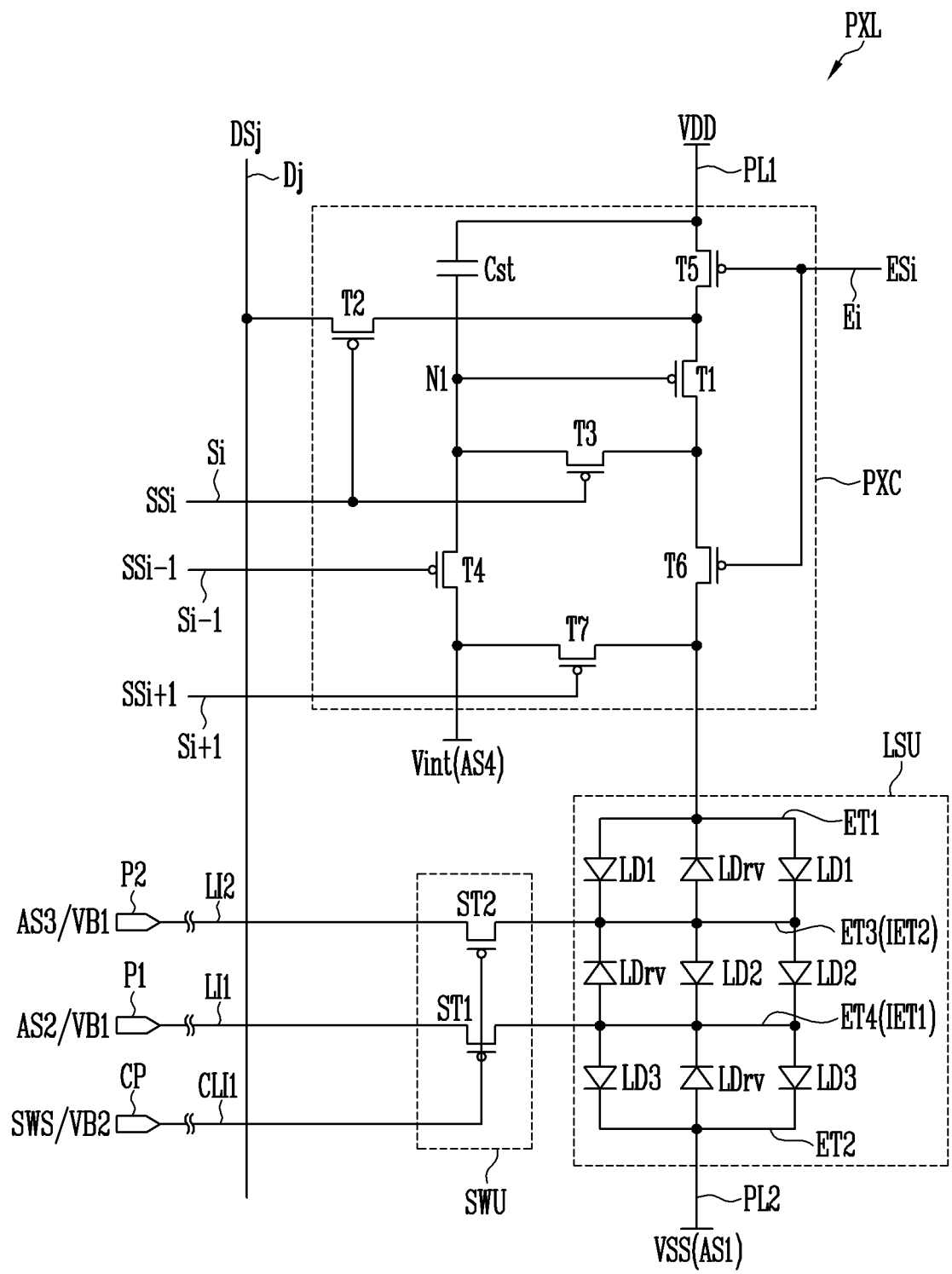
Figure 7F:
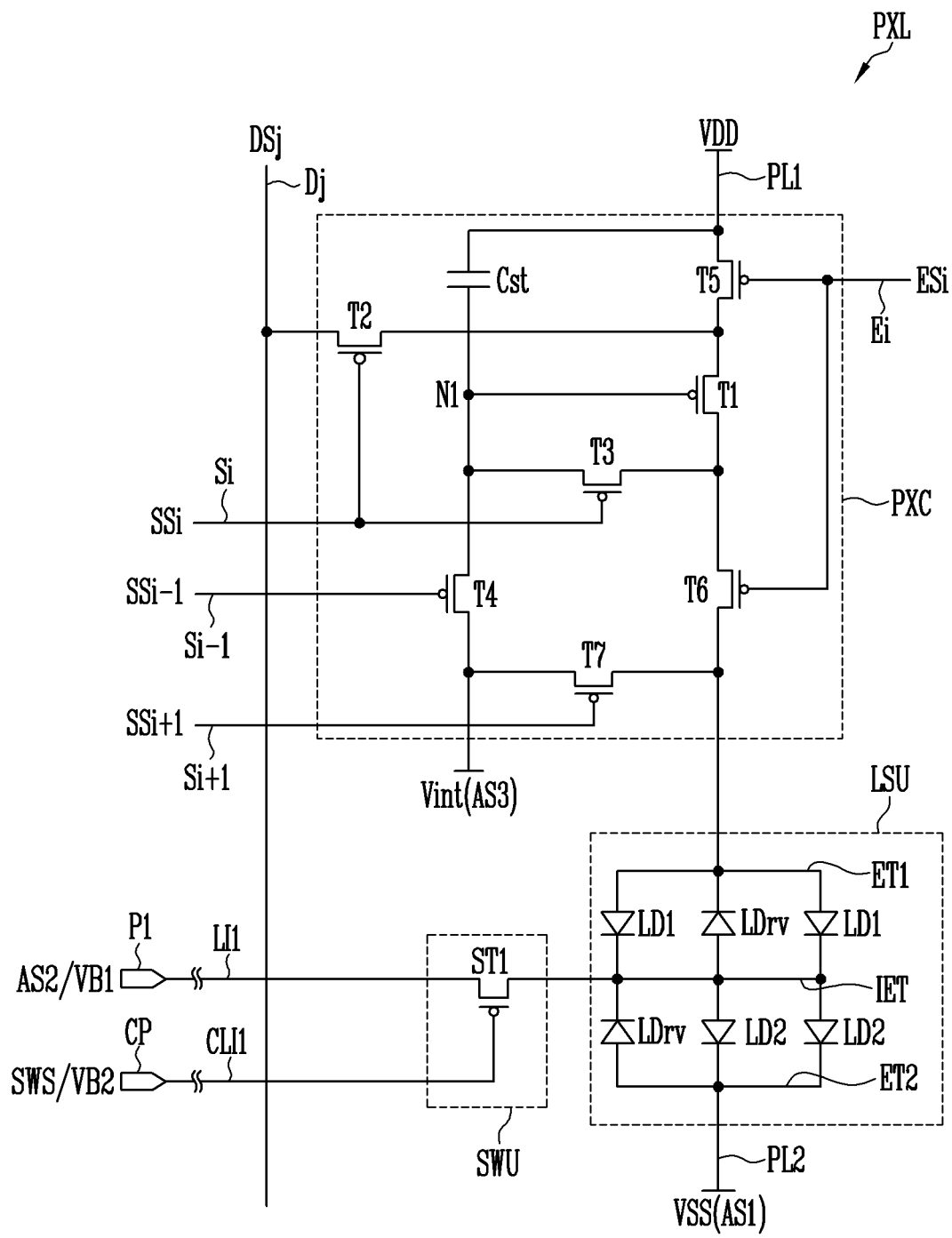

FIGS. 7A to 7F are schematic diagrams of equivalent circuits each illustrating a pixel PXL in accordance with an embodiment, and for example illustrate different embodiments of the pixel PXL including a switch unit SWU. For the sake of explanation, in FIGS. 7A to 7D, illustration of a detailed structure of the pixel circuit PXC which may be implemented in various shapes as an element which may be provided in each pixel PXL will be omitted. Furthermore, FIGS. 7E and 7F illustrate a pixel circuit PXC according to an embodiment in which some or a number of circuit elements provided in the pixel circuit PXC may be used for application of an alignment signal (for example, a pixel circuit PXC including a seventh transistor T7 connected to a third power source such as the initialization power source Vint, as shown in the embodiment of FIG. 6D). In the description of the embodiment of FIGS. 7A to 7F, like reference numerals will be used to designate components similar or equal to those of the previous embodiments, and detailed explanation thereof will be omitted.

In the description of embodiments, the switch unit SWU will be described as being included in each pixel PXL, but the disclosure is not limited thereto. For example, the switch unit SWU may be connected to each pixel PXL and be regarded as a separate component disposed on a periphery of the pixel PXL.

Referring to FIGS. 5 to 7A, the pixel PXL in accordance with an embodiment may further include a light source unit LSU, and a switch unit SWU connected to the light source unit LSU. Furthermore, the pixel PXL may further include a pixel circuit PXC connected between the light source unit LSU and the first power source VDD (or the second power source VSS).

The pixel circuit PXC may be connected between the first electrode ET1 of the light source unit LSU and the first power line PL1. The location of the pixel circuit PXC may be changed in various ways depending on embodiments. For example, in an embodiment, the pixel circuit PXC may be connected between the second electrode ET2 of the light source unit LSU and the second power line PL2. The pixel circuit PXC may supply driving current corresponding to a data signal DSj to the light source unit LSU during each frame period. During a frame period in which a data signal DSj corresponding to a black gray scale is supplied, the pixel circuit PXC may not supply driving current to the light source unit LSU.

In an embodiment, the pixel circuit PXC may be a P-type pixel circuit including P-type transistors. However, the disclosure is not limited thereto. For example, in an embodiment, the pixel circuit PXC may be formed of N-type transistors, or the pixel circuit PXC may include a combination of at least one P-type transistor and at least one N-type transistor.

The light source unit LSU may include light emitting elements LD disposed in at least two serial stages, and at least three electrodes provided to form the at least two serial stages. For example, in case that the light source unit LSU is formed of a three-stage serial structure or a serial/parallel combination structure, the light source unit LSU may include first to fourth electrodes ET1 to ET4, and first, second, and third light emitting elements LD1, LD2, and LD3 connected between the first to fourth electrodes ET1 to ET4.

The switch unit SWU may include at least one switching element connected to at least one electrode provided in the light source unit LSU. For example, the switch unit SWU may include a first switching element ST1 connected to the fourth electrode ET4 (also referred to as "first intermediate electrode IET1"), a second switching element ST2 connected to the third electrode ET3 (also referred to as "second intermediate electrode IET2"), and a third switching element ST3 connected to the first electrode ET1. In an embodiment, the first, second, and third switching elements ST1, ST2, and ST3 may be driven by an identical signal. For example, the first, second, and third switching elements ST1, ST2, and ST3 may be simultaneously turned on or off by an identical switch control signal SWS. In an embodiment, at least one of the first, second, and third switching elements ST1, ST2, and ST3 may be driven by a different signal.

Hereinafter, in case that a specific or given switching element among the first, second, and third switching elements ST1, ST2, and ST3 is designated, the corresponding switching element will be referred to as "first switching element ST1", "second switching element ST2", or "third switching element ST3". The term "switching element ST" or "switching elements ST" will be used to arbitrarily designate at least one switching element of the first, second, and third switching elements ST1, ST2, and ST3 or collectively designate the first, second, and third switching elements ST1, ST2, and ST3.

In an embodiment, at the step (hereinafter, referred to as "alignment step") of aligning the light emitting elements LD in the light source unit LSU of each pixel PXL during a process of fabricating the display device, the switching elements ST may be simultaneously turned on and used to supply an alignment signal to each electrode. For example, at the alignment step, a first alignment signal AS1 may be supplied to the second electrode ET2 through the second power line PL2, or the voltage of the second power source VSS may be transmitted to the second electrode ET2 so that the voltage of the second power source VSS may be used as the first alignment signal AS1. Furthermore, the switching elements ST may be turned on by supplying a switch control signal SWS having a gate-on voltage thereto through a first control line CLI1, so that a second alignment signal AS2, a third alignment signal AS3, and a fourth alignment signal AS4 may be respectively supplied to the fourth electrode ET4, the third electrode ET3, and the first electrode ET1 through the switching elements ST. The first to fourth alignment signals AS1 to AS4 may be signals having a voltage difference and/or a phase difference capable of aligning the light emitting elements LD between one pair of electrodes which form each serial stage. At least some or a number of the first to fourth alignment signals AS1 to AS4 may be alternating current signals, but the disclosure is not limited thereto.

In case that the display device is in actual use, a bias power may be supplied to the switching elements ST so that the switching elements ST can remain turned off. For example, in case that the display device is actually driven, a first bias voltage VB1 and a second bias voltage VB2 may be respectively supplied to electrodes and gate electrodes of the switching elements ST so that the switching elements ST may be controlled to remain turned off. However, the disclosure is not limited thereto. For example, even after the display device is fabricated and/or is in actual use, a signal may be supplied to each electrode of the light source unit LSU by driving the switching elements ST, as needed. In case that the display device is actually driven, a voltage of the second power source VSS may be supplied to the second power line PL2. In an embodiment, the second power source VSS may be a low-potential pixel power source.

The first switching element ST1 may be connected between the fourth electrode ET4 and a first line LI1 and be driven by a switch control signal SWS applied to the first control line CLI1. In an embodiment, the first switching element ST1 may be a transistor. A gate electrode of the first witching element ST1 may be connected to the first control line CLI1. For example, in case that a switch control signal SWS having a gate-on voltage (for example, a low level voltage) is supplied to the first control line CLI1, the first switching element ST1 may be turned on, so that a second alignment signal AS2 supplied through the first line LI1 may be transmitted to the fourth electrode ET4.

The second switching element ST2 may be connected between the third electrode ET3 and a second line LI2 and be driven by a switch control signal SWS applied to the first control line CLI1. In an embodiment, the second switching element ST2 may be a transistor. A gate electrode of the second witching element ST2 may be connected to the first control line CLI1. For example, in case that a switch control signal SWS having a gate-on voltage is supplied to the first control line CLI1, the second switching element ST2 may be turned on, so that a third alignment signal AS3 supplied through the second line LI2 may be transmitted to the third electrode ET3.

The third switching element ST3 may be connected between the first electrode ET1 and a third line LI3 and be driven by a switch control signal SWS applied to the first control line CLI1. In an embodiment, the third switching element ST3 may be a transistor. A gate electrode of the third witching element ST3 may be connected to the first control line CLI1. For example, in case that a switch control signal SWS having a gate-on voltage is supplied to the first control line CLI1, the third switching element ST3 may be turned on, so that a fourth alignment signal AS4 supplied through the third line LI3 may be transmitted to the first electrode ET1.

In an embodiment, the switching elements ST each may be a transistor of a type identical with that of at least one transistor that forms the pixel circuit PXC. Furthermore, the switching elements ST may be different types of transistors. For example, in the case where the pixel circuit PXC is formed of P-type transistors, each switching element ST may be formed of a P-type transistor. The pixel circuit PXC and the switch unit SWU may be simultaneously formed on an identical layer, so that the process of fabricating the display device may be simplified. Here, the type, structure, and/or position of each of the switching elements ST may be changed in various ways depending on embodiments. For example, in an embodiment, some or a number of the switching elements ST may have different types and/or structures or be disposed on different layers.

The first line LI1 may be connected between a first pad P1 and the first switching element ST1. The first line LI1 may transmit, to the first switching element ST1, a power and/or signal applied to the first pad P1.

The second line LI2 may be connected between a second pad P2 and the second switching element ST2. The second line LI2 may transmit, to the second switching element ST2, a power and/or signal applied to the second pad P2.

The third line LI3 may be connected between a third pad P3 and the third switching element ST3. The third line LI3 may transmit, to the third switching element ST3, a power and/or signal applied to the third pad P3.

The first control line CLI1 may be connected between a control pad CP and control electrodes of the switching elements ST (for example, the respective gate electrodes of the switching elements ST). The first control line CLI1 may transmit, to the switching elements ST, a power and/or signal applied to the control pad CP.

The first pad P1 may be connected to the first switching element ST1 through the first line LI1. The first pad P1 may be supplied with a power and/or signal in case that the display device (for example, the display panel PNL) is fabricated or in actual use. For example, at the alignment step during the process of fabricating the display panel PNL, a second alignment signal AS2 may be applied to the first pad P1. In case that the display panel PNL is in actual use, a bias signal (for example, a first bias voltage VB1) may be applied to the first pad P1.

The second pad P2 may be connected to the second switching element ST2 through the second line LI2. The second pad P2 may be supplied with a power and/or signal in case that the display panel PNL is fabricated or in actual use. For example, at the alignment step during the process of fabricating the display panel PNL, a third alignment signal AS3 may be applied to the second pad P2. In case that the display panel PNL is in actual use, a bias signal (for example, a first bias voltage VB1) may be applied to the second pad P2.

The third pad P3 may be connected to the third switching element ST3 through the third line LI3. The third pad P3 may be supplied with a power and/or signal in case that the display panel PNL is fabricated or in actual use. For example, at the alignment step during the process of fabricating the display panel PNL, a fourth alignment signal AS4 may be applied to the third pad P3. In case that the display panel PNL is in actual use, a bias signal (for example, a first bias voltage VB1) may be applied to the third pad P3.

The control pad CP may be connected to the gate electrodes of the switching elements ST through the first control line CLI1. The control pad CP may be supplied with a power and/or signal in case that the display panel PNL is fabricated or in actual use. For example, at the alignment step of the process of fabricating the display panel PNL, a switch control signal SWS for turning on the switching elements ST during a period may be applied to the control pad CP. In case that the display panel PNL is in actual use, a bias signal (for example, a second bias voltage VB2) may be applied to the control pad CP. In an embodiment, the bias signals (for example, the first and/or second bias voltages VB1 and/or VB2) to be supplied to the switching elements ST may be signals for maintaining the switching elements ST turned off.

Hereinafter, to designate a specific or given pad of the first to third pads P1 to P3 and the control pad CP, the corresponding pad will be referred to as "first pad P1", "second pad P2", "third pad P3", or "control pad CP". The term "pad P" or "pads P" will be used to arbitrarily designate at least one pad of the first to third pads P1 to P3 and the control pad CP or collectively designate them.

In an embodiment, the pads P may be disposed in the non-display area NDA of each display panel PNL and/or in a peripheral area on each mother substrate for simultaneously forming display panels PNL. Furthermore, each pad P may be collectively connected to first lines LI1, second lines LI2, third lines LI3, or first control lines CLI1 which are disposed on horizontal lines of the corresponding display panel PNL.

For example, the first pad P1 may be connected in common to the first lines LI1 disposed on the horizontal lines of the corresponding display panel PNL. The second pad P2 may be connected in common to the second lines LI2 disposed on the horizontal lines of the display panel PNL. Likewise, the third pad P3 may be connected in common to the third lines LI3 disposed on the horizontal lines of the display panel PNL. The control pad CP may be connected in common to the first control lines CLI1 disposed on the horizontal lines of the display panel PNL. Therefore, a power or signal applied to each pad P may be collectively transmitted to any one group of lines among the first lines LI1, the second lines LI2, the third lines LI3, and the first control line CLI1.

As illustrated in FIG. 7B, the light source unit LSU may include light emitting elements LD disposed in only two serial stages (for example, the first serial stage and the second serial stage). For example, the light source unit LSU may include a first electrode ET1, a second electrode ET2, and an intermediate electrode IET disposed between the first and second electrodes ET1 and ET2. At least one first light emitting element LD1 and at least one second light emitting element LD2 may be respectively connected between the first electrode ET1 and the intermediate electrode IET and between the intermediate electrode IET and the second electrode ET2.

In the foregoing embodiment, the switch unit SWU may include only two switching elements ST. For example, the switch unit SWU may include a first switching element ST1 connected between the intermediate electrode IET and the first line LI1, and a second switching element ST2 connected between the first electrode ET1 and the second line LI2.

In an embodiment, the first and second switching elements ST1 and ST2 may be driven by a switch control signal SWS supplied to the first control line CLI1. For example, in case that a switch control signal SWS having a gate-on voltage is supplied to the first control line CLI1, the first and second switching elements ST1 and ST2 may be turned on so that a second alignment signal AS2 and a third alignment signal AS3 (or a first bias voltage VB1) may be respectively supplied to the intermediate electrode IET and the first electrode ET1.

Referring to FIG. 7C, the third switching element ST3 may be connected between the first electrode ET1 and the second electrode ET2 and be turned on simultaneously with the first and second switching elements ST1 and ST2. For example, one electrode of the third switching element ST3 may be connected to the first electrode ET1, and another electrode of the third switching element ST3, along with the second electrode ET2, may be connected to the second power line PL2. A gate electrode of the third switching element ST3 may be connected to the first control line CLI1. In case that a switch control signal SWS having a gate-on voltage is supplied to the first control line CLI1, the third switching element ST3 may be turned on, so that a voltage of the second power source VSS (or a first alignment signal AS1) supplied through the second power line PL2 may be transmitted to the first electrode ET1. At the alignment step, a substantially identical voltage may be transmitted to the first and second electrodes ET1 and ET2. Here, an alignment signal (for example, a second and/or third alignment signals AS2 and/or AS3) having a voltage and/or phase different from that of the first and second electrodes ET1 and ET2 may be supplied to at least one intermediate electrode (for example, the third and/or fourth electrodes ET3 and/or ET4) disposed between the first and second electrodes ET1 and ET2. Hence, an electric field sufficient to align the light emitting elements LD may be formed between one pair of electrodes which form each serial stage.

In accordance with the foregoing embodiment, the number of lines and/or pads P connected to the pixels PXL may be reduced. For example, compared to the embodiment of FIG. 7A in which the structure of the light source unit LSU is substantially identical with that of the foregoing embodiment, the third line LI3 and the third pad P3 may be removed. Furthermore, an electric field may be formed between the electrodes of each serial stage by using only alignment signals the number of which is less than the number of electrodes that form the light source unit LSU, so that the light emitting elements LD can be aligned by the electric field.

Referring to FIG. 7D, even in case that as shown in the embodiment of FIG. 7B the light source unit LSU may include light emitting elements LD disposed in only two serial stages (for example, the first serial stage and the second serial stage), the number of lines and/or pads P connected to the pixels PXL may be reduced in a manner similar to that of the embodiment of FIG. 7C. For example, the second switching element ST2 may be connected between the first electrode ET1 and the second electrode ET2. Hence, compared to the embodiment of FIG. 7B, the second line LI2 and the second pad P2 may be removed, and an electric field may be formed between the electrodes of each serial stage by only a smaller number of alignment signals.

Referring to FIGS. 7E and 7F, in lieu of a structure such that a separate switching element may be connected to the first electrode ET1 to apply an alignment signal to the first electrode ET1, at least one transistor provided in the pixel circuit PXC may be used to apply an alignment signal to the first electrode ET1. For example, at the alignment step, the first electrode ET1 may be connected to the initialization power source Vint by driving the seventh transistor T7 of each pixel PXL, and the voltage of the initialization power source Vint may be used as an alignment signal (for example, a third or fourth alignment signals AS3 or AS4) to be applied to the first electrode ET1. For example, at the alignment step, the voltage of the initialization power source Vint may be transmitted to the first electrodes ET1 of the pixels PXL by collectively supplying a scan signal having a gate-on voltage (or a control signal having a gate-on voltage) in common to the scan lines (or separate control lines connected to the seventh transistor T7) disposed in the display area DA. At the alignment step, an emission control signal having a gate-off voltage may be collectively supplied to the emission control lines disposed in the display area DA. Hence, influence of the pixel circuit PXC on the alignment process may be minimized. In accordance with the embodiments of FIGS. 7E and 7F, the structure of the switch unit SWU may be simplified, and the number of alignment signals may be reduced.

As shown in the embodiments of FIGS. 7A to 7F, if the switching element ST may be connected between lines (for example, which may be at least some or a number of the first to third lines LI1 to LI3 and the first control line CLI1, and collectively referred to as "alignment lines") for applying alignment signals to the pixels PXL and at least one electrode that forms the light source unit LSU of each pixel PXL, connection between the pixels PXL and the alignment lines may be controlled, as needed. For example, during a process of aligning the light emitting elements LD in each pixel PXL, each switching element ST may be turned on so that an alignment signal may be applied to each light source unit LSU of each of the pixels PXL. During the other periods, the switching element ST may remain turned off so that the alignment lines may be isolated from the light source unit LSU of each of the pixels PXL. Hence, the pixels PXL may be separated from each other to have a shape capable of being individually driven, without performing an etching process of separating the alignment lines. Therefore, in accordance with the above-mentioned embodiments, the process of fabricating the display device (for example, the display panel PNL) may be further simplified.

For example, in the case of a comparative embodiment provided without the switch unit SWU, the first electrodes ET1 of the pixels PXL and the intermediate electrodes of each serial stage may be connected in common to pixels PXL and supplied with respective alignment signals, and the pixels PXL are required to be disconnected from each other such that the pixels PXL may be individually driven after the alignment process has been completed. Therefore, after the alignment process has been completed, a mask process or the like for separation of the alignment lines is required to be performed. However, in accordance with the embodiments described above, the switch unit SWU may be used to control connection between each pixel PXL and the alignment lines, so that an etching process for separation of the alignment lines may be omitted.

Although in FIGS. 7A to 7F there have been described the embodiments of the pixel PXL including the light source unit LSU provided with at least two serial stages, the disclosure is not limited thereto. For example, the pixel PXL may include a light source unit LSU having a parallel structure as disclosed in the embodiments of FIGS. 6A to 6D, and a switch unit SWU connected between an alignment line and any one of the first and second electrodes ET1 and ET2 of the light source unit LSU. For example, in the embodiment of FIG. 7F, the intermediate electrode IET may be removed, all of the light emitting elements LD may be connected in parallel between the first electrode ET1 and the second electrode ET2, and the first switching element ST1 may be connected between the first line LI1 and the first electrode ET1 so that a second alignment signal AS2 may be supplied to the first electrode ET1. Since the first switching element ST1 is used to control connection between the first line LI1 and the first electrode ET1, an etching process for separation of the first line LI1 may also be omitted.

Figure 8A:
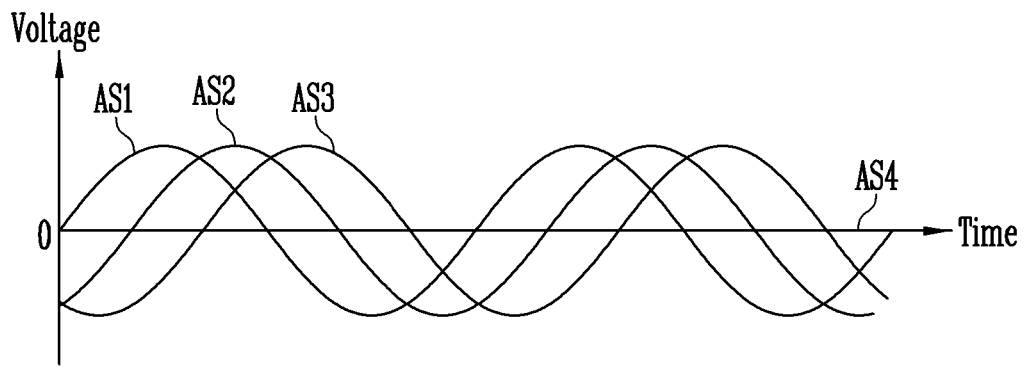
FIGS. 8A to 8C each illustrates examples of alignment signals in accordance with an embodiment.
Figure 8B:
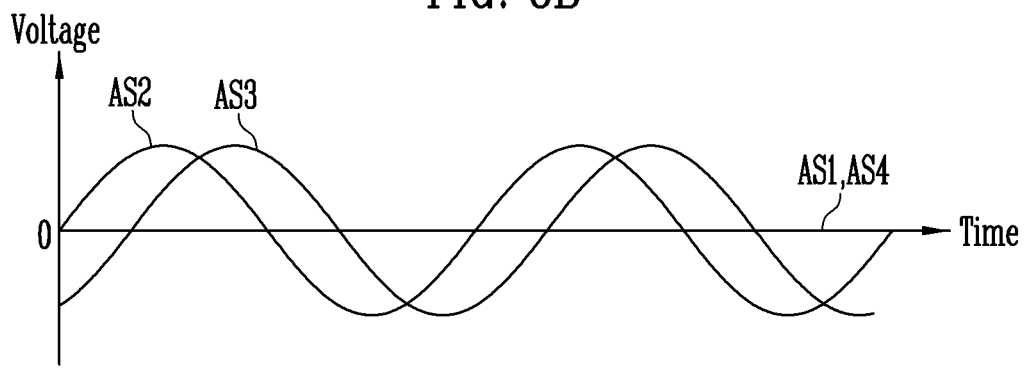
Figure 8C:
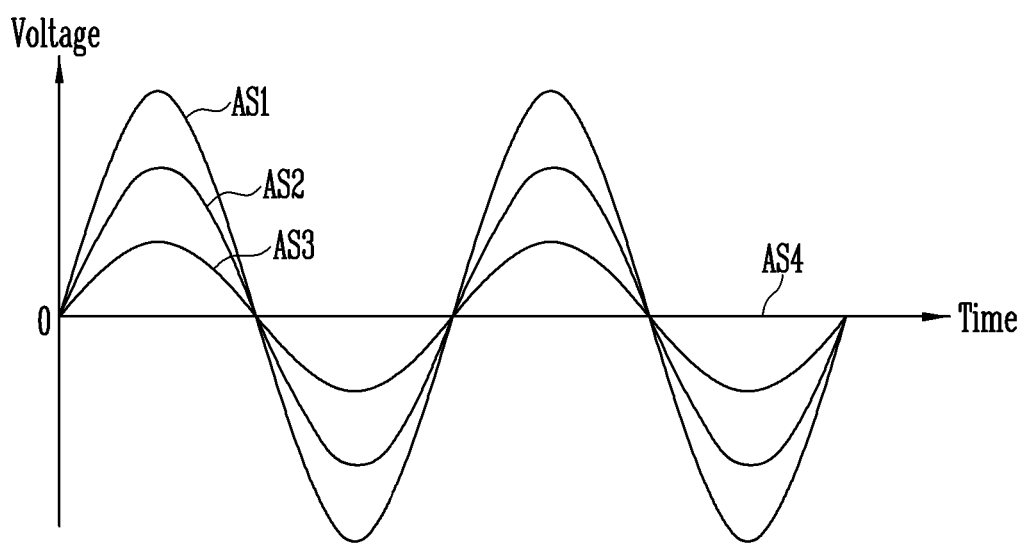

FIGS. 8A to 8C each illustrates examples of alignment signals in accordance with an embodiment. FIGS. 8A to 8C illustrate various embodiments pertaining to first to fourth alignment signals AS1 to AS4 for forming a light source unit LSU having a three-stage structure. Here, the number and/or type of alignment signals may be changed in various ways depending to the structure, etc. of the light source unit LSU. FIGS. 8A to 8C illustrate various embodiments pertaining to the first to fourth alignment signals AS1 to AS4 for forming a light source unit LSU having a three-stage structure as voltage as a function of time. The unit of voltage may be volts and the unit of time may be seconds in the graphs of FIGS. 8A to 8C, but embodiments are not limited thereto.

First, referring to FIGS. 7A to 8A, the first to fourth alignment signals AS1 to AS4 may be respectively supplied to the second electrode ET2, the fourth electrode ET4, the third electrode ET3, and the first electrode ET1 of the light source unit LSU. Hence, an electric field may be formed between electrodes that form each serial stage, so that the light emitting elements LD may be aligned between the electrodes.

Some or a number of the first to fourth alignment signals AS1 to AS4 may be alternating current signals, and the other signals may be direct current signals. For example, each of the first to third alignment signals AS1 to AS3 may be an alternating current signal, and the fourth alignment signal AS4 may be a direct current signal. However, the disclosure is not limited thereto. For example, in an embodiment, all of the first to fourth alignment signals AS1 to AS4 may be alternating current signals.

In an embodiment, the first to third alignment signals AS1 to AS3 may be signals having an identical amplitude and having phase differences. For example, the second and third alignment signals AS2 and AS3 may be signals generated by modulating in phase the first alignment signal AS (for example, by successively delaying the phases) using a phase shifter. The fourth alignment signal AS4 may be a direct current signal having a potential, for example, a ground potential. Voltage differences are caused between the first to fourth electrodes ET1 to ET4 by the first to fourth alignment signals AS1 to AS4, so that electric fields may be formed between the first to fourth electrodes ET1 to ET4.

Referring to FIG. 8B, the second and third alignment signals AS2 and AS3 may be signals having an identical amplitude and having a phase difference. Each of the first and fourth alignment signals AS1 and AS4 may be a direct current signal having a potential. For example, the first and fourth alignment signals AS1 and AS4 may be direct current signals identically having the ground potential, and may be a substantially identical signal. Since at least one intermediate electrode (for example, the third and fourth electrodes ET3 and ET4) is disposed between the first and second electrodes ET1 and ET2 to which the first and fourth alignment signals AS1 and AS4 are applied, an electric field may be formed between the electrodes of each serial stage even in case that the first and fourth alignment signals AS1 and AS4 have an identical voltage level. Furthermore, in an embodiment, the fourth alignment signal AS4 may not be needed. For example, in the case of the embodiments of FIGS. 7C and 7D, the first alignment signal AS1 may be identically applied to the first and second electrodes ET1 and ET2. In the case of the embodiments of FIGS. 7E and 7F, the voltage of the initialization power source Vint may be used as the third or fourth alignment signal AS3 or AS4.

Referring to FIG. 8C, the first to third alignment signals AS1 to AS3 may be signals having different amplitudes. For example, the second alignment signal AS2 and the first alignment signal AS1 may be signals generated by modulating in amplitude the third alignment signal AS3 (for example, by successively expanding the amplitudes) using a level shifter. The fourth alignment signal AS4 may be a direct current signal having a potential, for example, a ground potential. Voltage differences are caused between the first to fourth electrodes ET1 to ET4 by the first to fourth alignment signals AS1 to AS4, so that electric fields may also be formed between the first to fourth electrodes ET1 to ET4.

As described with reference to FIGS. 8A to 8C, alignment signals may be generated through various schemes. Furthermore, alignment signals may be generated by separately using any one of the embodiments of FIGS. 8A to 8C, or by using a combination of at least two embodiments of the embodiments of FIGS. 8A to 8C. For example, alternating current type alignment signals may be generated by phase modulation and/or amplitude modulation. Furthermore, in an embodiment, a direct current type alignment signal (for example, the fourth alignment signal AS4) may be applied to at least one electrode (for example, at least the first electrode ET1), so that characteristics of the pixel circuit PXC may be prevented from affecting the alignment of the light emitting elements LD.

FIGS. 9A to 9D are plan views each illustrating a pixel PXL in accordance with an embodiment. In an embodiment, the pixels PXL disposed in the display area (DA of FIG. 5) may have substantially identical or similar structures.

Figure 9A:
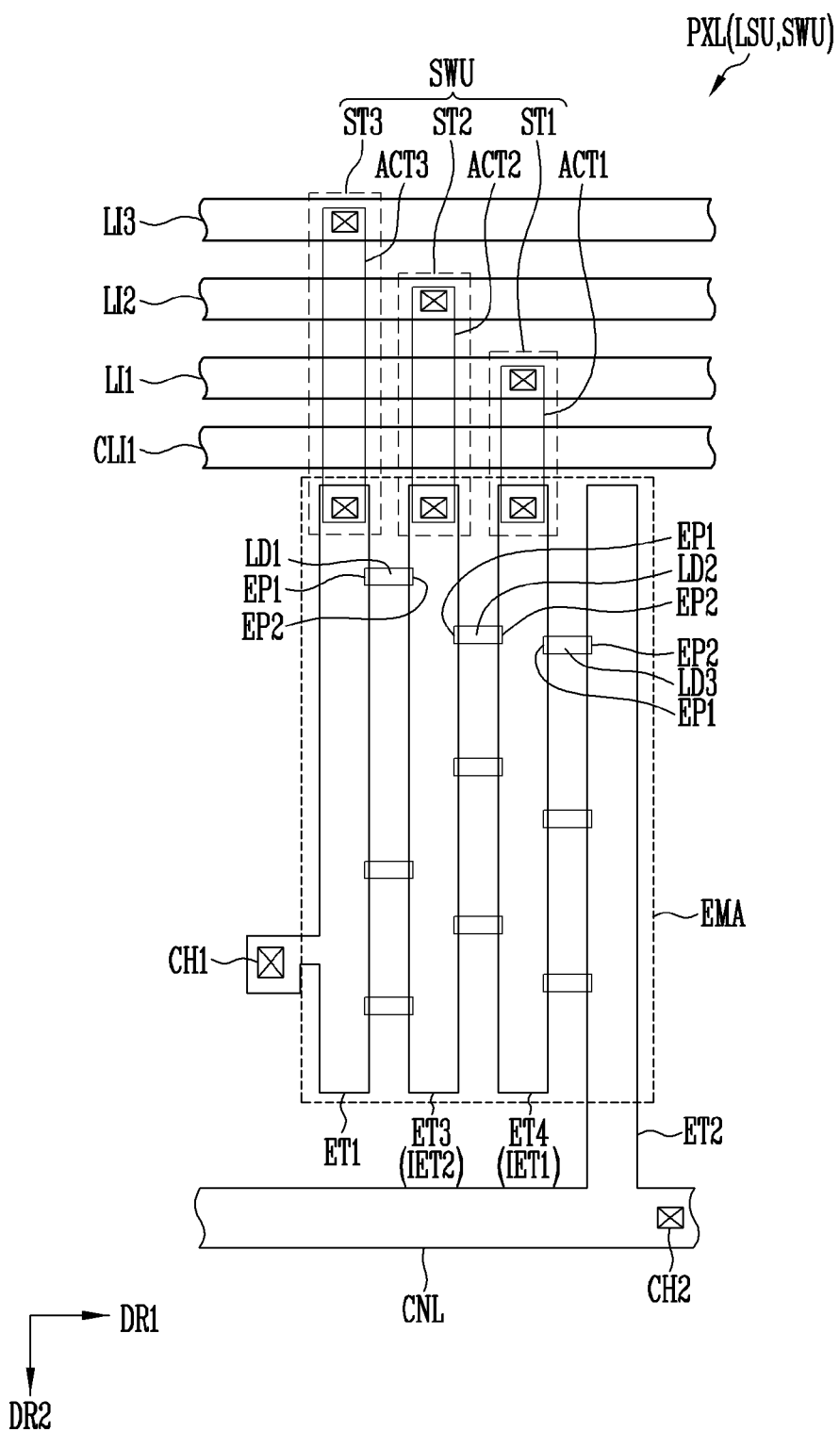
FIGS. 9A to 9D are schematic plan views each illustrating a pixel in accordance with an embodiment.
Figure 9B:
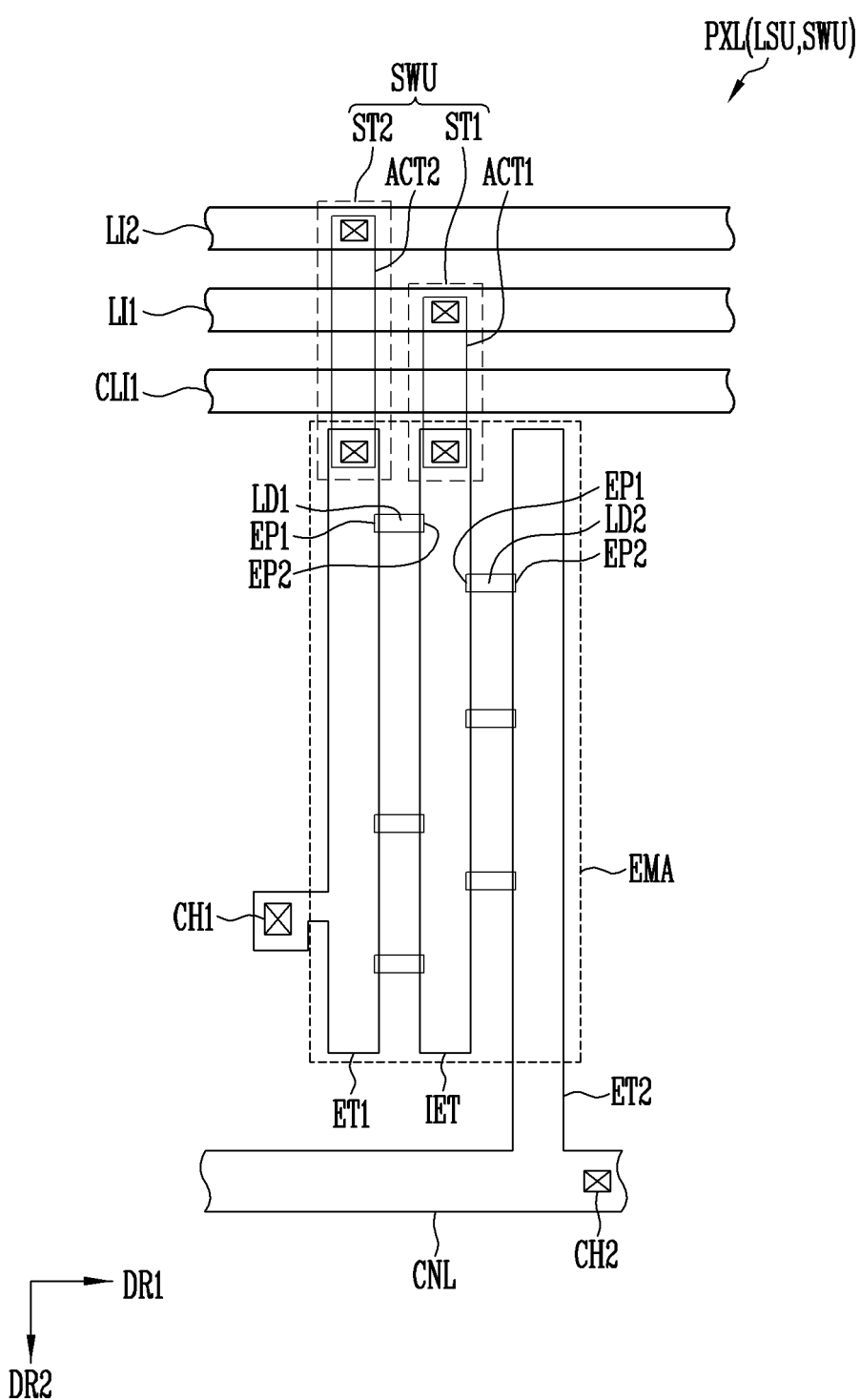

In an embodiment, FIGS. 9A to 9D illustrate the structure of the pixel PXL, centered on the light source unit LSU and the switch unit SWU of the pixel PXL in accordance with each embodiment. For example, FIGS. 9A and 9B illustrate embodiments of a planar structure of the light source unit LSU and the switch unit SWU which may be provided in the pixel PXL of FIGS. 7A and 7B, respectively.

In an embodiment, the pixel PXL may further include circuit elements which form each pixel circuit (for example, the pixel circuit PXC in accordance with any one of the embodiments of FIGS. 6A to 7D). In an embodiment, the circuit elements may be disposed on a layer different from that of the light source unit LSU. For example, the circuit elements may be disposed in a circuit layer (also referred to as "pixel circuit layer") located or disposed on one surface or on a surface of the base layer BSL, and the light source unit LSU may be disposed in a display layer disposed on the circuit layer. Furthermore, at least some or a number of elements of the switch unit SWU may be simultaneously formed on a same layer as that of the circuit elements. For example, the active layer of each of the switching elements ST may be simultaneously formed on a same layer as the semiconductor layer (also referred to as "active layer") of the transistors that form the pixel circuit PXC.

Referring to FIGS. 7A and 9A, the pixel PXL may include electrodes and light emitting elements LD which are disposed in an emission area EMA, and alignment lines may be disposed around the pixel PXL. Furthermore, the pixel PXL may further include a switch unit SWU connected between at least some or a number of the electrodes and the alignment lines.

In detail, each pixel PXL may include a first electrode ET1 and a second electrode ET2 which are disposed in the emission area EMA at positions spaced apart from each other, and at least one intermediate electrode (for example, the third electrode ET3 and the fourth electrode ET4) disposed between the first and second electrodes ET1 and ET2. For example, the first electrode ET1, at least one intermediate electrode, and the second electrode ET2 may be successively arranged or disposed in one direction or a direction in each emission area EMA. The pixel PXL may include light emitting elements LD connected between one pair of adjacent electrodes of the first electrode ET1, the second electrode ET2, and the at least one intermediate electrode. In an embodiment, the emission area EMA may be enclosed by an opaque bank structure (for example, a pixel defining layer) or the like, which is not shown.

Hereinafter, in case that an electrode among the electrodes, for example, the first to fourth electrodes ET1 to ET4, disposed in the emission area EMA is designated, the corresponding electrode will be referred to as "first electrode ET1", "second electrode ET2", "third electrode ET3", or "fourth electrode ET4". The term "electrode ET" or "electrodes ET" will be used to arbitrarily designate at least one electrode of the first to fourth electrodes ET1 to ET4 or collectively designate the electrodes.

In an embodiment, the first electrode ET1, the third electrode ET3, the fourth electrode ET4, and the second electrode ET2 may be successively arranged or disposed in a first direction DR1 in the emission area EMA in order of mention, and each may extend in a second direction DR2. For example, the first electrode ET1, the third electrode ET3, the fourth electrode ET4, and the second electrode ET2 each may have a bar-like shape extending in the second direction DR2, and may be successively arranged or disposed in the first direction DR1. In an embodiment, the first direction DR1 may refer to a horizontal direction (or an X-axis direction), and the second direction DR2 may refer to a vertical direction (or a Y-axis direction), but these may be changed in various ways. For example, in an embodiment, the first direction DR1 and the second direction DR2 may respectively refer to the vertical direction or the horizontal direction, or at least one of the first and second directions DR1 and DR2 may refer to a diagonal direction. In an embodiment, at least one area of the electrodes ET may have a curved shape such as a circular shape or an elliptical shape, and the electrodes ET may be disposed in a spiral shape or a concentric circular shape. In other words, the shape and inter-arrangement structure of the electrodes ET may be changed in various ways depending on embodiments.

In an embodiment, the electrodes ET may be spaced apart from each other at a regular interval. A uniform electric field may be formed between the electrodes ET, so that the light emitting elements LD may be more uniformly disposed in the emission area EMA. Here, the interval between the electrodes ET may be changed in various ways depending on embodiments. For example, to intensively dispose the light emitting elements LD in a specific or given area of the emission area EMA, at least one pair of electrodes spaced apart from each other at a compact interval compared to that of the other areas may be disposed in the specific or given area.

One pair of adjacent electrodes of the electrodes ET may form electrodes of each serial stage. For example, the first electrode ET1 and the third electrode ET3 may form the electrodes of the first serial stage. The third electrode ET3 and the fourth electrode ET4 may form the electrodes of the second serial stage. The fourth electrode ET4 and the second electrode ET2 may form the electrodes of the third serial stage. Although in an embodiment there has been described that the light source unit LSU has a structure in which two successive serial stages share one intermediate electrode, the electrodes of two successive serial stages may be separated from each other.

The first electrode ET1 may be connected to the first power source VDD via a first contact hole CH1, the pixel circuit PXC, and/or the first power line PL1, etc. within the spirit and the scope of the disclosure. For example, one area of the first electrode ET1 may protrude out of the emission area EMA, and the protruded one area may be connected, through the first contact hole CH1, to the first power line PL1 and a circuit element (for example, at least one transistor that forms the pixel circuit PXC of the corresponding pixel PXL) formed under or below the first electrode ET1. In an embodiment, the first contact hole CH1 may be disposed in the emission area EMA. In an embodiment, the first electrode ET1 may be connected to or directly connected to the first power line PL1, a signal line, or the like without passing through the first contact hole CH1, and/or a circuit element, or the like within the spirit and the scope of the disclosure.

The first electrode ET1 may be supplied with an alignment signal (for example, a fourth alignment signal AS4) through the switch unit SWU, etc. at the step of aligning the light emitting elements LD during the process of fabricating the display device. During a driving period for actual use of the display device, the first electrode ET1 may be connected to the first power source VDD through the pixel circuit PXC or the like within the spirit and the scope of the disclosure.

The second electrode ET2 may be connected to the second power source VSS via a connection electrode CNL, a second contact hole CH2, and/or the second power line PL2, etc. within the spirit and the scope of the disclosure. For example, the second electrode ET2 may be integrally or non-integrally connected to the connection electrode CNL and may be connected to the second power line PL2 formed thereunder through the connection electrode CNL and the second contact hole CH2. In an embodiment, in the case where the second electrode ET2 is integrally connected to the connection electrode CNL, the second electrode ET2 and the connection electrode CNL may be respectively regarded as different areas of a single electrode. In an embodiment, the second electrode ET2 may be connected to or directly connected to the second power line PL2, a signal line, or the like without passing through the connection electrode CNL and/or the second contact hole CH2, etc. within the spirit and the scope of the disclosure.

The second electrode ET2 may be supplied with an alignment signal (for example, a voltage of the second power source VSS or a first alignment signal AS1) through the second power line PL2, etc. at the step of aligning the light emitting elements LD during the process of fabricating the display device. During a driving period for actual use of the display device, the second electrode ET2 may be connected to the second power source VSS.

In an embodiment, the connection electrode CNL may be connected in common to pixels PXL. For example, the connection electrode CNL may be connected in common to pixels PXL disposed on at least one horizontal line. The second electrodes ET2 of the pixels PXL may be connected to each other. In an embodiment, the connection electrode CNL may be disposed outside the emission area EMA of each pixel PXL, but the disclosure is not limited thereto. For example, in an embodiment, at least one area of the connection electrode CNL may be disposed in the emission area EMA of each pixel PXL.

The third electrode ET3 and the fourth electrode ET4 may be successively disposed between the first electrode ET1 and the second electrode ET2, and may form each intermediate electrode. For example, the third and fourth electrodes ET3 and ET4 may be disposed at positions spaced apart from each other between the first and second electrodes ET1 and ET2, and may be successively connected between the first and second electrodes ET1 and ET2 through the light emitting elements LD.

The third and fourth electrode ET3 and ET4 may be supplied with an alignment signal (for example, second and third alignment signals) through the switch unit SWU, etc. at the step of aligning the light emitting elements LD during the process of fabricating the display device. During the driving period for actual use of the display device, the third and fourth electrodes ET3 and ET4 may be electrically connected between the first and second electrodes ET1 and ET2 through light emitting elements LD.

The light emitting elements LD may be connected between one pair of adjacent electrodes. For example, at least one first light emitting element LD1 may be connected between the first electrode ET1 and the third electrode ET3. Likewise, at least one second light emitting element LD2 may be connected between the third electrode ET3 and the fourth electrode ET4, and at least one third light emitting element LD3 may be connected between the fourth electrode ET4 and the second electrode ET2.

In an embodiment, each light emitting element LD may be a light emitting element which is made of material having an inorganic crystal structure and has a subminiature size, for example, ranging from the nanometer scale to the micrometer scale. For example, each light emitting element LD may be a subminiature rod-type light emitting element having a size ranging from the nanometer scale to the micrometer scale, as illustrated in FIGS. 1A to 3B. The size, the type, the shape, etc. of the light emitting elements LD may be changed in various ways. For example, in an embodiment, each light emitting element LD may be a light emitting element that has a core-shell structure and is fabricated by a growth scheme. Although the light emitting element having the core-shell structure is a micro light emitting element having a size ranging from the nanometer scale to the micrometer scale, the disclosure is not limited thereto.

Although in the embodiment of FIG. 9A there has been illustrated that each light emitting element LD is uniformly horizontally disposed in the first direction DR1, the disclosure is not limited thereto. For example, at least one of the light emitting elements LD may be arranged or disposed and/or connected in a diagonal direction, etc. between one pair of electrodes that form each serial stage. In an embodiment, at least one light emitting element that is not completely connected in the forward direction between one pair of electrodes may be further disposed in the emission area EMA.

In an embodiment, the light emitting elements LD may be prepared in a diffused form in a solution, and supplied to each pixel area (for example, the emission area EMA of each pixel PXL). In an embodiment, the light emitting elements LD may be supplied to each pixel area by an inkjet scheme, a slit coating scheme, or other various schemes. For example, the light emitting elements LD may be mixed with a volatile solvent and supplied to each emission area EMA. Here, if respective alignment signals (or alignment voltages) are applied to the electrodes ET, an electric field may be formed between one pair of adjacent electrodes. Hence, the light emitting elements LD are aligned between the electrodes ET. After the light emitting elements LD have been aligned, the solvent may be removed by a volatilization scheme or other schemes. In this way, the light emitting elements LD may be reliably disposed in each pixel PXL.

Each first light emitting element LD1 may include a first end EP1 (for example, a P-type end) connected to the first electrode ET1, and a second end EP2 (for example, an N-type end) connected to the third electrode ET3. In an embodiment, the first end EP1 of the first light emitting element LD1 may be brought into contact or direct contact with the first electrode ET1 and thus connected thereto, or may be connected to the first electrode ET1 through a separate contact electrode (or a conductive pattern). In an embodiment, the second end EP2 of the first light emitting element LD1 may be brought into contact or direct contact with the third electrode ET3 and thus connected thereto, or may be connected to the third electrode ET3 through a separate contact electrode (or a conductive pattern).

Each second light emitting element LD2 may include a first end EP1 (for example, a P-type end) connected to the third electrode ET3, and a second end EP2 (for example, an N-type end) connected to the fourth electrode ET4. In an embodiment, the first end EP1 of the second light emitting element LD2 may be brought into contact or direct contact with the third electrode ET3 and thus connected thereto, or may be connected to the third electrode ET3 through a separate contact electrode (or a conductive pattern). In an embodiment, the second end EP2 of the second light emitting element LD2 may be brought into contact or direct contact with the fourth electrode ET4 and thus connected thereto, or may be connected to the fourth electrode ET4 through a separate contact electrode (or a conductive pattern).

Each third light emitting element LD3 may include a first end EP1 (for example, a P-type end) connected to the fourth electrode ET4, and a second end EP2 (for example, an N-type end) connected to the second electrode ET2. In an embodiment, the first end EP1 of the third light emitting element LD3 may be brought into contact or direct contact with the fourth electrode ET4 and thus connected thereto, or may be connected to the fourth electrode ET4 through a separate contact electrode (or a conductive pattern). Likewise, the second end EP2 of the third light emitting element LD3 may be brought into contact or direct contact with the second electrode ET2 and thus connected thereto, or may be connected to the second electrode ET2 through a separate contact electrode (or a conductive pattern).

Alignment lines spaced apart from each other may be disposed around each pixel PXL. For example, the first control line CLI1 and the first to third lines LI1 to LI3 may be disposed around each pixel PXL. For example, the first control line CLI1 and the first to third lines LI1 to LI3 may be successively disposed on an upper side of the emission areas EMA of the pixels PXL. The respective positions and the inter-arrangement structure of the first control line CLI1 and the first to third lines LI1 to LI3 may be changed in various ways depending on embodiments.

The first to third lines LI1 to LI3 may be connected to at least one adjacent pixel PXL through the switch unit SWU. The first control line CLI1 may be disposed around the first to third lines LI1 to LI3. In an embodiment, an area of the first control line CLI1 may form a control electrode (for example, a gate electrode) of each of the switching elements ST that forms the switch unit SWU. The first control line CLI1 may be regarded as being connected to the pixel PXL including the switching element ST.

In an embodiment, at least one of the alignment lines may be repeatedly disposed on each horizontal line on which pixels PXL are disposed. For example, at least one alignment line may extend in the first direction DR1 parallel to each horizontal line, and be connected in common to pixels PXL disposed on the corresponding horizontal line. In an embodiment, at least one of the alignment lines may be disposed to have a structure such that the pixels PXL disposed on adjacent (for example, successive) horizontal lines share the at least one alignment line.

In an embodiment, one area of at least one of the alignment lines may be disposed in a pixel area (for example, an area including not only the emission area EMA of each pixel PXL but also a pixel circuit area in which the pixel circuit PXC of the pixel PXL is formed) in which an adjacent pixel PXL is formed, but the disclosure is not limited thereto. For example, in an embodiment, the alignment lines may be disposed between the pixels PXL not to pass through each pixel area.

The alignment lines each may be disposed on a layer identical with or different from that of the first to fourth electrodes ET1 to ET4. For example, in an embodiment, the alignment lines may be disposed on a layer identical with that of the first to fourth electrodes ET1 to ET4. In an embodiment, the alignment lines may be disposed in a circuit layer in which the pixel circuit PXC of each of the pixels PXL is formed. For example, the alignment lines may be disposed on a layer identical with that of first and second transistor electrodes (for example, source and drain electrodes) of transistors that form each pixel circuit PXC or gate electrodes of the transistor. In an embodiment, some or a number of the alignment lines may be disposed on a layer identical with that of the first to fourth electrodes ET1 to ET4, and other some or a number of the alignment lines may be disposed in the circuit layer.

The switch unit SWU may include at least one switching element ST connected to at least one electrode ET disposed in the emission area EMA. For example, the switch unit SWU may include a first switch element ST1, a second switching element ST2, and a third switching element ST3 which are respectively connected to the fourth electrode ET4, the third electrode ET3, and the first electrode ET1.

The first switching element ST1 may be connected between the fourth electrode ET4 (the first intermediate electrode IET1) and the first line LI1. For example, the first switching element ST1 may include a first active layer ACT1 which is electrically connected between the fourth electrode ET4 and the first line LI1, and an area of which overlaps the first control line CLI1. An area of the first control line CLI1 that overlaps the first active layer ACT1 may form a gate electrode of the first switching element ST1. The first switching element ST1 may be controlled by a signal (for example, a switch control signal SWS or a second bias voltage VB2) applied to the first control line CLI1.

In an embodiment, the first active layer ACT1 may be disposed on a layer different from that of the fourth electrode ET4 and the first line LI1 and electrically connected to the fourth electrode ET4 and the first line LI1 through respective contact holes. For example, the first active layer ACT1 may be a semiconductor pattern disposed on a layer identical with the semiconductor layers of the transistors that form the pixel circuit PXC of each of the pixels PXL.

The second switching element ST2 may be connected between the third electrode ET3 (the second intermediate electrode IET2) and the second line LI2. For example, the second switching element ST2 may include a second active layer ACT2 which is electrically connected between the third electrode ET3 and the second line LI2, and an area of which overlaps the first control line CLI1. The second line LI2 may be disposed around the first control line CLI1 to be adjacent to the first control line CLI1. For example, the second line LI2, along with the first control line CLI1 and the first line LI1, may be disposed in an upper side area of each pixel PXL. Furthermore, an area of the first control line CLI1 that overlaps the second active layer ACT2 may form a gate electrode of the second switching element ST2. The second switching element ST2 may be controlled by a signal (for example, a switch control signal SWS or a second bias voltage VB2) applied to the first control line CLI1. For example, in case that a switch control signal SWS having a gate-on voltage is supplied to the first control line CLI1, the second switching element ST2 may be turned on simultaneously with the first switching element ST1.

In an embodiment, the second active layer ACT2 may be disposed on a layer different from that of the third electrode ET3 and the second line LI2 and electrically connected to the third electrode ET3 and the second line LI2 through respective contact holes. For example, the second active layer ACT2 may be a semiconductor pattern disposed on a layer identical with the semiconductor layers of the transistors that form the pixel circuit PXC of each of the pixels PXL.

The third switching element ST3 may be connected between the first electrode ET1 and the third line LI3. For example, the third switching element ST3 may include a third active layer ACT3 which is electrically connected between the first electrode ET1 and the third line LI3, and an area of which overlaps the first control line CLI1. The third line LI3 may be disposed around the first control line CLI1 to be adjacent to the first control line CLI1. For example, the third line LI3, along with the first control line CLI1, the first line LI1, and the second line LI2, may be disposed in the upper side area of each pixel PXL. Furthermore, an area of the first control line CLI1 that overlaps the third active layer ACT3 may form a gate electrode of the third switching element ST3. The third switching element ST3 may be controlled by a signal (for example, a switch control signal SWS or a second bias voltage VB2) applied to the first control line CLI1. For example, in case that a switch control signal SWS having a gate-on voltage is supplied to the first control line CLI1, the third switching element ST3 may be turned on simultaneously with the first and second switching elements ST1 and ST2.

In an embodiment, the third active layer ACT3 may be disposed on a layer different from that of the first electrode ET1 and the third line LI3 and electrically connected to the first electrode ET1 and the third line LI3 through respective contact holes. For example, the third active layer ACT3 may be a semiconductor pattern disposed on a layer identical with the semiconductor layers of the transistors that form the pixel circuit PXC of each of the pixels PXL.

Referring to FIGS. 7B and 9B, in an embodiment in which the light emitting elements LD are disposed in only two serial stages, only one intermediate electrode IET which is shared by the first and second serial stages may be disposed between the first and second electrodes ET1 and ET2. Each first light emitting element LD1 may include a first end EP1 connected to the first electrode ET1, and a second end EP2 connected to the intermediate electrode IET. Likewise, each second light emitting element LD2 may include a first end EP1 connected to the intermediate electrode IET, and a second end EP2 connected to the second electrode ET2.

In the foregoing embodiment, the switch unit SWU may include a first switching element ST1 connected between the intermediate electrode IET and the first line LI1, and a second switching element ST2 connected between the first electrode ET1 and the second line LI2. For example, the first switching element ST1 may include a first active layer ACT1 which overlaps the first control line CLI1 and is electrically connected between the intermediate electrode IET and the first line LI1. For example, the second switching element ST2 may include a second active layer ACT2 which overlaps the first control line CLI1 and is electrically connected between the first electrode ET1 and the second line LI2.

Referring to FIGS. 7E, 7F, 9C, and 9D, in the case an alignment signal (for example, a third or fourth alignment signal AS3 or AS4) is applied to the first electrode ET1 using a transistor (for example, the seventh transistor T7) provided in the pixel circuit PXC, the number of switching elements ST included in the switch unit SWU may be reduced. For example, each pixel PXL may not include a switching element (for example, the third switching element ST3 of FIG. 9A or a second switching element ST2 of FIG. 9B) connected to the first electrode ET1. Since an alignment line (for example, the third line LI3 of FIG. 9A or the second line LI2 of FIG. 9B) for applying an alignment signal to the first electrode ET1 may also be removed, the number of alignment lines may also be reduced.

In an embodiment, even in case that the number of switching elements ST is maintained, the number of alignment lines may be reduced. For example, in the case where, as shown in the embodiments of FIGS. 7C and 7D, a switching element ST (for example, the third switching element ST3 of FIG. 7C or the second switching element ST2 of FIG. 7D) may be connected between the first electrode ET1 and the second electrode ET2, there is no need to form a separate alignment line for applying an alignment signal to the first electrode ET1, so that the number of alignment lines may be reduced. The active layer of the switching element ST may overlap any one adjacent first control line CLI1 or other control lines.

Figure 10:
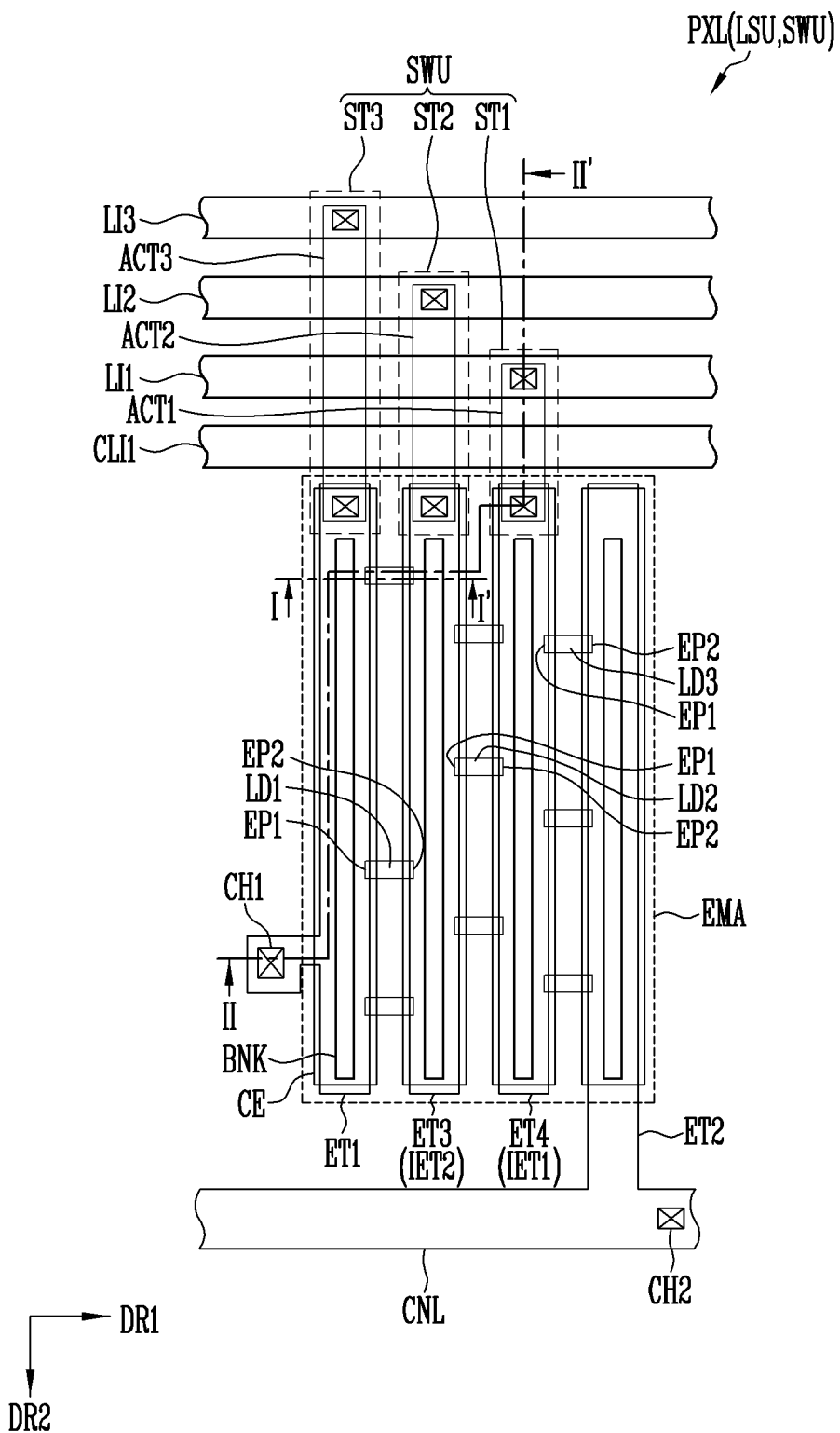
FIG. 10 is a schematic plan view illustrating a pixel in accordance with an embodiment, and for example illustrates a modification of the pixel of FIG. 9A.

FIG. 10 is a plan view illustrating a pixel PXL in accordance with an embodiment, and for example illustrates a modified embodiment of the pixel PXL of FIG. 9A. In the description of the embodiment of FIG. 10, detailed explanation of configurations similar or identical to those of the embodiments described above will be omitted.

Referring to FIG. 10, the pixel PXL may further include bank patterns BNK and/or contact electrodes CE which overlap the respective electrodes ET. For example, the pixel PXL may further include bank patterns BNK respectively disposed under or below the first to fourth electrodes ET1 to ET4, and contact electrodes CE respectively disposed over the first to fourth electrodes ET1 to ET4.

Each bank pattern BNK may be disposed under or below the corresponding electrode ET and overlap an area of the electrode ET. In an embodiment, each bank pattern BNK may be an individual pattern separated from the other bank patterns BNK, but the disclosure is not limited thereto. For example, in an embodiment, the bank patterns BNK may be integrally connected to each other and have an uneven surface which protrudes in a height direction in areas corresponding to the respective electrodes ET. Hence, the electrodes ET may protrude upward in areas corresponding to the respective bank patterns BNK. In the case where the bank patterns BNK may be formed of reflective material or at least one material layer including reflexibility is formed on sidewalls of the bank patterns BNK, light emitted from the light emitting elements LD may be controlled to more reliably travel in a frontal direction of the display device.

Each contact electrode CE may be disposed on the corresponding electrode ET and one end of at least one light emitting element LD adjacent to the electrode ET so that the electrode ET may be electrically connected to the one end of the light emitting element LD. For example, the contact electrode CE disposed on the first electrode ET1 may be electrically connected to the first electrode ET1 and the first ends EP1 of the first light emitting elements LD1. The contact electrode CE disposed on the second electrode ET2 may be electrically connected to the second electrode ET2 and the second ends EP2 of the third light emitting elements LD3. Likewise, the contact electrode CE disposed on the third electrode ET3 may be electrically connected to the third electrode ET3, the second ends EP2 of the first light emitting elements LD1, and the first ends EP1 of the second light emitting elements LD2. The contact electrode CE disposed on the fourth electrode ET4 may be electrically connected to the fourth electrode ET4, the second ends EP2 of the second light emitting elements LD2, and the first ends EP1 of the third light emitting elements LD3. In the case where the contact electrodes CE are formed, the light emitting elements LD may be more reliably connected between the electrodes ET.

FIGS. 11A to 11D are schematic cross-sectional views each illustrating a pixel PXL in accordance with an embodiment, and for example illustrate different embodiments of a cross-section of the pixel PXL corresponding to line I-I' of FIG. 10. In an embodiment, FIGS. 11A to 11D each illustrate a cross-sectional structure of each pixel PXL focused on any one first light emitting element LD1 and a peripheral area thereof, and the pixels PXL may have a substantially identical or similar cross-sectional structure in the respective serial stages. In an embodiment, the pixels PXL of the display area (DA of FIG. 5) may have substantially identical or similar cross-sectional structures. Hereinafter, an embodiment of the cross-sectional structure of each pixel PXL will be described with reference to FIGS. 11A to 11D along with FIGS. 5 to 10.

Referring to FIGS. 5 to 11D, the pixel PXL according to an embodiment and the display device including the pixel PXL may include a circuit layer PCL and a display layer DPL which are disposed to overlap each other on one surface or on a surface of the base layer BSL. For example, the display area DA may include the circuit layer PCL disposed on the one surface or on a surface of the base layer BSL, and the display layer DPL disposed on the circuit layer PCL. In an embodiment, various lines along with circuit elements which form the pixel circuit PXC of each pixel PXL may be disposed in the circuit layer PCL. The electrodes ET and the light emitting elements LD that form the light source unit LSU of each pixel PXL may be disposed in the display layer DPL. Furthermore, the switching elements ST that form the switch unit SWU of each pixel PXL, and alignment lines connected to the switching elements ST may be further disposed in the circuit layer PCL and/or the display layer DPL. Illustrative positions and/or cross-sectional structures of the alignment lines and the switching elements ST will be described with reference to FIGS. 12A and 12B.

The circuit layer PCL may include at least one circuit element electrically connected to the light emitting elements LD of each pixel PXL. For example, the circuit layer PCL may include transistors T and a storage capacitor Cst which form each pixel circuit PXC. Furthermore, the circuit layer PCL may include switching elements ST (for example, at least first switching elements ST1 of each pixel PXL) which form each switch unit SWU, or at least some or a number of portions of the switching elements ST (for example, the respective active layers of the switching elements ST).

The circuit layer PCL may further include at least one power line, at least one alignment line, and/or various signal lines which are connected to each pixel circuit PXC, the light source unit LSU, and/or the switch unit SWU. For example, the circuit layer PCL may include at least some or a number of the first power line PL1, the second power line PL2, the scan line Si and the data line Dj of each pixel PXL, the first switching element ST1 of each pixel PXL (or the first active layer ACT1 provided in the first switching element ST1), the first line LI1 connected to the first switching element ST1, and the first control line CLI1.

For the sake of explanation, FIGS. 11A to 11D representatively illustrate only a transistor T among the circuit elements and the lines that are disposed in the circuit layer PCL. Here, the planar or sectional structure of the circuit layer PCL may be changed in various ways. The positions and sectional structures of each transistor T may be changed in various ways depending on embodiments.

The circuit layer PCL may include insulating layers. For example, the circuit layer PCL may include a buffer layer BFL, a gate insulating layer GI, an interlayer insulating layer ILD, and/or a passivation layer PSV which may be successively stacked each other on one surface or on a surface of the base layer BSL. In an embodiment, the circuit layer PCL may further include at least one light shielding pattern (not shown) disposed under or below at least some or a number of transistors T.

The buffer layer BFL may prevent impurities from diffusing into each circuit element. The buffer layer BFL may be formed of a single layer, or may be formed of multiple layers having at least two layers. In the case where the buffer layer BFL has a multilayer structure, the respective layers may be formed of the same material or a similar material or different materials. Various circuit elements such as the transistors T and the storage capacitor Cst, and various lines connected to the circuit elements may be disposed on the buffer layer BFL. In an embodiment, the buffer layer BFL may be omitted. At least one circuit element and/or at least one line may be disposed on or directly disposed on one surface or on a surface of the base layer BSL.

Each transistor T may include a semiconductor layer SCL (also referred to as "semiconductor pattern" or "active layer"), a gate electrode GE, and first and second transistor electrodes TE1 and TE2. Although FIGS. 11A to 11D illustrate an embodiment in which each transistor T may include the first and second transistor electrodes TE1 and TE2 that are formed separately from the semiconductor layer SCL, the disclosure is not limited thereto. For example, in an embodiment, the first and/or second transistor electrode TE1 and/or TE2 provided in at least one transistor T may be integrated with the corresponding semiconductor layer SCL.

The semiconductor layer SCL may be disposed on the buffer layer BFL. For example, the semiconductor layer SCL may be disposed between the gate insulating layer GI and the base layer BSL on which the buffer layer BFL is formed. The semiconductor layer SCL may include a first area which comes into contact with each first transistor electrode TE1, a second area which comes into contact with each second transistor electrode TE2, and a channel area disposed between the first and second areas. In an embodiment, one of the first and second areas may be a source area, and the other may be a drain area.

In an embodiment, the semiconductor layer SCL may be a semiconductor pattern formed of polysilicon, amorphous silicon, an oxide semiconductor, etc. within the spirit and the scope of the disclosure. The channel area of the semiconductor layer SCL may be an intrinsic semiconductor, which is an undoped semiconductor pattern. Each of the first and second areas of the semiconductor layer SCL may be a semiconductor pattern doped with an impurity.

In an embodiment, the semiconductor layers SCL of the transistors T that form each pixel circuit PXC may be formed of substantially identical or similar material. For example, the semiconductor layers SCL of the transistors T may be formed of any one identical material among polysilicon, amorphous silicon, and an oxide semiconductor. In an embodiment, some or a number of the transistors T and the other transistors T may include semiconductor layers SCL formed of different materials. For example, the semiconductor layers SCL of some or a number of the transistors T may be formed of polysilicon or amorphous silicon, and the semiconductor layers SCL of the other transistors T may be formed of an oxide semiconductor.

The gate insulating layer GI may be disposed on the semiconductor layer SCL. For example, the gate insulating layer GI may be disposed between the semiconductor layer SCL and the gate electrode GE. The gate insulating layer GI may be formed of a single layer or multiple layers, and include at least one inorganic insulating material and/or at least one organic insulating material. For example, the gate insulating layer GI may include various kinds of organic or inorganic insulating materials including silicon nitride ($SiN_x$), silicon oxide ($SiO_x$), etc. within the spirit and the scope of the disclosure. The constituent material of the gate insulating layer GI is not particularly limited.

The gate electrode GE may be disposed on the gate insulating layer GI. For example, the gate electrode GE may be disposed to overlap the semiconductor layer SCL with the gate insulating layer GI interposed therebetween. Although FIGS. 11A to 11D each illustrate a transistor T having a top-gate structure, the transistor T may have a bottom-gate structure in other embodiments. The gate electrode GE may be disposed under or below the semiconductor layer SCL to overlap the semiconductor layer SCL.

The interlayer insulating layer ILD may be disposed on the gate electrode GE. For example, the interlayer insulating layer ILD may be disposed between the gate electrode GE and the first and second transistor electrodes TE1 and TE2. The interlayer insulating layer ILD may be formed of a single layer or multiple layers, and include at least one inorganic insulating material and/or at least one organic insulating material. For example, the interlayer insulating layer ILD may include various kinds of organic or inorganic insulating materials. The constituent material of the interlayer insulating layer ILD is not particularly limited.

The first and second transistor electrodes TE1 and TE2 may be disposed on each semiconductor layer SCL with at least one interlayer insulating layer ILD interposed therebetween. For example, the first and second transistor electrodes TE1 and TE2 may be disposed on respective different ends of the semiconductor layer SCL with the gate insulating layer GI and the interlayer insulating layer ILD interposed therebetween. The first and second transistor electrodes TE1 and TE2 may be electrically connected to each semiconductor layer SCL. For example, the first and second transistor electrodes TE1 and TE2 may be connected to the first and second areas of the semiconductor layer SCL through corresponding contact holes which pass through the gate insulating layer GI and the interlayer insulating layer ILD. In an embodiment, any one of the first and second transistor electrodes TE1 and TE2 may be a source electrode, and the other may be a drain electrode.

At least one transistor T provided in the pixel circuit PXC may be connected to at least one pixel electrode. For example, the first transistor T1 shown in FIG. 6F or the sixth and seventh transistors T6 and T7 shown in FIG. 7E may be electrically connected to the first electrode ET1 of the corresponding pixel PXL through a contact hole (for example, the first contact hole CH1) passing through the passivation layer PSV.

At least one power line, at least one signal line, and/or at least one alignment line that is disposed, along with the transistor T, in the circuit layer PCL may be disposed on a layer identical with that of electrodes of the circuit elements that form the pixel circuit PXC. For example, the scan line Si of each pixel PXL may be disposed on a same layer as that of the gate electrodes GE. The data line Dj of each pixel PXL may be disposed on a same layer as that of the first and second transistor electrodes TE1 and TE2 of the transistors T. Furthermore, the first power line PL1, the second power line PL2, and/or at least one alignment line each may be disposed on a same layer as that of the gate electrodes GE or the first and second transistor electrodes TE1 and TE2 of the transistors T.

In an embodiment, the circuit layer PCL may further include at least one conductive layer, which is not shown (for example, any one conductive layer in which one electrode of the storage capacitor Cst may be disposed, and which may be disposed on a layer different from the gate electrodes GE and the source and drain electrodes). At least one line connected to each pixel PXL may be disposed in the conductive layer.

A passivation layer PSV may be disposed over the lines and/or the circuit elements including the transistors T. The passivation layer PSV may be formed of a single layer or multiple layers, and include at least one inorganic insulating material and/or at least one organic insulating material. For example, the passivation layer PSV may include at least one organic insulating layer and substantially planarize the surface of the circuit layer PCL. The display layer DPL may be disposed over the passivation layer PSV.

The display layer DPL may include the light source unit LSU of each pixel PXL, and include the switch unit SWU and/or the alignment lines. For example, the display layer DPL may include electrodes ET and light emitting elements LD which are disposed in the emission area EMA of each pixel PXL and form the corresponding light source unit LSU. For example, the display layer DPL may include a first electrode ET1, a second electrode ET2, and at least one intermediate electrode (for example, the third and fourth electrodes ET3 and ET4) of each pixel PXL, and light emitting elements LD connected between the electrodes ET.

Furthermore, the display layer DPL may further include bank patterns BNK to protrude respective areas of the electrodes ET upward, and/or contact electrodes CE to more reliably connect the light emitting elements LD between the electrodes ET. The display layer DPL may further include, for example, at least one conductive layer and/or at least one insulating layer.

In an embodiment, the display layer DPL may include the bank patterns BNK, the electrodes ET of each serial stage, a first insulating layer INS1, the light emitting elements LD, an insulating pattern INP, the contact electrodes CE, and a second insulating layer INS2, which are successively disposed and/or formed over the circuit layer PCL. Furthermore, the display layer DPL may further include an overcoat layer OC over the second insulating layer INS2.

The bank patterns BNK may be disposed at positions spaced apart from each other in the emission area of each pixel PXL. The bank patterns BNK may protrude in a height direction of the base layer BSL from the one surface or a surface of the base layer BSL on which the circuit layer PCL is formed. In an embodiment, the bank patterns BNK may have substantially the same height, but the disclosure is not limited thereto.

In an embodiment, each bank pattern BNK may be disposed between the circuit layer PCL and each electrode ET (for example, any one electrode of the first to fourth electrodes ET1 to ET4). Furthermore, each bank pattern BNK may be disposed around at least one light emitting element LD adjacent thereto to face any one end of the at least one light emitting element LD (for example, the first or second end EP1 or EP2 of at least one of the first to third light emitting elements LD1 to LD3).

Figure 11A:
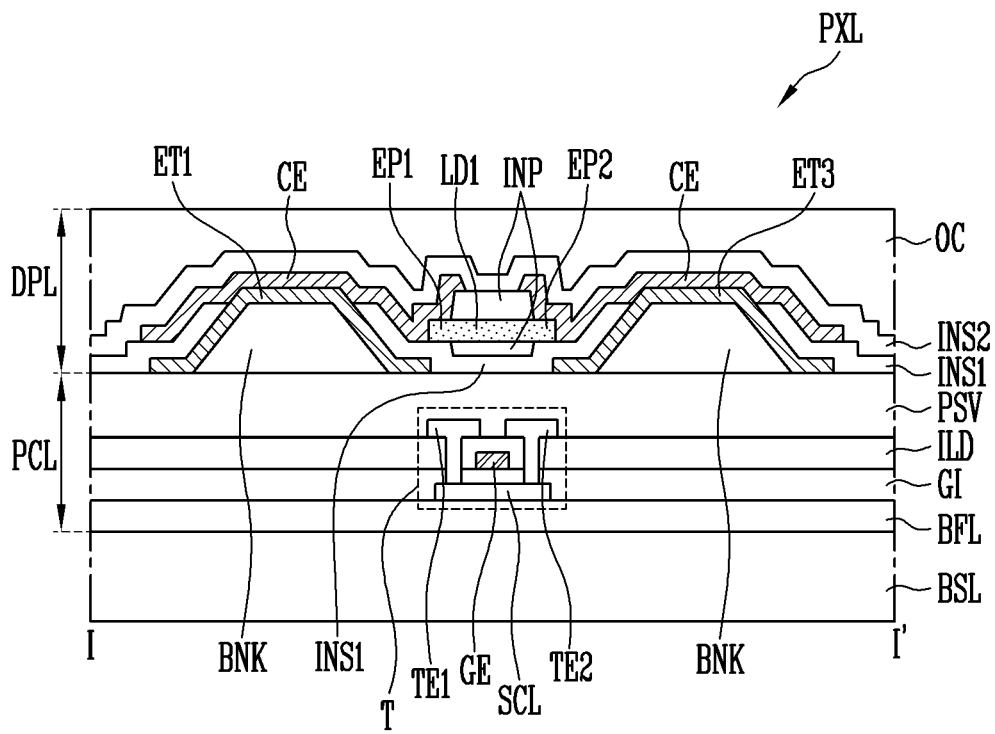
FIGS. 11A to 11D are schematic cross-sectional views each illustrating a pixel in accordance with an embodiment, and for example illustrate different embodiments of a cross-section of the pixel corresponding to line I-I' of FIG. 10.
Figure 11B:
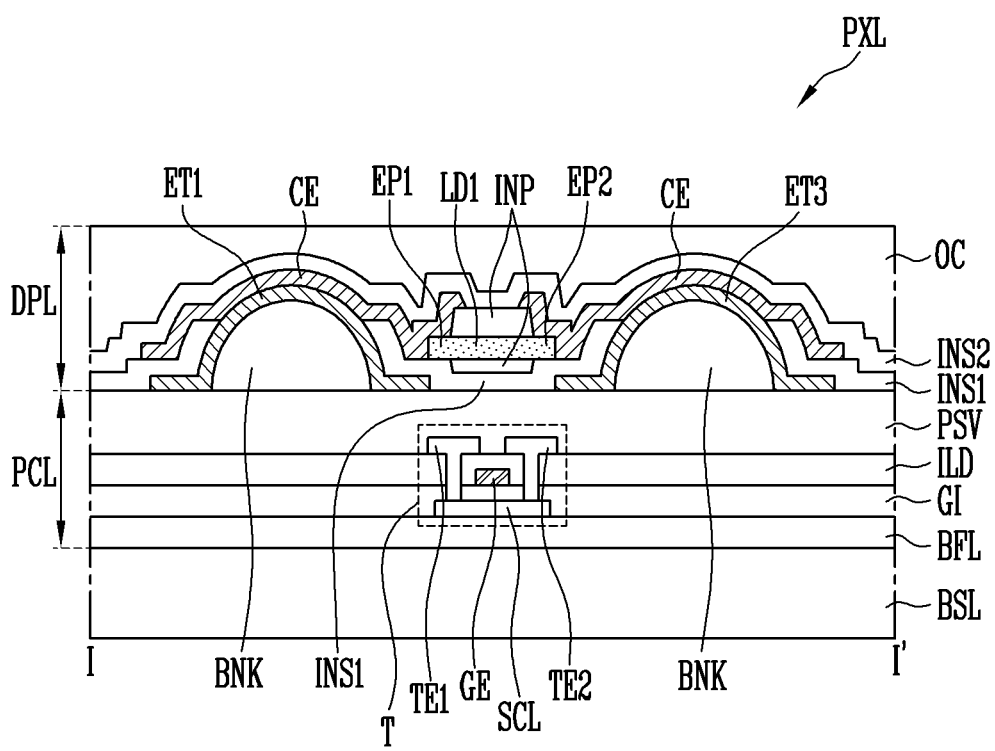
Figure 11C:
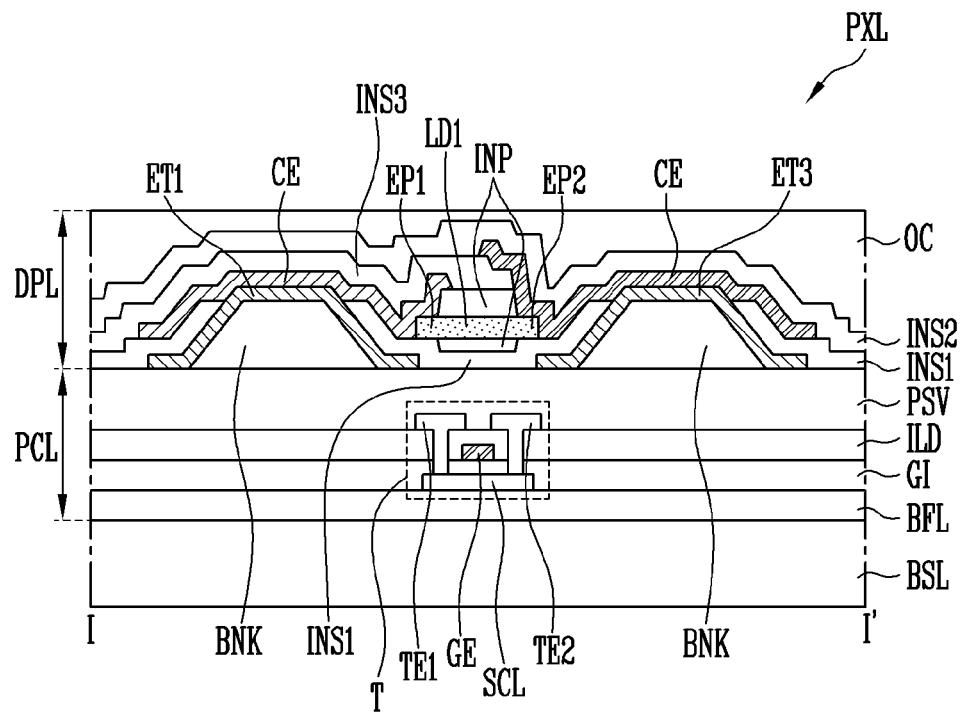
Figure 11D:
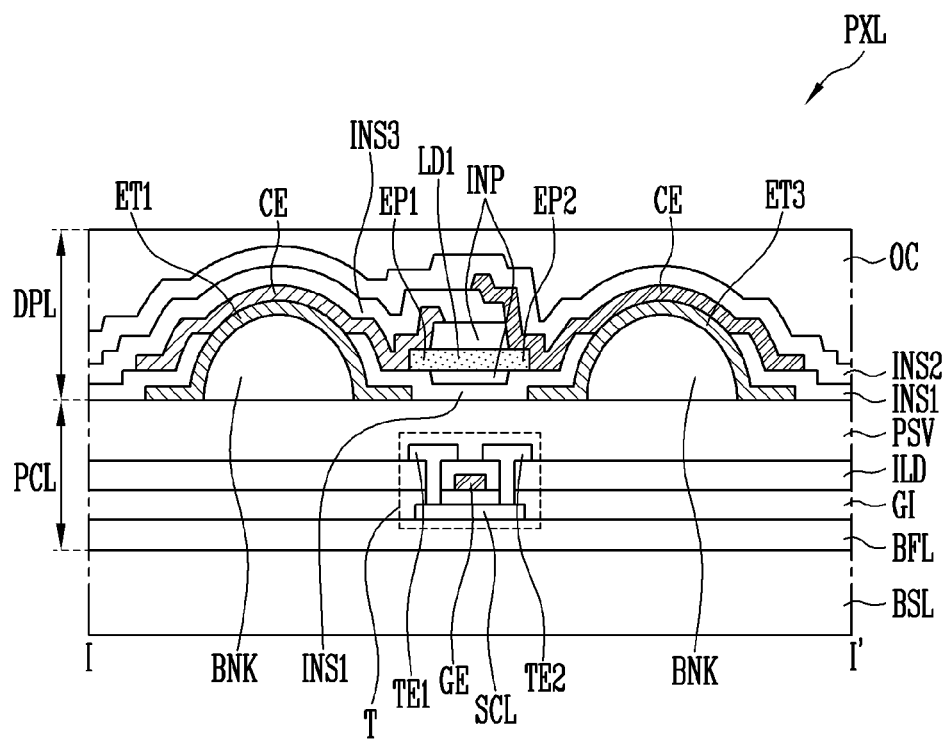

Depending on embodiments, the bank patterns BNK may have various shapes. In an embodiment, the bank patterns BNK each may have a trapezoidal cross-section which is reduced in width upward, as illustrated in FIGS. 11A and 11C. Each bank pattern BNK may have an inclined surface on at least one side or a side surface. In an embodiment, as illustrated in FIGS. 11B and 11D, the bank patterns BNK each may have a semi-circular or semi-elliptical cross-section, the width of which is gradually reduced upward. Each bank pattern BNK may have a curved surface on at least one side or a side surface. Furthermore, the respective electrodes ET and/or insulating layers disposed over the bank patterns BNK may have shapes corresponding to that of the bank patterns BNK. For example, the respective electrodes ET and/or insulating layers disposed over the bank patterns BNK may have inclined surfaces or curved surfaces in areas corresponding to the bank patterns BNK. In other words, in the disclosure, the shape of the bank patterns BNK is not particularly limited, and it may be changed in various ways. Furthermore, in an embodiment, at least one of the bank patterns BNK may be omitted, or the position thereof may be changed.

The bank patterns BNK may include insulating material including at least one inorganic material and/or at least one organic material. For example, the bank patterns BNK may include at least one inorganic layer including various inorganic insulating materials such as silicon nitride ($SiN_x$) or silicon oxide ($SiO_x$). For example, the bank patterns BNK each may include at least one organic layer and/or at least one photoresist layer containing various kinds of organic insulating materials, or may form a single- or multi-layer insulator containing organic or inorganic materials in combination. In an embodiment, the constituent material in the bank patterns BNK may be changed in various ways.

In an embodiment, the bank patterns BNK each may function as a reflector. For example, the bank patterns BNK, along with the first to fourth electrodes ET1 to ET4 provided thereover, may function as reflectors that guide light emitted from each light emitting element LD in a desired direction, thus enhancing the light efficiency of the pixel PXL.

The electrodes ET that form each serial stage of the light source unit LSU may be disposed over the bank patterns BNK. In an embodiment, the electrodes ET may have shapes corresponding to the respective bank patterns BNK. For example, each electrode ET may have an inclined surface or curved surface corresponding to that of each bank pattern BNK and protrude in the height direction of the base layer BSL. In the case of an embodiment where the bank patterns BNK are not formed, each electrode ET may be formed in a substantially planar shape on the passivation layer PSV.

Each electrode ET may include at least one conductive material. For example, each of the first to fourth electrodes ET1 to ET4 may include at least one material among at least one metal of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, conductive oxide such as indium tin oxide (ITO), indium zinc oxide (IZO), zinc oxide (ZnO), antimony zinc oxide (AZO), indium tin zinc oxide (ITZO), tin oxide ($SnO_2$), and a conductive polymer such as PEDOT, but the disclosure is not limited thereto. For example, each of the first to fourth electrodes ET1 to ET4 may include other conductive materials such as a carbon nano tube and a graphene. In other words, each of the first to fourth electrodes ET1 to ET4 may include at least one of various conductive materials to have conductivity, and the constituent material thereof is not particularly limited. Furthermore, the first to fourth electrodes ET1 to ET4 may have identical conductive material. Some or a number of the first to fourth electrodes ET1 to ET4 may include conductive material different from that of the other electrodes.

Furthermore, each electrode ET may be formed of a single layer or multiple layers. For example, each of the first to fourth electrodes ET1 to ET4 may include a reflective electrode layer including reflective conductive material. Each of the first to fourth electrodes ET1 to ET4 may further include at least one of at least one transparent electrode layer disposed over and/or under or below the reflective electrode layer, and at least one conductive capping layer covering or overlapping an upper portion of the reflective electrode layer and/or the transparent electrode layer.

In an embodiment, the reflective electrode layer may be formed of conductive material having a uniform reflectivity. For example, the reflective electrode layer may include at least one of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, but the disclosure is not limited thereto. In other words, a reflective electrode layer included in each electrode ET may be formed of various reflective conductive materials. In the case where each electrode ET may include a reflective electrode layer, the electrode ET may enable light emitted from the opposite ends of each of the light emitting elements LD, for example, the first and second ends EP1 and EP2, to travel in a direction (for example, in a frontal direction) in which an image is displayed. For example, if the respective electrodes ET have inclined or curved surfaces corresponding to the bank patterns BNK and are disposed to face the first and second ends EP1 and EP2 of the light emitting elements LD, light emitted from the first and second ends EP1 and EP2 of each of the light emitting elements LD may be reflected by the electrodes ET adjacent thereto and thus more reliably travel in the frontal direction of the display panel PNL (for example, in an upward direction of the base layer BSL). Thereby, the efficiency of light emitted from the light emitting elements LD may be enhanced.

Furthermore, the transparent electrode layer may be formed of various transparent conductive material. For example, the transparent electrode layer may include ITO, IZO or ITZO, but the disclosure is not limited thereto. In an embodiment, each electrode ET may have a triple-layer structure having a stacked structure of ITO/Ag/ITO. As such, if each electrode ET is formed of multiple layers having at least two layers, a voltage drop due to signal delay (RC delay) may be minimized. Thus, a desired voltage can be effectively transmitted to the light emitting elements LD.

Each electrode ET may include a conductive capping layer which covers or overlaps the reflective electrode layer and/or a transparent electrode layer. The reflective electrode layer, etc. of each electrode ET may be prevented from being damaged by a defect which may occur, for example, during a process of fabricating the pixel PXL. Here, the conductive capping layer may be included in each electrode ET, and may be omitted in an embodiment. Furthermore, the conductive capping layer may be regarded as a component of each electrode ET or a separate component disposed on the electrode ET.

The first insulating layer INS1 may be disposed on an area of each of the electrodes ET. For example, the first insulating layer INS1 may be formed to cover or overlap an area of each of the first to fourth electrodes ET1 to ET4, and may include an opening to expose another area of each of the first to fourth electrodes ET1 to ET4. For example, the first insulating layer INS1 may expose areas of the electrodes ET on the respective bank patterns BNK. In an embodiment, the first insulating layer INS1 may be omitted. The light emitting elements LD may be disposed on or directly disposed on the passivation layer PSV and/or one end of each of the electrodes ET.

In an embodiment, the first insulating layer INS1 may be formed to primarily cover or overlap the overall surfaces of the electrodes ET. After the light emitting elements LD are supplied and aligned on the first insulating layer INS1, the first insulating layer INS1 may be partially opened to expose one area of each electrode ET in an area over each bank pattern BNK. In an embodiment, the first insulating layer INS1 may be patterned in the form of an individual pattern which is partially disposed only under or below the light emitting elements LD after the supply and alignment of the light emitting elements LD have been completed.

The first insulating layer INS1 may be formed to cover or overlap the electrodes ET after the electrodes ET have been formed, and prevent the electrodes ET from being damaged during a subsequent process. Furthermore, the first insulating layer INS1 may stably support each light emitting element LD.

The first insulating layer INS1 may be formed of a single layer or multiple layers, and include at least one inorganic insulating material and/or at least one organic insulating material. For example, the first insulating layer INS1 may include various kinds of organic or inorganic insulating materials including silicon nitride ($SiN_x$), silicon oxide ($SiO_x$), aluminum oxide ($Al_2O_3$), etc. within the spirit and the scope of the disclosure. The constituent material of the first insulating layer INS1 is not particularly limited.

Light emitting elements LD may be supplied to and aligned in each pixel area, by way of example, the emission area EMA of each pixel PXL, in which the first insulating layer INS1 may be formed. For example, light emitting elements LD may be supplied to an emission area of each pixel PXL by an inkjet scheme, a slit coating scheme, or other various schemes. The light emitting elements LD may be aligned between the electrodes ET with directionality by alignment signals (or alignment voltages) applied to the respective electrodes ET.

In an embodiment, at least some or a number of the light emitting elements LD may be horizontally or diagonally disposed between one pair of adjacent electrodes such that the opposite ends thereof, for example, the first and second ends EP1 and EP2 thereof, overlap the one pair of electrodes. In an embodiment, at least some or a number of the light emitting elements LD may be disposed between one pair of adjacent electrodes not to overlap the pair of electrodes, and be electrically connected to the pair of electrodes through the respective contact electrodes CE. As such, at least one light emitting element LD may be disposed between one pair of electrodes that form each serial stage.

The insulating pattern INP may be disposed on areas of the light emitting elements LD. For example, the insulating pattern INP may expose the first and second ends EP1 and EP2 of the light emitting elements LD and be partially disposed over only the areas of the light emitting elements LD including respective central areas of the light emitting elements LD. Although the insulating pattern INP is formed in an independent pattern in the emission area EMA of each pixel PXL, the disclosure is not limited thereto. The insulating pattern INP may be omitted depending on embodiments. The opposite ends of the contact electrodes CE may be disposed on or directly disposed on the first and second ends EP1 and EP2 of the light emitting elements LD adjacent thereto.

The insulating pattern INP may be formed of a single layer or multiple layers, and include at least one inorganic insulating material and/or at least one organic insulating material. For example, the insulating pattern INP may include various kinds of organic or inorganic insulating materials including silicon nitride ($SiN_x$), silicon oxide ($SiO_x$), aluminum oxide ($Al_2O_3$), photoresist (PR) material, etc. within the spirit and the scope of the disclosure. The constituent material of the insulating pattern INP is not particularly limited.

After the alignment of the light emitting elements LD has been completed, the insulating pattern INP is formed on the light emitting elements LD so that the light emitting elements LD may be prevented from being removed from the aligned position. Furthermore, in the case where space is present between the first insulating layer INS1 and the light emitting elements LD, the space may be filled with the insulating material drawn thereinto during a process of forming the insulating pattern INP. Consequently, the light emitting elements LD may be more stably supported. Here, the space may not be completely filled, for example, depending on the material of the first insulating layer INS1. For example, the insulating pattern INP may be formed only over the light emitting elements LD, or may be formed both over and under or below the light emitting elements LD.

The opposite ends of the light emitting elements LD, for example, the first and second ends EP1 and EP2, which are not covered with or overlapped by the insulating pattern INP, may be respectively covered with or overlapped by the contact electrodes CE. For example, respective one ends of the adjacent contact electrodes CE may be disposed, at positions spaced apart from each other, on the first and second ends EP1 and EP2 of at least one adjacent light emitting element LD, with the insulating pattern INP interposed therebetween.

In an embodiment, the contact electrodes CE may be simultaneously formed on a same layer on one surface or on a surface of the base layer BSL, as illustrated in FIGS. 11A and 11B. Hence, a process of fabricating the pixel PXL and the display device including the pixel PXL may be simplified.

In an embodiment, the contact electrodes CE may be divided into groups and successively formed on different layers on one surface or on a surface of the base layer BSL by groups. For example, as illustrated in FIGS. 11C and 11D, one pair of adjacent contact electrodes CE may be successively formed on different layers on one surface or on a surface of the base layer. An additional third insulating layer INS3 may be disposed between the one pair of contact electrodes CE. In other words, the positions and relative disposition relationship of the contact electrodes CE may be changed in various ways.

Furthermore, the contact electrodes CE may be disposed over the electrodes ET to cover or overlap the respective exposed areas of the electrodes ET. For example, the contact electrodes CE may be disposed on at least areas of the respective electrodes ET to come into contact with the respective electrodes ET. Therefore, the contact electrodes CE may be electrically connected to the electrodes ET respectively disposed thereunder or therebelow. Each of the electrodes ET may be electrically connected to the first or second end EP1 or EP2 of at least one adjacent light emitting element LD through the contact electrodes CE.

In an embodiment, the contact electrodes CE may be formed of various transparent conductive materials. For example, the contact electrodes CE may include at least one of various conductive materials, for example, ITO, IZO, and ITZO, and may be substantially transparent or semi-transparent to satisfy a transmittancy. Hence, light emitted from the light emitting elements LD through the first and second ends EP1 and EP2 may be emitted out of the display device through the contact electrodes CE.

The second insulating layer INS2 may be disposed on the contact electrodes CE. For example, the second insulating layer INS2 may be formed and/or disposed on the overall surface of the display area DA to cover or overlap the bank patterns BNK, the electrodes ET, the light emitting elements LD, the insulating pattern INP, and the contact electrodes CE that are formed in each emission area EMA. The second insulating layer INK may include at least one inorganic layer and/or at least one organic layer.

In an embodiment, the second insulating layer INS2 may include a thin-film encapsulation layer having a multi-layered structure. For example, the second insulating layer INS2 may be formed of a thin-film encapsulation layer having a multilayer structure including at least two inorganic insulating layers, and at least one organic insulating layer interposed between the at least two inorganic insulating layers. Here, the constituent material and/or structure of the second insulating layer INS2 may be changed in various ways. In an embodiment, at least one overcoat layer OC, and/or an encapsulation substrate, etc., may be further disposed over the second insulating layer INS2.

In an embodiment, the second insulating layer INS2 and the overcoat layer OC each may be formed of a single layer or multiple layers, and include at least one inorganic insulating material and/or at least one organic insulating material. For example, the second insulating layer INS2 and the overcoat layer OC each may include various kinds of organic or inorganic insulating materials.

Figure 12A:
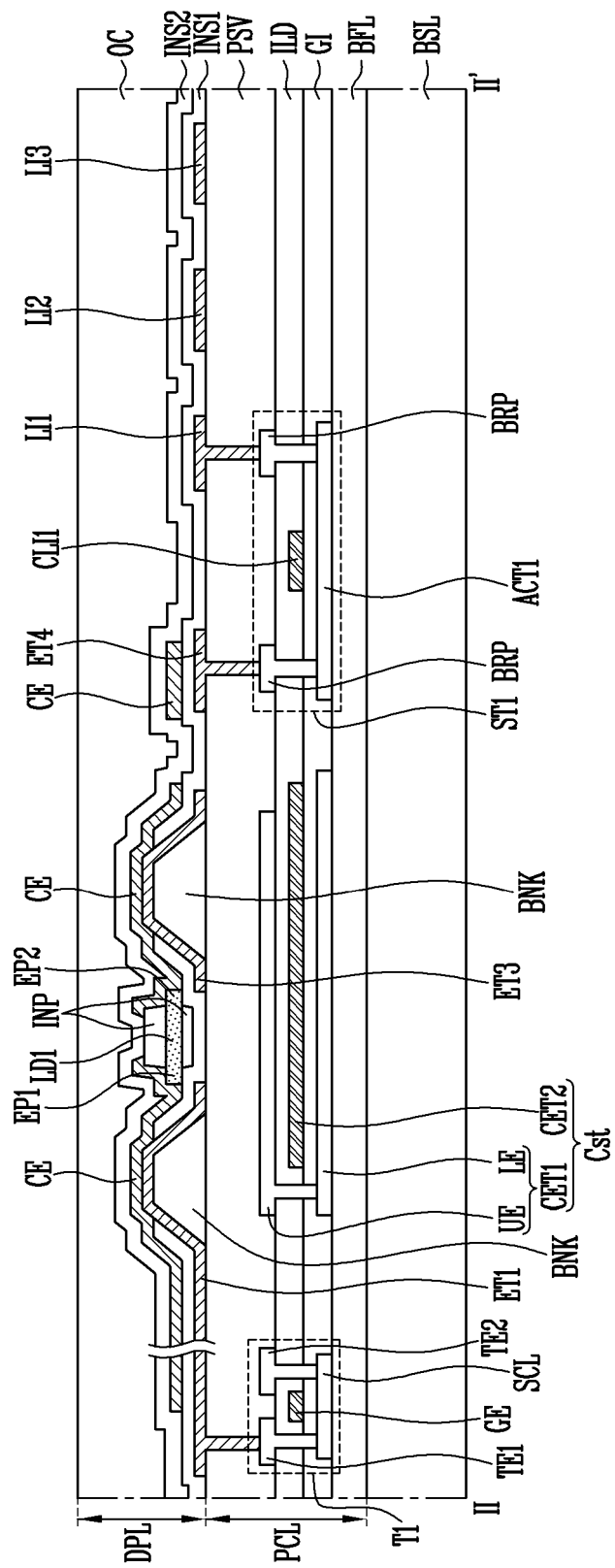
FIGS. 12A and 12B are schematic cross-sectional views each illustrating a pixel in accordance with an embodiment, and for example illustrate different embodiments of a cross-section of the pixel corresponding to line II-II' of FIG. 10.
Figure 12B:
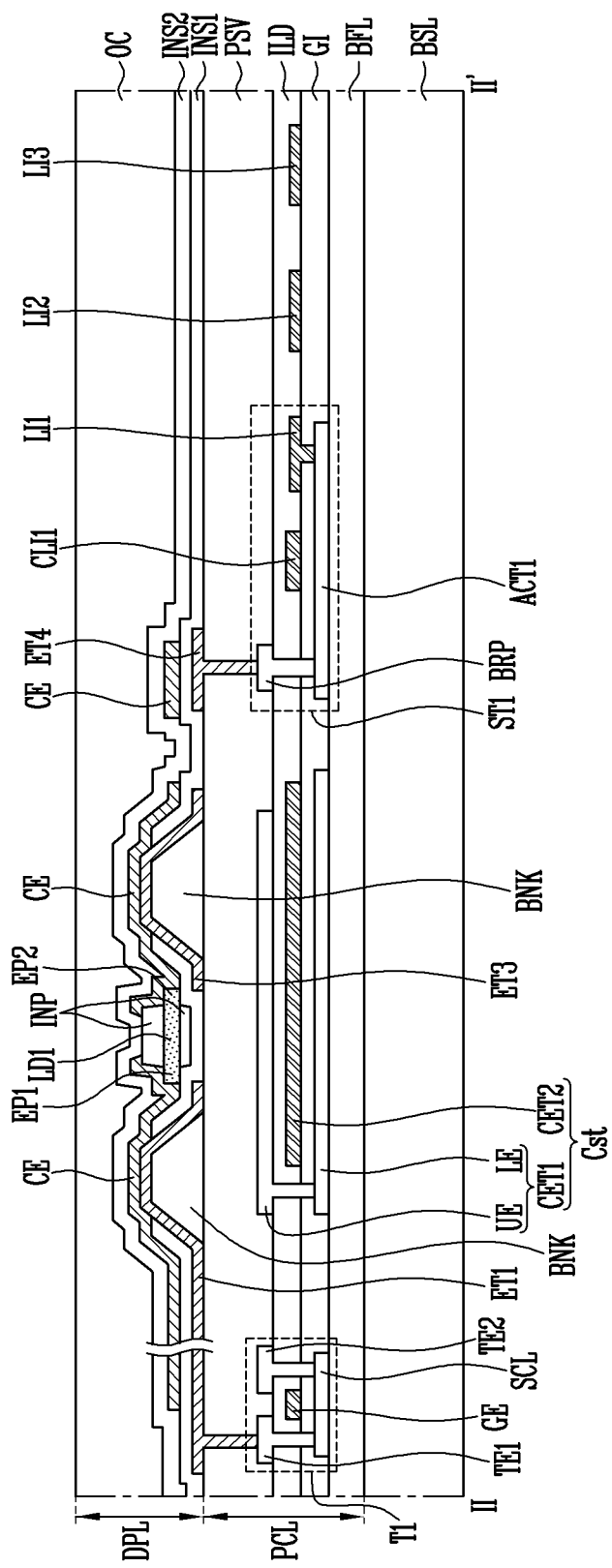

FIGS. 12A and 12B are schematic cross-sectional views each illustrating a pixel PXL in accordance with an embodiment, and for example illustrate different embodiments of a cross-section of the pixel PXL corresponding to line II-II' of FIG. 10. In detail, compared to the embodiment of FIG. 12A, the positions of some or a number of alignment lines (for example, first to third lines LI1 to LI3) may be changed in the embodiment of FIG. 12B. In the description of the embodiment of FIGS. 12A and 12B, like reference numerals will be used to designate components similar or equal to those of the previous embodiments, and detailed explanation thereof will be omitted.

Referring to FIGS. 5 to 12B, the alignment lines and the switching elements ST may be disposed in the circuit layer PCL and/or the display layer DPL. For example, the switching elements ST including the first switching element ST1 of each pixel PXL may be disposed in the circuit layer PCL. Each alignment line may be disposed in the circuit layer PCL or the display layer DPL.

In an embodiment, as shown in FIG. 12A, the first control line CLI1 along with the switching elements ST may be disposed in the circuit layer PCL. The first to third lines LI1 to LI3 along with the electrodes ET of the light source unit LSU may be disposed in the display layer DPL. For example, the first control line CLI1 may be simultaneously formed on a layer identical with that of the gate electrodes GE of the transistors T or simultaneously formed on a layer identical with that of the first and second transistor electrodes TE1 and TE2 of the transistors T. The first control line CLI1 may be formed on another conductive layer in the circuit layer PCL.

In an embodiment, as illustrated in FIG. 12B, the first control line CLI1 and the first to third lines LI1 to LI3 all may be disposed in the circuit layer PCL. In an embodiment, the first control line CLI1 and the first to third lines LI1 to LI3 all may be disposed in the display layer DPL. In other words, the position of each of the alignment lines may be changed in various ways depending on embodiments.

The circuit layer PCL may include a transistor T, for example, transistors T including the first transistor T1, connected to the first electrode ET1 of each pixel PXL through the first contact hole CH1, and circuit elements including the storage capacitor Cst. Furthermore, the circuit layer PCL may further include at least one switching element (for example, at least the first switching element ST1) which forms each switch unit SWU. For example, the circuit layer PCL may include switching elements ST including the first switching elements ST1 of the pixels PXL.

The storage capacitor Cst may include a first capacitor electrode CET1 and a second capacitor electrode CET2 which overlap each other. In an embodiment, each of the first and second capacitor electrodes CET1 and CET2 may be formed of a single layer or multiple layers. Furthermore, at least one of the first and second capacitor electrodes CET1 and CET2 may be disposed on a layer identical with that of at least one electrode of the first transistor T1 or the semiconductor layer SCL.

For example, the first capacitor electrode CET1 may be formed of a multilayer electrode including a lower electrode LE disposed on a layer identical with that of the semiconductor layer SCL of the first transistor T1, and an upper electrode UE disposed on a layer identical with that of the first and second transistor electrodes and TE2 of the first transistor T1 and electrically connected to the lower electrode LE. In an embodiment, the lower electrode LE may be a semiconductor pattern doped with an impurity. The second capacitor electrode CET2 may be formed of a single layer electrode which is disposed on a layer identical with that of the gate electrode of the first transistor T1 and overlaps the lower electrode LE and the upper electrode UE of the first capacitor electrode CET1. At the step of forming the first transistor T1, etc., the storage capacitor Cst may be formed simultaneously therewith.

The disclosure is not limited thereto. The structure and/or position of each of the first and second capacitor electrodes CET1 and CET2 may be changed in various ways. For example, in an embodiment, any one of the first and second capacitor electrodes CET1 and CET2 may include at least one layer or a layer of conductive pattern disposed on a layer different from that of the electrodes (for example, the gate electrode GE, and the first and second transistor electrodes TE1 and TE2) and the semiconductor layer SCL that form the first transistor T1.

The switching elements ST may have cross-sectional structures substantially identical with or similar to each other. In an embodiment, the switching elements ST may have a cross-sectional structure substantially identical or similar to that of the transistors T constituting the pixel circuit PXC. For example, the first switching element ST1 may include a first active layer ACT1 disposed on a layer identical with the semiconductor layers SCL of the transistors T. Likewise, the second and third switching elements ST2 and ST3 may respectively include second and third active layers ACT2 and ACT3 disposed on a layer identical with the semiconductor layers SCL of the transistors T.

The first active layer ACT1 may overlap an area of the first control line CLI1. The area of the first control line CLI1 may form the gate electrode of the first switching element ST1. Likewise, the second and third active layers ACT2 and ACT3 may overlap other areas of the first control line CLI1. The other areas of the first control line CLI1 may form the respective gate electrodes of the second and third switching elements ST2 and ST3.

An area of the first active layer ACT1 may be electrically connected to the fourth electrode ET4 disposed in the display layer DPL via at least one contact hole, etc. within the spirit and the scope of the disclosure. Another area of the first active layer ACT1 may be connected to the first line LI1 disposed in the display layer DPL via at least another contact hole, etc. within the spirit and the scope of the disclosure.

In an embodiment, as illustrated in FIG. 12A, different areas of the first active layer ACT1 may be respectively connected to the fourth electrode ET4 and the first line LI1 via respective bridge patterns BRP. In an embodiment, as illustrated in FIG. 12B, an area of the first active layer ACT1 may be connected to the fourth electrode ET4 via a bridge pattern BRP, and another area of the first active layer ACT1 may be connected to or directly connected to the first line LI1. In an embodiment, the bridge pattern BRP may be disposed on a layer identical with that of the first and second transistor electrodes and TE2, and the position of the bridge pattern BRP may be changed in various ways.

Likewise, the second and third active layers ACT2 and ACT3 may be respectively connected between the third electrode ET3 and the second line LI2 and between the first electrode ET1 and the third line LI3, through at least one bridge pattern BRP or without passing therethrough. In other words, a connection structure between each switching element ST, and each electrode ET and an alignment line that correspond to the switching element ST may be changed in various ways.

Figure 13:
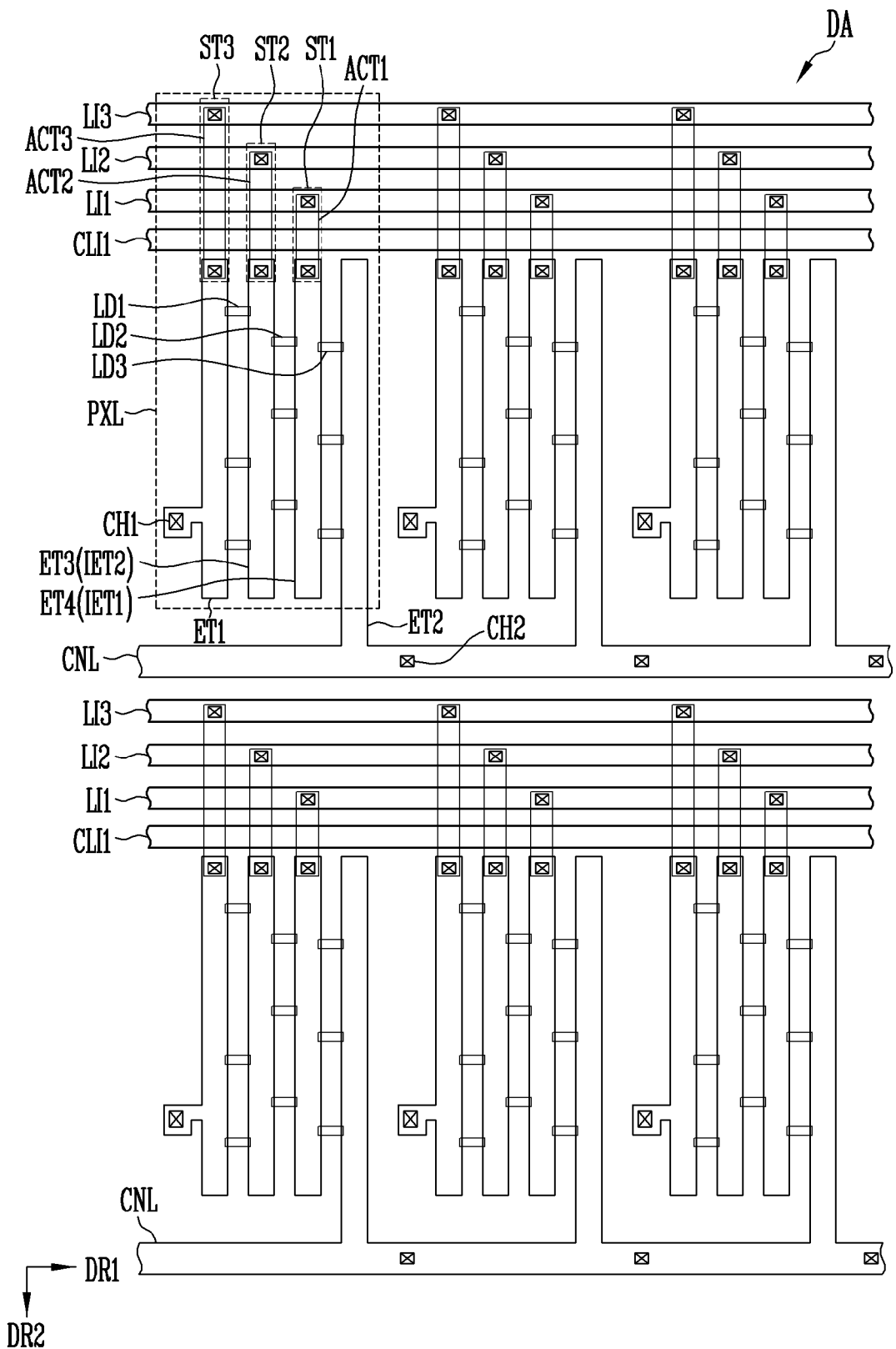
FIGS. 13 to 18 are schematic plan views each illustrating a display area in accordance with an embodiment, and for example illustrate different embodiments pertaining to an inter-arrangement structure of alignment lines and pixels.

FIGS. 13 to 18 are plan views each illustrating a display area DA in accordance with an embodiment, and for example illustrate different embodiments pertaining to an inter-arrangement structure of alignment lines and pixels PXL. In an embodiment, FIG. 13 illustrates an area of the display area DA including the pixel PXL in accordance with the embodiment of FIG. 9A, and FIGS. 14 to 18 illustrate modifications of the embodiment of FIG. 13. Each embodiment may be implemented alone, or combined with at least another embodiment to make various combinations of embodiments, and the structure of the pixel PXL may be changed in various ways as described in the various embodiments described above. In the following descriptions of the embodiments of FIGS. 13 to 18, detailed explanation of configuration (for example, the structure of each pixel PXL) similar or equal to that of the embodiments described above may be omitted.

Referring to FIGS. 5 to 13, the display area DA may include horizontal lines each including pixels PXL. The display area DA may have a structure in which an identical structure is repeated on every horizontal line.

For example, the pixels PXL may have a substantially identical structure and be regularly arranged or disposed in the first and second directions DR1 and DR2. The alignment lines may be disposed on each horizontal line. At the alignment step of aligning the light emitting elements LD, alignment lines which are supplied with an identical signal may be connected to each other inside and/or outside of the display area DA. For example, the first control lines CLI1 that are repeatedly disposed on the respective horizontal lines may be connected to each other inside and/or outside of the display area DA. Likewise, among the first lines LI1, the second lines LI2, and the third lines LI3 that are repeatedly disposed on the respective horizontal lines, lines which are supplied with an identical signal may be connected to each other.

Each alignment line may be connected in common to pixels PXL. For example, each of the first control line CLI1, the first line LI1, the second line LI2, and the third line LI3 that are disposed on each horizontal line may be connected in common to the pixels PXL of at least one horizontal line.

In an embodiment, the alignment lines may be disposed adjacent to ends (for example, upper ends) of the first to fourth electrodes ET1 to ET4 that form the light source unit LSU of each pixel PXL. For example, the alignment lines may be arranged or disposed to be successively spaced apart from each other in the second direction DR2 from the ends of the first to fourth electrodes ET1 to ET4. Each of the alignment lines may extend in the first direction DR1 in which the pixels PXL of each horizontal line are arranged or disposed, and may be connected in common to the pixels PXL of the corresponding horizontal line.

Figure 14:
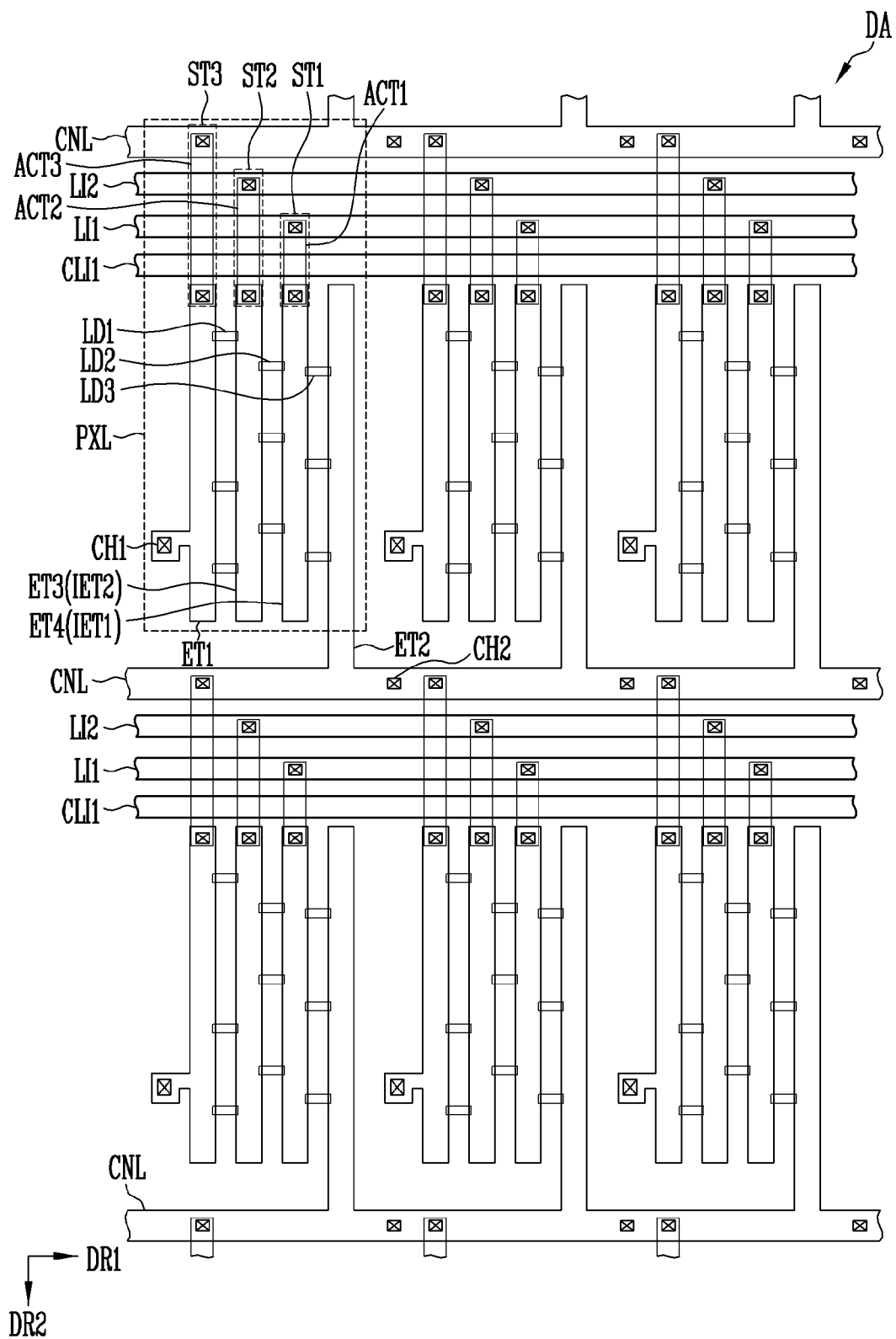

Referring to FIG. 14, each third switching element ST3 may be connected between an adjacent connection electrode CNL and the first electrode ET1. For example, in the case where, as shown in the embodiment of FIG. 7C, each third switching element ST3 may be connected between the first electrode ET1 and the second electrode ET2, the third line LI3 illustrated in the embodiment of FIG. 13, etc. may be omitted. The third switching element ST3 may be connected to any one adjacent connection electrode CNL (for example, the connection electrode CNL connected to the pixels PXL of the previous horizontal line or the connection electrode CNL connected to the pixels PXL of the corresponding horizontal line), or may be connected to the second electrode ET2 of an adjacent pixel PXL (for example, the second electrode ET2 of the pixel PXL disposed on the previous horizontal line or the second electrode ET2 of the corresponding pixel PXL). In an embodiment, the second electrodes ET2 of the pixels PXL disposed in the display area DA may be connected to each other through the respective connection electrodes CNL. The respective connection electrodes CNL of the horizontal lines may be connected to each other inside and/or outside of the display area DA.

Figure 9C:
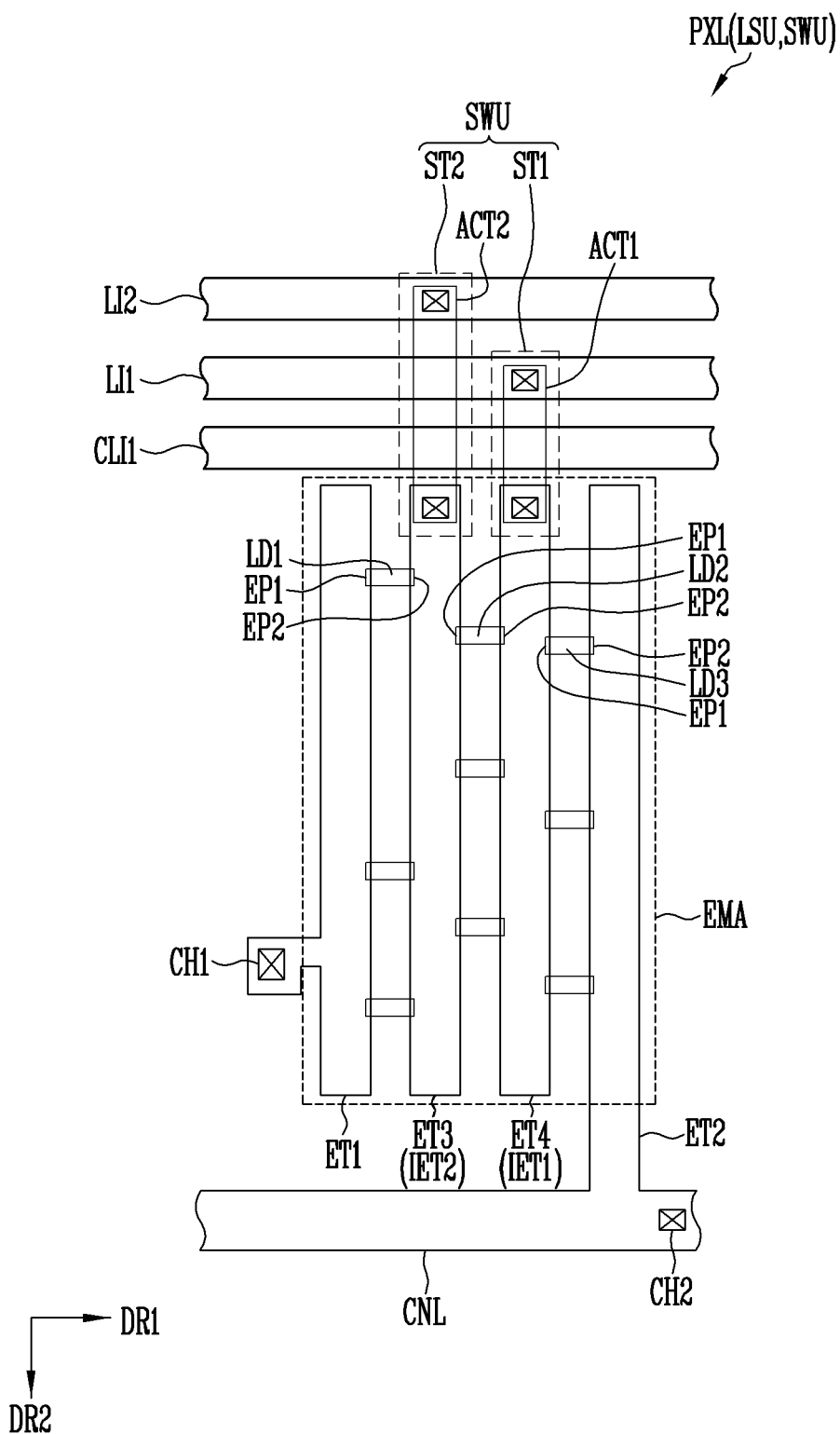
Figure 9D:
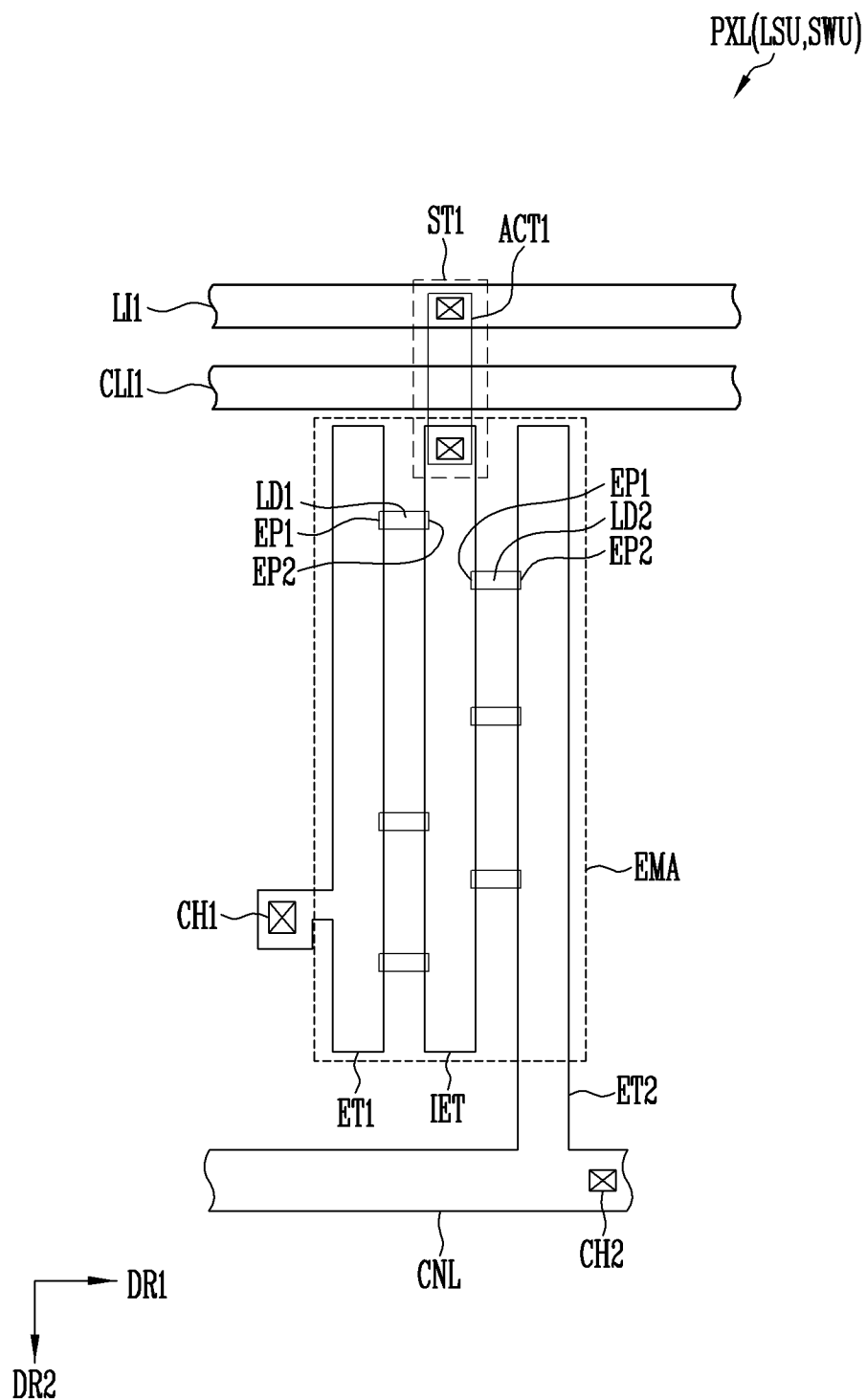
Figure 15:
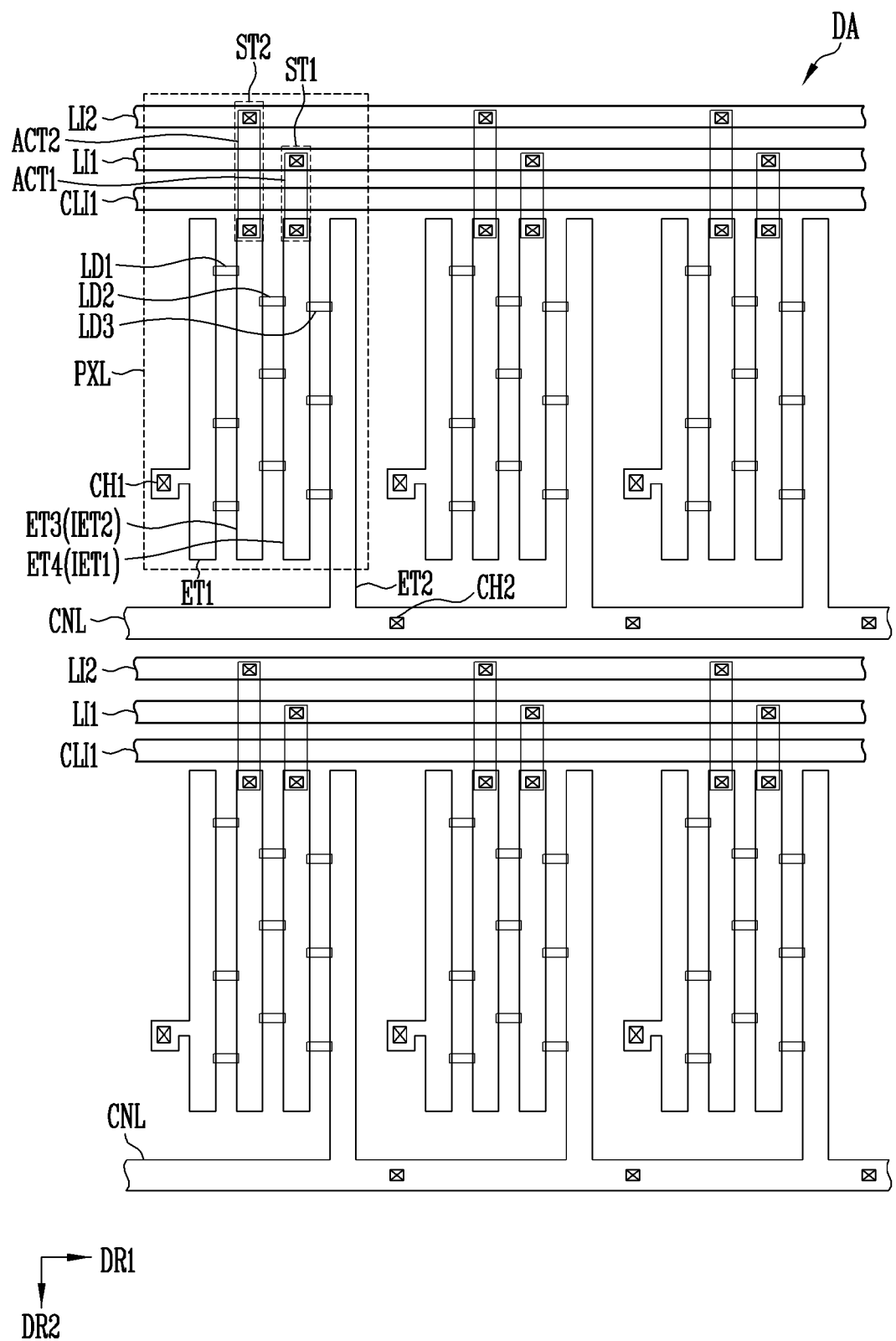

Referring to FIG. 15, compared to the embodiment of FIG. 13, the third switching element ST3 and the third line LI3 connected thereto may be omitted. For example, in the case where, as illustrated in the embodiments of FIGS. 7E and 9C, an alignment signal (for example, a fourth alignment signal AS4) is applied to the first electrode ET1 by a transistor (for example, the seventh transistor T7) provided in each pixel circuit PXC, the third switching element ST3 and the third line LI3 connected thereto may not be formed.

Figure 16:
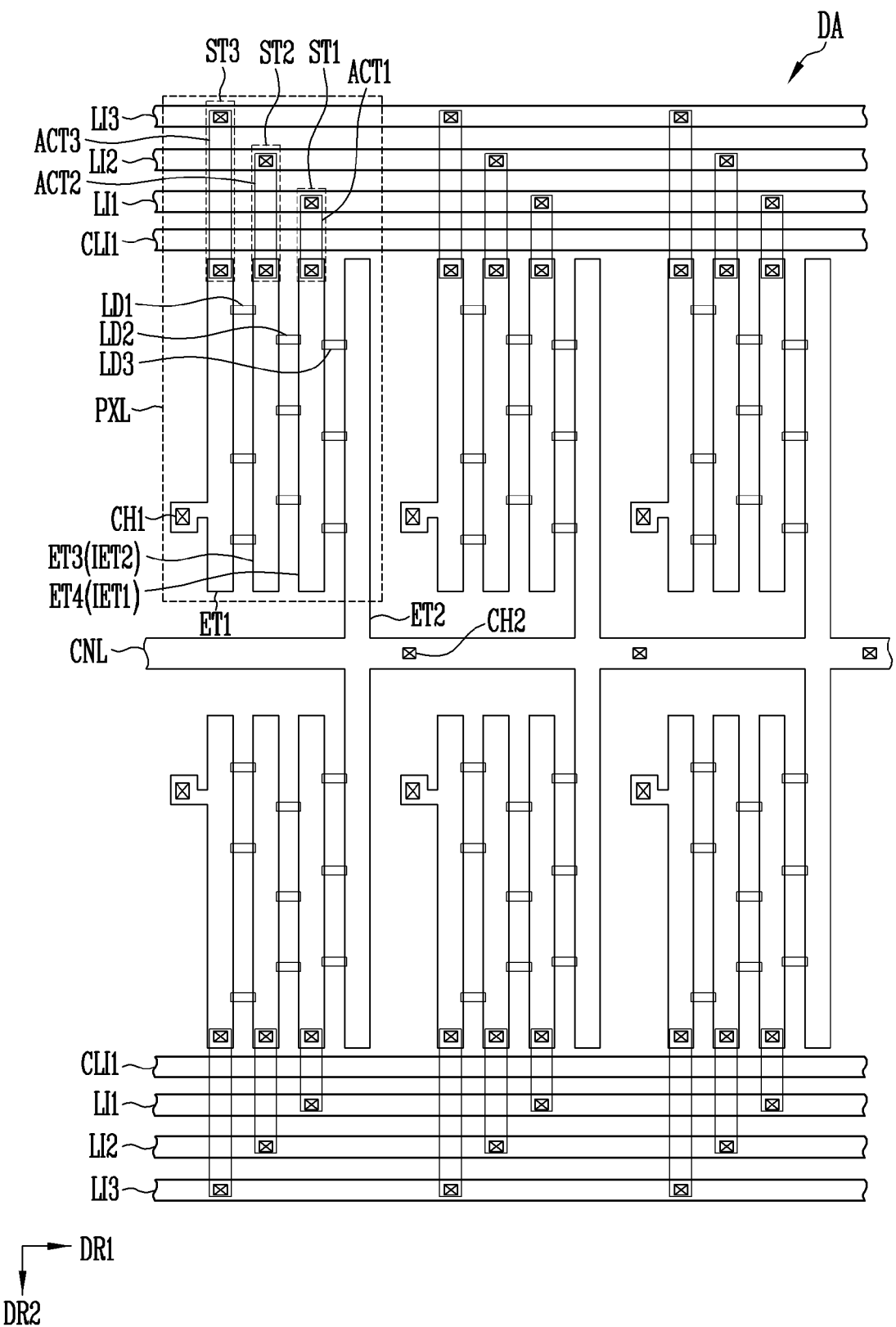

Referring to FIG. 16, one pair of successive horizontal lines may have structures symmetrical to each other. For example, alignment lines (for example, the first control line CLI1 and the first to third lines LI1 to LI3) connected to the pixels PXL of any one horizontal line (for example, each odd-number-th horizontal line) may be disposed opposite to alignment lines connected to the pixels PXL of a subsequent horizontal line (for example, each even-number-th horizontal line), with the pixels PXL of the any one horizontal line and the pixels PXL of the subsequent horizontal line interposed therebetween.

Furthermore, the switching elements ST included in the one pair of horizontal lines may have shapes and/or structures symmetrical to each other. For example, the first switching element ST1 included in the pixels PXL of the any one horizontal line may have a shape symmetrical to the first switching elements ST1 included in the subsequent horizontal line.

In an embodiment, the pixels PXL included in the one pair of horizontal lines may also have a symmetrical shape and/or structure. For example, the first electrodes ET1, the second electrodes ET2, and the intermediate electrodes (for example, the third and fourth electrodes ET3 and ET4) included in the pixels PXL of the any one horizontal line may have shapes symmetrical to the first electrodes ET1, the second electrodes ET2, and the intermediate electrodes included in the pixels PXL of the subsequent horizontal line. In an embodiment, even if the alignment lines and the switching elements ST corresponding to the one pair of horizontal lines have symmetrical shapes, the pixels PXL may have shapes and/or structures which is equally repeated on each horizontal line.

In an embodiment, in the case where the pixels PXL included in the one pair of horizontal lines have shapes and/or structures symmetrical to each other, only one connection electrode CNL may be disposed between the pair of horizontal lines, and the pixels PXL included in the one pair of horizontal lines may share the one connection electrode CNL. In an embodiment, in the case where the pixels PXL included in the one pair of horizontal lines have shapes and/or structures symmetrical to each other, each connection electrode CNL corresponding to the pixels PXL of each horizontal line may be individually formed.

Figure 17:
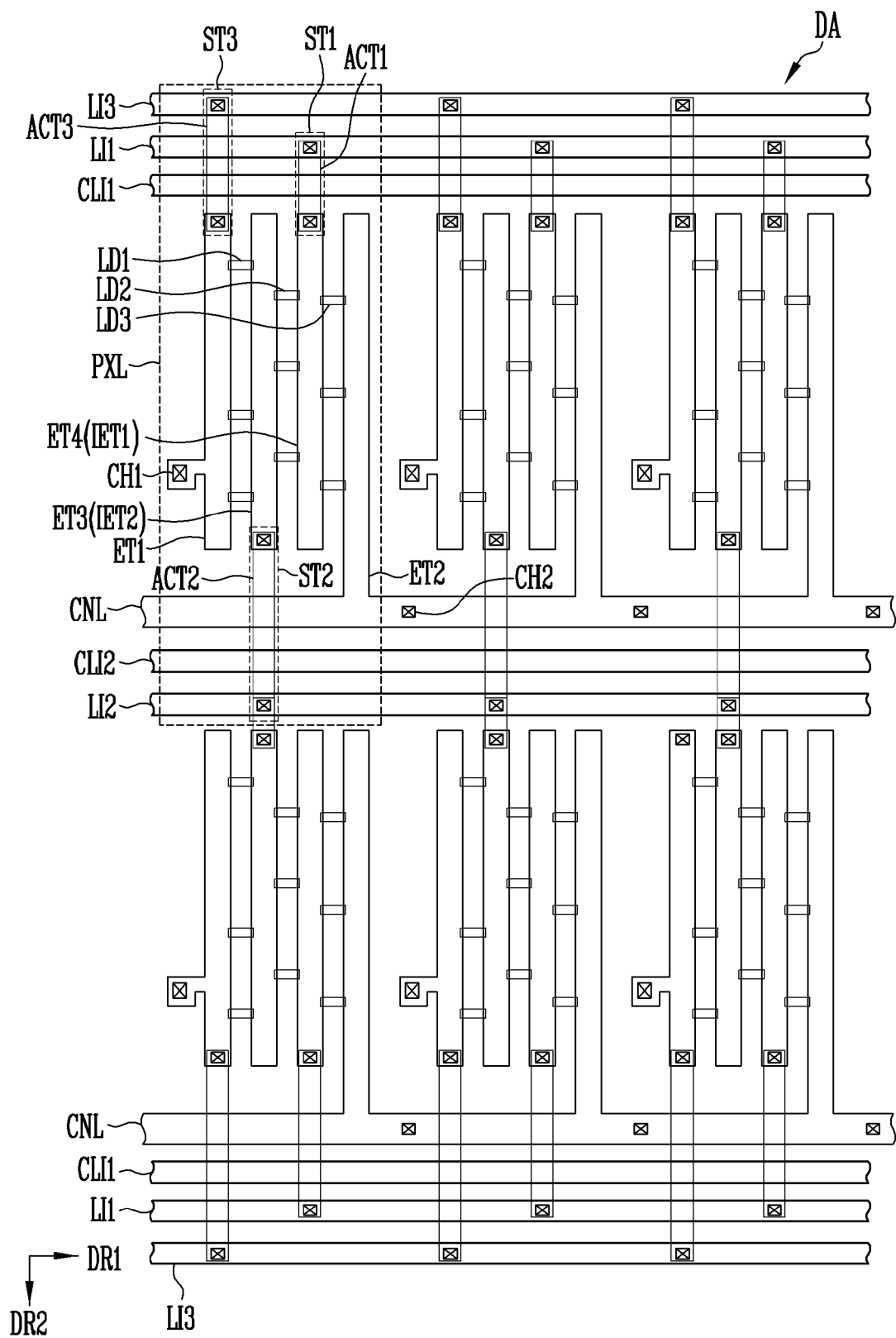

Referring to FIG. 17, alignment lines connected to the pixels PXL of at least one horizontal line may be divided and disposed on different sides of the pixels PXL of the horizontal line. For example, the first control line CLI1, the first line LI1, and the third line LI3 of an odd-number-th horizontal line may be disposed adjacent to first ends (for example, the upper ends) of the first to fourth electrodes ET1 to ET4. The second line LI2 may be disposed adjacent to second ends (for example, the lower ends) of the first to fourth electrodes ET1 to ET4. Furthermore, the second control line CLI2 may be disposed around the second line LI2. For example, the second control line CLI2, along with the second line LI2, may be disposed adjacent to the second ends (for example, the lower ends) of the first to fourth electrodes ET1 to ET4. The second active layer ACT2 of the second switching element ST2 may partially overlap the second control line CLI2 and be electrically connected between the third electrode ET3 and the second line LI2.

In an embodiment, the second control line CLI2 may be supplied with the same signal (for example, the same switch control signal SWS) as that of the first control line CLI1. For example, the second control lines CLI2 may be connected to the first control line CLI1 inside and/or outside of the display area DA. The second switching element ST2 may be turned on simultaneously with the first and third switching elements ST1 and ST3.

Furthermore, the pixels PXL disposed on one pair of successive horizontal lines may share at least one alignment line. For example, the pixels PXL disposed on a second horizontal line may share the second control line CLI2 and the second line LI2 with the pixels PXL disposed on a first horizontal line. The pixels PXL disposed on the second horizontal line may share the first control line CLI1, the first line LI1, and the third line LI3 with the pixels PXL disposed on a third horizontal line.

In accordance with the foregoing embodiment, the alignment lines may more efficiently disposed in the display area DA. Furthermore, a coupling effect which may occur between the alignment lines may be prevented or mitigated. For example, in case that it is assumed that at the alignment step alignment signals set as alternating current signals are respectively applied to the third and fourth electrodes ET3 and ET4 and alignment signals set to direct current signals are respectively applied to the first and second electrodes ET1 and ET2, a coupling effect which may occur between the alignment lines may be minimized if the first and second lines LI1 and LI2 for transmitting the respective alignment signals to the third and fourth electrodes ET3 and ET4 are divided and disposed on respective different sides of the pixels PXL. Hence, alignment signals may be reliably supplied to the respective electrodes ET, so that a high quality pixel PXL and the display device including the pixel PXL may be fabricated.

Figure 18:
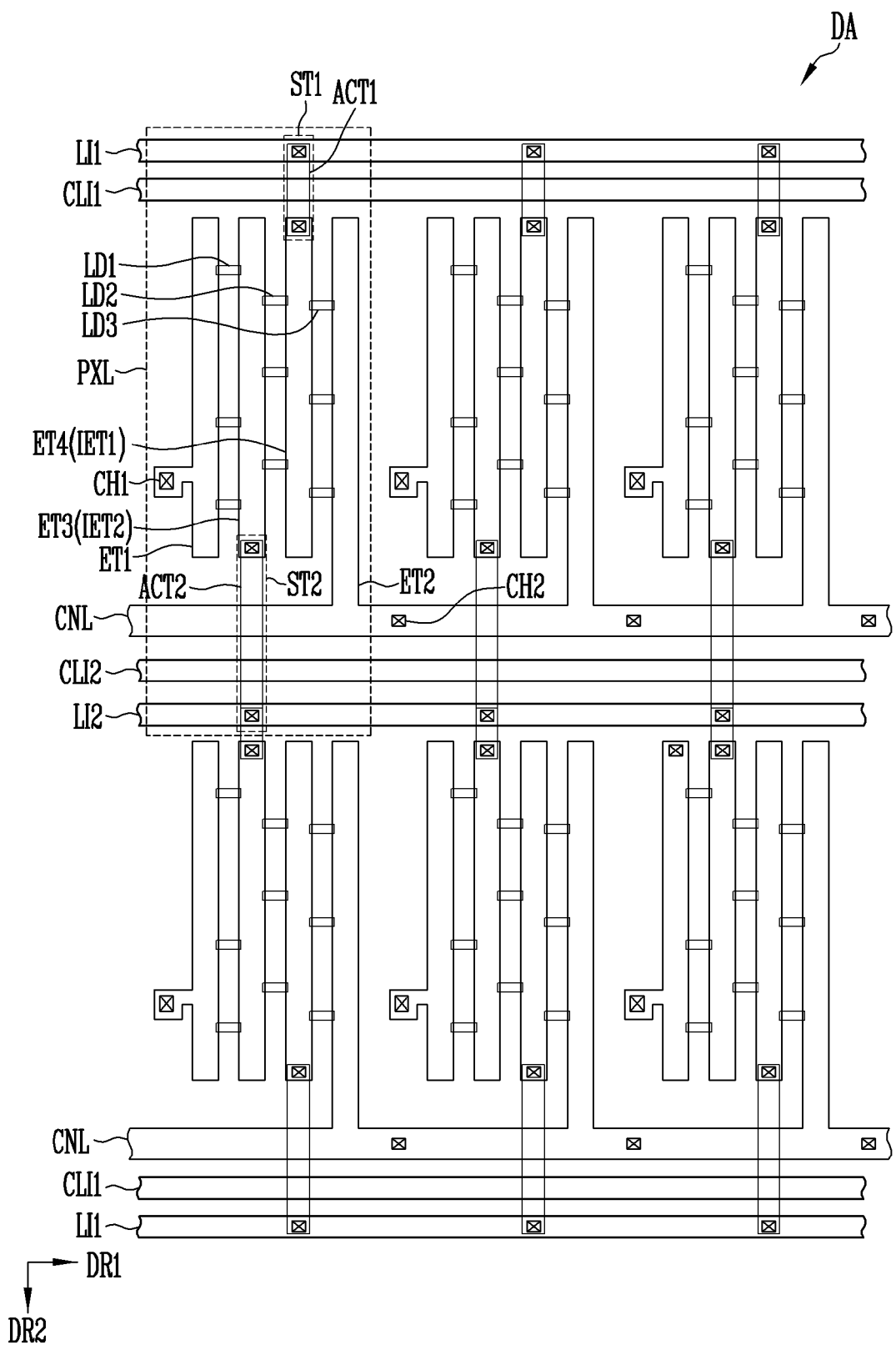

Referring to FIG. 18, at least two embodiments of the above-described embodiments may be combined to each other. For example, in a combination of the embodiment of FIG. 15 and the embodiment of FIG. 17, the third switching element ST3 and the third line LI3 connected thereto may be removed, and alignment lines connected to the pixels PXL of at least one horizontal line may be divided and disposed on different sides of the pixels PXL of the horizontal line. Each of the above-described various embodiments may be implemented alone, or combined with at least another embodiment to make various combinations of embodiments.

A method of fabricating a pixel PXL and a display device including the same in accordance with various embodiments will be schematically described. First, the circuit elements that form the pixel circuit PXC, the switching elements ST, the alignment lines (for example, the first control line CLI1 and the first to third lines LI1 to LI3), and/or the electrodes ET of the light source unit LSU are formed in each pixel area (or each pixel area and a peripheral area thereof). For example, after the circuit layer PCL is formed by forming the pixel circuit PXC, the switching elements ST, and various lines in each pixel area on the base layer BSL, the electrodes ET may be formed on the circuit layer PCL. In an embodiment, the alignment lines may be formed at the step of forming the circuit layer PCL and/or the step of forming the electrodes ET. In an embodiment, after the electrodes ET are formed, the first insulating layer INS1 may be formed on the electrodes ET.

Thereafter, light emitting elements LD are supplied to each emission area EMA in which the electrodes ET are formed. Thereafter, the switching elements ST are driven so that respective alignment signals are supplied to the electrodes ET. In an embodiment, each alignment signal may be continuously supplied for a time or more after the light emitting elements LD have been supplied. Hence, an electric field may be formed between the electrodes ET, so that the light emitting elements LD may be aligned between the electrodes ET. In an embodiment, after the light emitting elements LD are aligned, the insulating pattern INP may be formed on the light emitting elements LD.

Thereafter, the light emitting elements LD are electrically connected between the electrodes ET. For example, as the respective contact electrodes CE are formed on the electrodes ET and the first and second ends EP1 and EP2 of the light emitting elements LD, the light emitting elements LD may be electrically connected between the electrodes ET. In an embodiment, after the contact electrodes CE are formed, the second insulating layer INS2 and/or the overcoat layer OC may be formed on the overall surface of the display area DA.

In the pixel PXL, the display device including the pixel PXL, and the method of fabricating the display device in accordance with the above-mentioned various embodiments, the switching element ST may be disposed between at least one electrode ET disposed in the light source unit LSU of each pixel PXL and the alignment line corresponding thereto. As needed, the switching element ST is driven, so that the at least one electrode ET is connected to each alignment line. Hence, at the step of aligning the light emitting elements LD, a desired alignment signal may be reliably transmitted to the pixel PXL. In case that the display device is in actual use, the switching element ST may remain turned off so that the pixels PXL may be isolated from the respective alignment lines. In accordance with embodiments, an etching process (for example, a mask process) for separating the alignment lines may be omitted. Therefore, the process of fabricating the display device may be further simplified.

While the scope of the disclosure is described by detailed embodiments, it should be noted that the above-described embodiments are merely descriptive and should not be considered limiting. It should be understood by those skilled in the art that various changes, substitutions, and equivalents may be made herein without departing from the scope of the disclosure as defined by the claims.

The scope of the disclosure is not limited by detailed descriptions of the specification, and should be defined by the accompanying claims. Furthermore, all changes or modifications of the disclosure derived from the meanings and scope of the claims, and equivalents thereof should be construed as being included in the scope of the disclosure.

What is claimed is:

1. A display device comprising:
   a pixel disposed in a display area;
   a first line electrically connected to the pixel; and
   a first control line disposed around the first line,
   wherein the pixel comprises:
      a first electrode and a second electrode spaced apart from each other;
      at least one intermediate electrode including a first intermediate electrode disposed between the first electrode and the second electrode;
      light emitting elements electrically connected between a pair of adjacent electrodes, the light emitting elements including first light emitting elements electrically connected directly between the at least one intermediate electrode and the first electrode and second light emitting elements electrically connected directly between the at least one intermediate electrode and the second electrode; and
   a first switching element electrically connected between the first intermediate electrode and the first line, the first switching element being controlled by a signal applied to the first control line.

2. The display device according to claim 1, wherein the first switching element comprises a first active layer overlapping the first control line and electrically connected between the first intermediate electrode and the first line.

3. The display device according to claim 1, further comprising a second line spaced apart from the first line, wherein
   the at least one intermediate electrode includes a second intermediate electrode disposed between the first electrode and the first intermediate electrode, and
   the pixel comprises a second switching element electrically connected between the second intermediate electrode and the second line.

4. The display device according to claim 3, wherein
   the second line is disposed around the first control line, and
   the second switching element comprises a second active layer overlapping the first control line and electrically connected between the second intermediate electrode and the second line.

5. The display device according to claim 3, further comprising a second control line disposed around the second line,
   wherein the second switching element comprises a second active layer partially overlapping the second control line and electrically connected between the second intermediate electrode and the second line.

6. The display device according to claim 5, wherein
   the first line and the first control line are adjacent to first ends of the first electrode, the second electrode, and the at least one intermediate electrode, and
   the second line and the second control line are adjacent to second ends of the first electrode, the second electrode, and the at least one intermediate electrode.

7. The display device according to claim 3, further comprising a third line spaced apart from the first line and the second line,
   wherein the pixel comprises a third switching element electrically connected between the first electrode and the third line, the third switching element being turned on simultaneously with the first switching element.

8. The display device according to claim 1, further comprising a second line spaced apart from the first line,
wherein the pixel comprises a second switching element electrically connected between the first electrode and the second line.

9. The display device according to claim 1, wherein the pixel comprises a third switching element electrically connected between the first electrode and the second electrode, the third switching element being turned on simultaneously with the first switching element.

10. The display device according to claim 1, wherein the first electrode, the at least one intermediate electrode, and the second electrode are disposed successively in a first direction in an emission area of the pixel.

11. The display device according to claim 10, wherein
the first line and the first control line are adjacent to first ends of the first electrode, the at least one intermediate electrode, and the second electrode, and
the first line and the first control line each extend in the first direction and is commonly electrically connected to pixels in a horizontal line including the pixel.

12. The display device according to claim 1, wherein
the display area includes pixels each disposed in horizontal lines, and
a first instance of the first line and a first instance of the first control line that are electrically connected to pixels in any one horizontal line of the horizontal lines are disposed opposite to a second instance of the first line and a second instance of the first control line that are electrically connected to pixels in a subsequent horizontal line, with the pixels in the any one horizontal line of the horizontal lines and the pixels in the subsequent horizontal line of the horizontal lines interposed therebetween.

13. The display device according to claim 12, wherein first switching elements included in the pixels in the any one horizontal line of the horizontal lines and first switching elements included in the pixels in the subsequent horizontal line have symmetrical shapes.

14. The display device according to claim 12, wherein
first electrodes, second electrodes, and intermediate electrodes that are included in the pixels in the any one horizontal line of the horizontal lines, and
first electrodes, second electrodes, and intermediate electrodes that are included in the pixels of the subsequent horizontal line of the horizontal lines have symmetrical shapes.

15. The display device according to claim 1, wherein
the first electrode and the second electrode are electrically connected to a first power source and a second power source, respectively, and
the at least one intermediate electrode is electrically connected between the first electrode and the second electrode through the light emitting elements.

16. The display device according to claim 15, wherein
the pixel comprises a pixel circuit electrically connected between the first power source and the first electrode, and
the display area comprises:
a circuit layer including circuit elements of the pixel circuit; and
a display layer that overlaps the circuit layer, and in which the first electrode, the second electrode, the at least one intermediate electrode, and the light emitting elements are disposed.

17. The display device according to claim 16, wherein the circuit layer comprises at least one of a first power line electrically connected to the first power source, a second power line electrically connected to the second power source, an active layer of the first switching element, the first line, and the first control line.

18. The display device according to claim 16, wherein the display layer comprises at least one of the first line and the first control line.

19. The display device according to claim 1, wherein the pixel comprises at least one of:
bank patterns respectively disposed below the first electrode, the second electrode, and the at least one intermediate electrode; and
contact electrodes respectively disposed over the first electrode, the second electrode, and the at least one intermediate electrode.

20. A method of fabricating a display device comprising:
forming a switching element, an alignment line, and electrodes;
supplying light emitting elements to an emission area of a pixel among pixels;
aligning the light emitting elements between the electrodes by driving the switching element and supplying respective alignment signals to the electrodes; and
electrically connecting the light emitting elements between the electrodes.

21. The display device according to claim 1, wherein
each light-emitting has an elongated shape and includes a first semiconductor layer, a second semiconductor layer, and an active layer interposed between the first and second semiconductor layers, and
each light-emitting has an insulating film formed at the surface of the light emitting element to enclose an outer circumferential surface of at least the active layer.

* * * * *